US012660256B2

(12) United States Patent
Ishida

(10) Patent No.: US 12,660,256 B2
(45) Date of Patent: Jun. 16, 2026

(54) HIGH VOLTAGE FIELD EFFECT TRANSISTORS WITH SUPERJUNCTIONS AND METHOD OF MAKING THE SAME

(71) Applicant: SANDISK TECHNOLOGIES LLC, Addison, TX (US)

(72) Inventor: Masashi Ishida, Yokkaichi (JP)

(73) Assignee: Sandisk Technologies, Inc., Milpitas, CA (US)

( * ) Notice: Subject to any disclaimer, the term of this patent is extended or adjusted under 35 U.S.C. 154(b) by 380 days.

(21) Appl. No.: 18/356,851

(22) Filed: Jul. 21, 2023

(65) Prior Publication Data

US 2024/0250119 A1 Jul. 25, 2024

Related U.S. Application Data

(60) Provisional application No. 63/481,012, filed on Jan. 23, 2023.

(51) Int. Cl.
| | |
|---|---|
| *H10D 62/10* | (2025.01) |
| *H10D 30/01* | (2025.01) |
| *H10D 62/13* | (2025.01) |

(52) U.S. Cl.
CPC ....... *H10D 62/111* (2025.01); *H10D 30/0221* (2025.01); *H10D 30/0285* (2025.01);
(Continued)

(58) Field of Classification Search
CPC ............. H10D 62/111; H10D 30/0221; H10D 30/0285; H10D 62/104; H10D 62/153;
(Continued)

(56) References Cited

U.S. PATENT DOCUMENTS

| | | | |
|---|---|---|---|
| 5,786,620 A | * | 7/1998 | Richards, Jr. ..... H01L 21/26586 |
| | | | 257/E21.345 |
| 9,859,422 B2 | | 1/2018 | Nishikawa et al. |

(Continued)

OTHER PUBLICATIONS

Strollo, A.G.M. et al., "Optimal on-Resistance Versus Breakdown Voltage Tradeoff in Superjunction Power Devices: A Novel Analytical Model", *IEEE Trans. Electron Devices*, vol. 48, No. 9, pp. 2161-2166, Sep. 2001.

(Continued)

*Primary Examiner* — Shahed Ahmed
(74) *Attorney, Agent, or Firm* — THE MARBURY LAW GROUP PLLC

(57) ABSTRACT

A field effect transistor includes a semiconductor channel having a doping of a first conductivity type, a gate structure overlying the semiconductor channel, a source region and a drain region, a source-side extension region including a source-side-extension plate portion and source-side-extension rail portions that overlie the source-side-extension plate portion, source-side counter-doped rails having a doping of the first conductivity type, a drain-side extension region including a drain-side-extension plate portion and drain-side-extension rail portions that overlie the drain-side-extension plate portion, and drain-side counter-doped rails interlaced with the drain-side-extension rail portions. A first superjunction structure is provided between the source-side counter-doped rails and the source-side extension region. A second superjunction structure is provided between the drain-side counter-doped rails and the drain-side extension region.

14 Claims, 53 Drawing Sheets

(52) U.S. Cl.
CPC ......... *H10D 62/104* (2025.01); *H10D 62/153* (2025.01); *H10D 62/154* (2025.01); *H10D 62/157* (2025.01); *H10D 62/158* (2025.01)

(58) Field of Classification Search
CPC .. H10D 62/154; H10D 62/051; H10D 62/393; H10D 62/149–161; H10D 84/013–0133; H10D 30/601–608; H10D 30/6715–6721
See application file for complete search history.

(56) References Cited

U.S. PATENT DOCUMENTS

| | | | |
|---|---|---|---|
| 10,115,735 B2 | 10/2018 | Amano et al. | |
| 10,224,407 B2 | 3/2019 | Chowdhury et al. | |
| 10,256,099 B1 | 4/2019 | Akaiwa et al. | |
| 10,355,017 B1 | 7/2019 | Nakatsuji et al. | |
| 10,355,100 B1 | 7/2019 | Ueda et al. | |
| 10,910,020 B1 | 2/2021 | Kodate et al. | |
| 11,004,974 B1 | 5/2021 | Takimoto | |
| 11,296,113 B2 | 4/2022 | Kim et al. | |
| 11,309,402 B2 | 4/2022 | Amano et al. | |
| 11,450,768 B2 | 9/2022 | Togo | |
| 11,508,749 B2 | 11/2022 | Takimoto et al. | |
| 11,569,215 B2 | 1/2023 | Kim et al. | |
| 11,575,015 B2 | 2/2023 | Togo et al. | |
| 11,626,496 B2 | 4/2023 | Akaiwa et al. | |
| 2009/0261426 A1* | 10/2009 | Feilchenfeld | H10D 30/603 |
| | | | 257/E29.268 |
| 2016/0211365 A1 | 7/2016 | Shea et al. | |
| 2016/0351709 A1 | 12/2016 | Nishikawa et al. | |
| 2017/0213894 A1 | 7/2017 | Mallikarjunaswamy | |
| 2018/0190816 A1* | 7/2018 | Siddiqui | H10D 30/603 |
| 2018/0247954 A1 | 8/2018 | Amano et al. | |
| 2018/0248013 A1 | 8/2018 | Chowdhury et al. | |
| 2018/0331118 A1 | 11/2018 | Amano | |
| 2019/0296012 A1 | 9/2019 | Iwata et al. | |
| 2020/0287040 A1* | 9/2020 | Chow | H10D 62/151 |
| 2021/0280686 A1 | 9/2021 | Amano et al. | |
| 2021/0391351 A1 | 12/2021 | Takimoto et al. | |
| 2022/0068903 A1 | 3/2022 | Kim et al. | |
| 2022/0109054 A1 | 4/2022 | Togo | |
| 2022/0109070 A1 | 4/2022 | Ono et al. | |
| 2022/0109071 A1 | 4/2022 | Togo | |
| 2022/0310917 A1 | 9/2022 | Lee et al. | |

OTHER PUBLICATIONS

Udrea, F. et al., "Superjunction Power Devices, History, Development, and Future Prospects", *IEEE Trans. Electron Devices*, vol. 64, No. 3, pp. 713-727, Mar. 2017.

U.S. Appl. No. 17/188,271, filed Mar. 1, 2021, SanDisk Technologies LLC.

U.S. Appl. No. 17/316,015, filed May 10, 2021, SanDisk Technologies LLC.

U.S. Appl. No. 17/316,079, filed May 10, 2021, SanDisk Technologies LLC.

U.S. Appl. No. 17/362,121, filed Jun. 29, 2021, SanDisk Technologies LLC.

U.S. Appl. No. 17/474,699, filed Sep. 14, 2021, SanDisk Technologies LLC.

U.S. Appl. No. 17/474,760, filed Sep. 14, 2021, SanDisk Technologies LLC.

U.S. Appl. No. 17/496,099, filed Oct. 7, 2021, SanDisk Technologies LLC.

U.S. Appl. No. 17/496,122, filed Oct. 7, 2021, SanDisk Technologies LLC.

U.S. Appl. No. 17/501,163, filed Oct. 14, 2021, SanDisk Technologies LLC.

U.S. Appl. No. 17/529,802, filed Nov. 18, 2021, SanDisk Technologies LLC.

U.S. Appl. No. 17/562,635, filed Dec. 27, 2021, SanDisk Technologies LLC.

U.S. Appl. No. 17/562,888, filed Dec. 27, 2021, SanDisk Technologies LLC.

U.S. Appl. No. 17/821,273, filed Aug. 22, 2022, SanDisk Technologies LLC.

* cited by examiner

HIGH VOLTAGE FIELD EFFECT TRANSISTORS WITH SUPERJUNCTIONS AND METHOD OF MAKING THE SAME

FIELD

The present disclosure relates generally to the field of semiconductor devices and specifically to high voltage field effect transistors including superjunctions and methods of making the same.

BACKGROUND

Prior art high voltage field effect transistors often suffer from surface breakdown voltage. Such transistors often have a complex extended low doped drain (LDD) structure to improve surface breakdown characteristics at the expense of process complexity and increased cost.

SUMMARY

According to an aspect of the present disclosure, a field effect transistor is provided, which comprises: a semiconductor channel having a doping of a first conductivity type; a gate structure overlying the semiconductor channel and comprising a stack of a gate dielectric and a gate electrode; a source region and a drain region having a doping of a second conductivity type and laterally spaced from the gate structure and from each other along a first horizontal direction, the second conductivity type being an opposite of the first conductivity type; a source-side extension region laterally extending between the source region and a first bottom surface segment of the gate dielectric, having a doping of the second conductivity type, and including a source-side-extension plate portion and source-side-extension rail portions that overlie the source-side-extension plate portion; source-side counter-doped rails having a doping of the first conductivity type, embedded in the source-side extension region, and interlaced with the source-side-extension rail portions along a second horizontal direction to provide a first superjunction structure; a drain-side extension region laterally extending between the drain region and a second bottom surface segment of the gate dielectric, having a doping of the second conductivity type, and including a drain-side-extension plate portion and drain-side-extension rail portions that overlie the drain-side-extension plate portion; and drain-side counter-doped rails having a doping of the first conductivity type, embedded in the drain-side extension region, and interlaced with the drain-side-extension rail portions along the second horizontal direction to provide a second superjunction structure.

According to another aspect of the present disclosure, a method of forming a field effect transistor comprises: forming a gate electrode over a semiconductor material layer having a doping of a first conductivity type; forming a source-side extension region and a drain-side extension region by implanting dopants of a second conductivity type into an upper portion of the semiconductor material layer employing at least the gate electrode as a first ion implantation mask; forming source-side counter-doped rails and drain-side counter-doped rails within upper portions of the source-side extension region and the drain-side extension region, respectively by implanting dopants of the first conductivity type, wherein the source-side extension region comprises a source-side-extension plate portion and source-side-extension rail portions that overlie the source-side-extension plate portion after formation of the source-side counter-doped rails, remaining portions of the drain-side extension region comprises a drain-side-extension plate portion and drain-side-extension rail portions that overlie the drain-side-extension plate portion after formation of the drain-side counter-doped rails, the source-side counter-doped rails are interlaced with the source-side-extension rail portions along a second horizontal direction to provide a first superjunction structure, and the drain-side counter-doped rails are interlaced with the drain-side-extension rail portions along the second horizontal direction to provide a second superjunction structure; and forming a source region and a drain region having a doping of the second conductivity type, wherein the source region contacts the first superjunction structure and the drain region contacts the second superjunction structure.

BRIEF DESCRIPTION OF THE DRAWINGS

In the various drawings of the present disclosure, figures are labeled with a combination of a numerical figure index and an alphabetical figure suffix, such as FIG. "1A." Figures with the same numerical figure index correspond to views of an exemplary structure at a same processing step. Figures with the alphabetical figure suffix of "A" are top-down views. Figures with the alphabetical figure suffix of "B" are vertical cross-sectional view of an exemplary structure along the vertical plane B-B' of the exemplary structure in a figure with the same numerical figure index and the alphabetical figure suffix of "A." Figures with the alphabetical figure suffix of "C" are vertical cross-sectional view of an exemplary structure along the vertical plane C-C' of the exemplary structure in a figure with the same numerical figure index and the alphabetical figure suffix of "A." Figures with the alphabetical figure suffix of "D" are vertical cross-sectional view of an exemplary structure along the vertical plane D-D' of the exemplary structure in a figure with the same numerical figure index and the alphabetical figure suffix of "D."

DETAILED DESCRIPTION

Figure 1A:
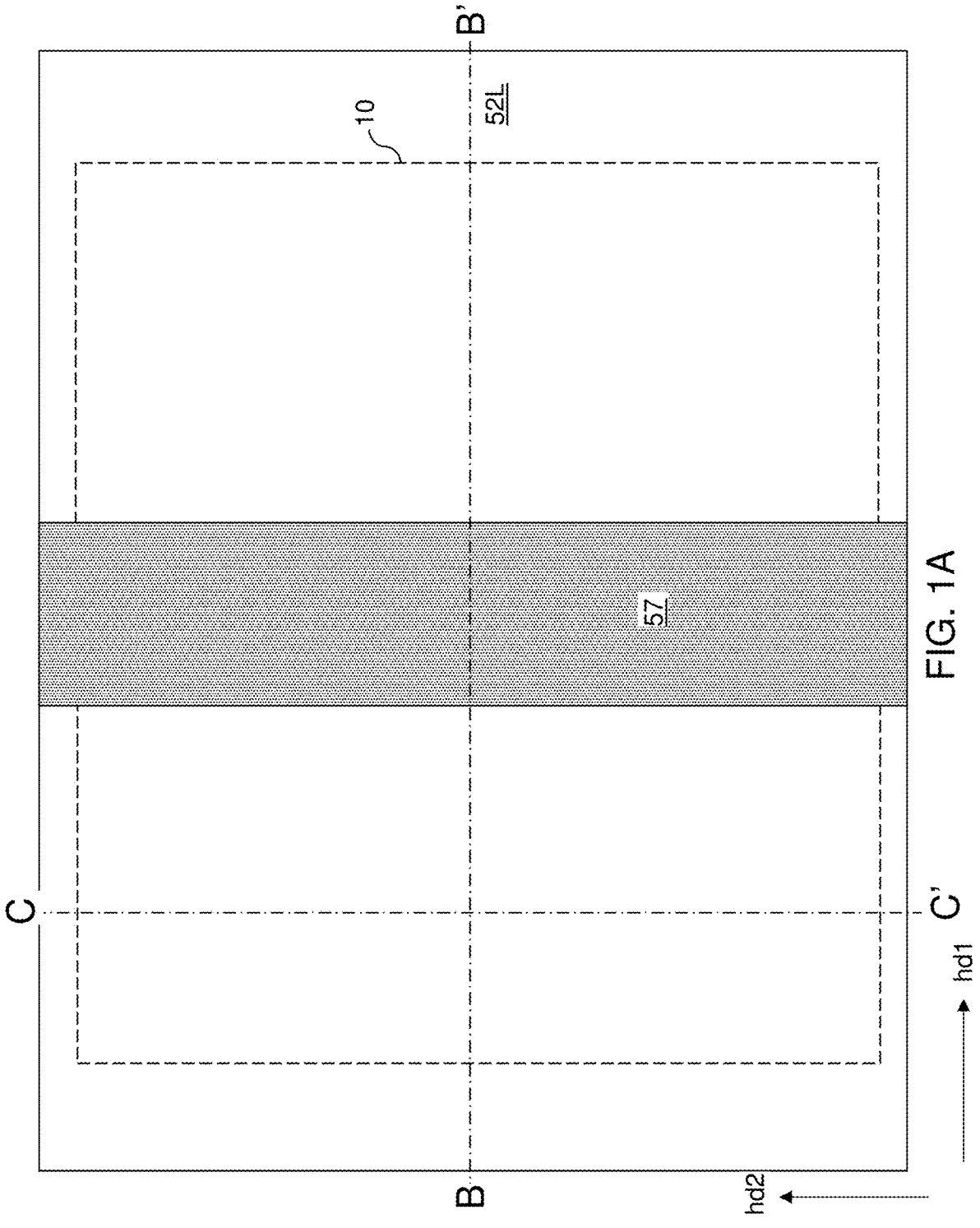
FIGS. 1A-1C are various views of a first exemplary structure after formation of a gate dielectric layer, a gate electrode, and a gate cap dielectric according to the first embodiment of the present disclosure.

Embodiments of the present disclosure are directed to high voltage field effect transistors including superjunctions and methods of making the same, the various aspects of which are now described in detail.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or among one another, the two elements are "disjoined from" each other or "disjoined among" one another. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

As used herein, a "layer stack" refers to a stack of layers. As used herein, a "line" or a "line structure" refers to a layer that has a predominant direction of extension, i.e., having a direction along which the layer extends the most.

As used herein, a "semiconducting material" refers to a material having electrical conductivity in the range from $1.0 \times 10^{-6}$ S/cm to $1.0 \times 10^{5}$ S/cm. As used herein, a "semiconductor material" refers to a material having electrical conductivity in the range from $1.0 \times 10^{-6}$ S/cm to $1.0 \times 10^{5}$ S/cm in the absence of electrical dopants therein, and is capable of producing a doped material having electrical conductivity in a range from 1.0 S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulator material", "insulating material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high average atomic concentration to become a conductive material, i.e., to have electrical conductivity greater than $1.0 \times 10^{5}$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^{5}$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the average atomic concentration of electrical dopants therein. As used herein, a "metallic material" refers to a conductive material including at least one metallic element therein. All measurements for electrical conductivities are made at the standard condition.

As used herein, a "field effect transistor" refers to any semiconductor device having a semiconductor channel through which electrical current flows with a current density modulated by an external electrical field. As used herein, a "channel region" refers to a semiconductor region in which mobility of charge carriers is affected by an applied electrical field. A "gate electrode" refers to a conductive material portion that controls electron mobility in the channel region by application of an electrical field. A "source region" refers to a doped semiconductor region that supplies charge carriers that flow through the channel region. A "drain region" refers to a doped semiconductor region that receives charge carriers supplied by the source region and passes through the channel region. An "active region" refers to a source region of a field effect transistor or a drain region of a field effect transistor. A "source extension region" refers to a doped semiconductor region having a lesser dopant concentration than, and having a same type of doping as, a source region and including a portion disposed between the source region and the channel region. A "drain extension region" refers to a doped semiconductor region having a lesser dopant concentration than, and having a same type of doping as, a drain region and including a portion disposed between the drain region and the channel region. An "active region extension" refers to a source extension region or a drain extension region.

Hot carrier injection in a high voltage transistor induces formation of trapped charges in a corner region of a gate dielectric, and causes shift in the threshold voltage and/or dielectric breakdown. While increasing the level of doping in a lightly-doped drain (LDD) region can reduce hot carrier injection, such an increase in the level of doping reduces the resistance of the LDD region, and therefore reduces the breakdown voltage of the high voltage transistor. Thus, simply increasing the doping concentration of an LDD region to reduce hot carrier injection, negatively affects the breakdown voltage of a transistor.

According to an aspect of the present disclosure, a field effect transistor with superjunctions is provided. The superjunctions reduce the hot carrier injection while still providing a high breakdown voltage without significantly increasing the doping concentration in source/drain extension regions. Specifically, superjunction structures including multiple strips of p-n junctions spaced along the gate length direction provide a field effect transistor with a reduced hot carrier injection and high breakdown voltage. Such a transistor may be advantageously used for a high voltage operation, such as operation at above 20V, for example operation at 50V to 150V. However, in other embodiments, the transistor may also be used for low voltage operation.

The superjunctions include lateral p-n junction structures employing laterally-extending (i.e., in the source to drain direction) doped pillars, which are also referred to rails or strips. The p-type and n-type pillars alternated in a gate length direction perpendicular to the source to drain direction. The pitch of the p-n junctions structures may be less than 400 nm, and may be employed for small high voltage transistors. The superjunction structure reduces the gate edge electrical field and hot carrier injection both on the source side and on the drain side while maintaining a high breakdown voltage.

Figure 1B:
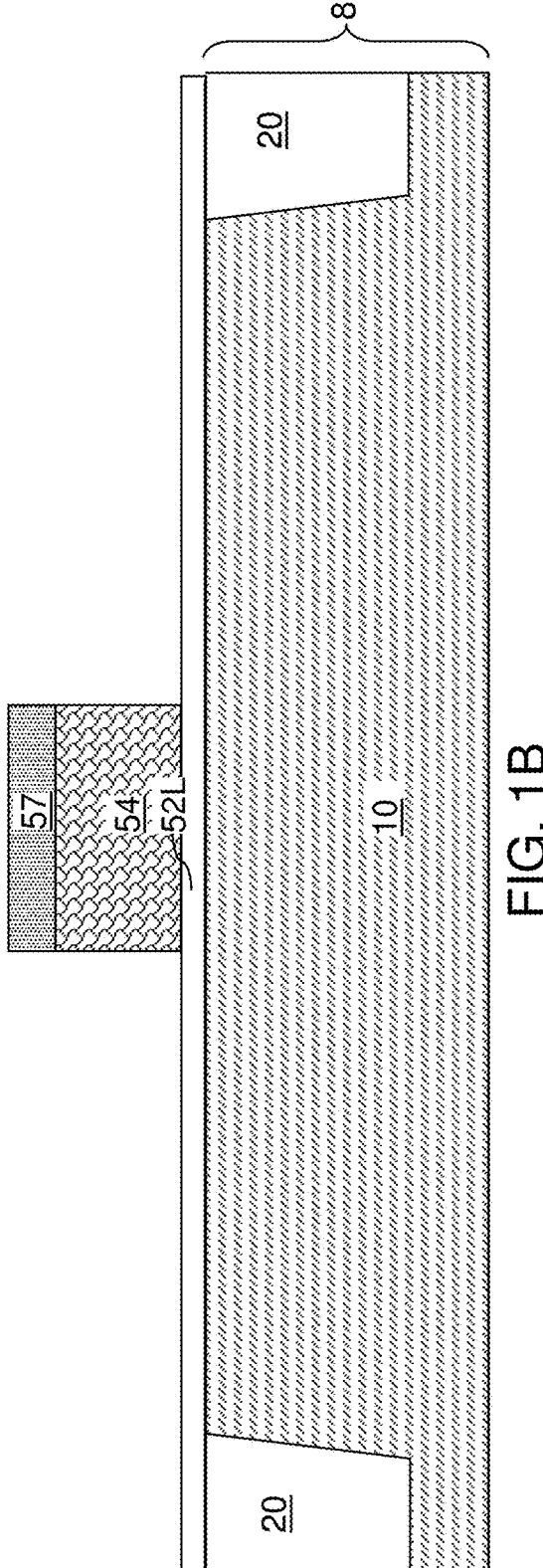
Figure 1C:
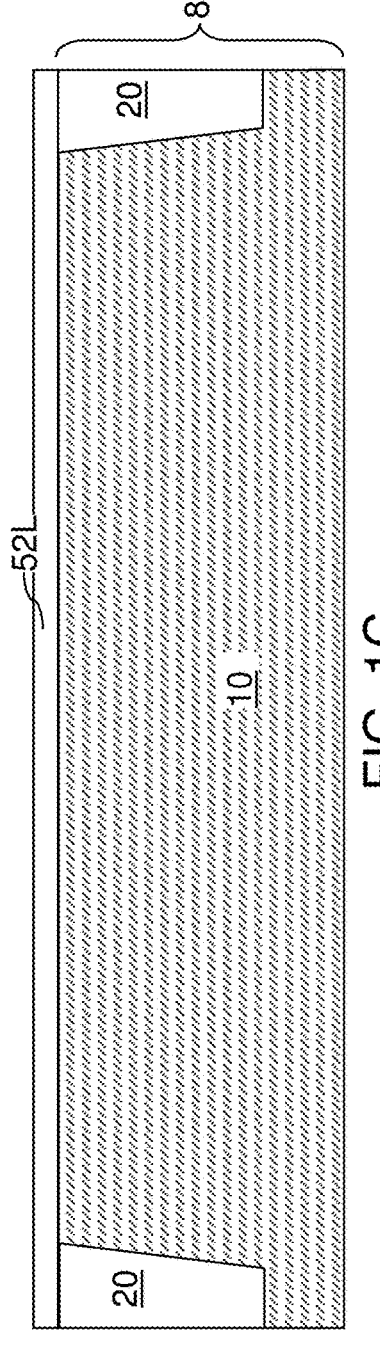

Referring to FIGS. 1A-1C, a first exemplary structure according to the first embodiment of the present disclosure is illustrated. The first exemplary structure comprises a substrate 8, which is a semiconductor substrate. As used herein, a "semiconductor substrate" refers to a substrate that includes at least one semiconductor material portion, i.e., at least one portion of a semiconductor material.

The semiconductor substrate 8 includes a semiconductor material layer 10. The semiconductor substrate 8 may optionally include at least one additional material layer at a bottom portion thereof. In one embodiment, the semiconductor substrate 8 can be a bulk semiconductor substrate consisting of the semiconductor material layer 10 (e.g., a single crystalline silicon wafer), or can be a semiconductor-on-insulator (SOI) substrate including a buried insulator layer (such as a silicon oxide layer) underlying the semiconductor material layer 10, and a handle substrate underlying the buried insulator layer. Alternatively, the semiconductor material layer 10 may comprise an epitaxial semiconductor layer (i.e., a single crystalline semiconductor layer) deposited on a semiconductor substrate (e.g., silicon wafer), or may comprise a doped well embedded in an upper portions of the semiconductor substrate.

The semiconductor material layer 10 can include a lightly doped semiconductor material portion (e.g., silicon portion) on which at least one field effect transistor can be formed. In one embodiment, the entirety of the semiconductor material in the semiconductor material layer 10 may include the lightly doped semiconductor material. In another embodiment, the lightly doped semiconductor material can be a semiconductor well embedded within another semiconductor material having a different dopant concentration and optionally, a doping of the opposite conductivity type. The dopant concentration of the lightly doped semiconductor material portion may be optimized for a channel region of the at least one field effect transistor to be subsequently formed. For example, the lightly doped semiconductor material portion may include electrical dopants at an atomic concentration in a range from $1.0 \times 10^{12}/\text{cm}^3$ to $1.0 \times 10^{16}/\text{cm}^3$, such as from $1.0 \times 10^{13}/\text{cm}^3$ to $1.0 \times 10^{15}/\text{cm}^3$, although lesser and greater atomic concentrations can also be employed. The conductivity type of the portion of the semiconductor material layer 10 to be subsequently employed as a channel of a field effect transistor is herein referred to as a first conductivity type, which may be p-type for an n-type field effect transistor or n-type for a p-type field effect transistor.

The semiconductor material of the semiconductor material layer 10 can be an elemental semiconductor material (such as silicon) or an alloy of at least two elemental semiconductor materials (such as a silicon-germanium alloy), or can be a compound semiconductor material (such as a III-V compound semiconductor material or a II-VI compound semiconductor material), or can be an organic semiconductor material. The thickness of the semiconductor material layer 10 can be in a range from 0.5 mm to 2 mm in case the semiconductor material layer 10 is a bulk semiconductor substrate. In case the semiconductor material layer 10 is a semiconductor-on-insulator substrate, the thickness of the top semiconductor material layer within the semiconductor material layer 10 may be in a range from 100 nm to 1,000 nm, although lesser and greater thicknesses can also be employed.

Pad layers (not shown) such as a stack of a silicon oxide layer and a silicon nitride layer can be deposited over the top surface of the semiconductor material layer 10, and can be lithographically patterned to cover each device region, i.e., each region in which semiconductor devices are to be subsequently formed. The illustrated portion of the first exemplary structure includes one of such device regions in which a field effect transistor employing features of embodiments of the present disclosure is to be subsequently formed. An anisotropic etch process can be performed to etch shallow trenches that vertically extend through the pad layers and into an upper portion of the semiconductor material layer 10. The photoresist layer can be employed as an etch mask layer during the anisotropic etch process. The depth of the shallow trenches, as measured from the horizontal plane including the top surface of the semiconductor material layer 10, can be in a range from 300 nm to 3 microns, although lesser and greater depths may also be employed. The shallow trenches can be interconnected among one another to provide multiple device regions that correspond to a respective unetched portion of the semiconductor material layer 10.

While a single field effect transistor is illustrated, it is understood that multiple instances of a field effect transistor can be formed on the substrate 8. Further, it is understood that additional field effect transistors and/or semiconductor devices of different types (such as diodes, resistors, inductors, and/or capacitors) can be formed on, over or in the substrate 8. The photoresist layer can be subsequently removed, for example, by ashing.

At least one dielectric material such as undoped silicate glass can be deposited in the shallow trenches by a conformal deposition process such as a chemical vapor deposition process. A chemical mechanical planarization process can be performed to remove portions of the at least one dielectric material from above the pad layers. The remaining portions of the at least one dielectric material constitute shallow trench isolation structures 20. The pad layers can be subsequently removed, for example, by wet etch processes. For example, a wet etch employing hot phosphoric acid can be performed to remove the silicon nitride layer, and a wet etch process employing dilute hydrofluoric acid can be performed to remove the silicon oxide layer. Physically exposed surfaces of the shallow trench isolation structures 20 may be collaterally recessed during removal of the silicon oxide layer. Generally, a shallow trench isolation structure 20 comprising a dielectric material can be formed in an upper region of the semiconductor material layer 10.

A gate dielectric layer 52L having a thickness suitable for operation of a high voltage field effect transistor can be formed on physically exposed surfaces of the semiconductor material layer 10, for example, by thermal oxidation of the physically exposed surface portions of the semiconductor material layer 10. If the semiconductor material layer 10 includes single crystalline silicon, the gate dielectric layer 52L can consist essentially of thermal silicon oxide. The thickness of the gate dielectric layer 52L can be in a range from 10 nm to 300 nm, such as 30 nm to 150 nm, although lesser and greater thicknesses can also be employed.

At least one gate electrode material layer and a gate cap dielectric layer can be deposited over the gate dielectric layer 52L. The at least one gate electrode material layer includes one or more layers of an electrically conductive material that can be employed as a gate electrode material. In an illustrative embodiment, the at least one gate electrode material layer can include a semiconductor gate electrode layer including a doped semiconductor material and a metallic gate electrode layer including a metallic gate electrode material. For example, the semiconductor gate electrode layer can include a doped polysilicon layer having a thickness in a range from 30 nm to 150 nm, and the metallic gate electrode layer can include a metallic material such as a transition metal or metal silicide and can have a thickness in a range from 50 nm to 150 nm, although lesser and greater thicknesses may also be employed. The gate cap dielectric layer includes a gate cap dielectric material such as silicon nitride, and can have a thickness in a range from 30 nm to 200 nm, although lesser and greater thicknesses may also be employed.

A photoresist layer (not shown) can be applied over the gate cap dielectric layer, and can be lithographically patterned to form gate patterns, i.e., patterns of gate electrodes to be subsequently formed. An anisotropic etch process can be performed to transfer the gate patterns through the gate cap dielectric layer and the at least one gate electrode layer. In one embodiment, a terminal step of the anisotropic etch process can be selective to the material of the gate dielectric layer 52L so that overetch into the gate dielectric layer 52L is minimized. The photoresist layer can be removed, for example, by ashing.

A patterned portion of the gate cap dielectric layer comprises a gate cap dielectric 57. A patterned portion of the at least one gate electrode layer comprises a gate electrode 54. In case the at least one gate electrode layer includes a semiconductor gate electrode layer and a metallic gate electrode layer, the gate electrode 54 can include a stack of a semiconductor gate electrode and a metallic gate electrode.

The gate electrode 54 may comprise a parallel pair of lengthwise sidewalls that are laterally spaced apart along a first horizontal direction (i.e., the gate width direction parallel to the source to drain direction) hd1. The lateral dimension between the parallel pair of lengthwise sidewalls of the gate electrode 54 is herein referred to as a gate length of a field effect transistor. The gate length may be in a range from 200 nm to 3,000 nm, although lesser and greater dimensions may also be employed. The parallel pair of lengthwise sidewalls of the gate electrode 54 laterally extend along a second horizontal direction (i.e., the gate length direction perpendicular to the source to drain direction) hd2, which is perpendicular to the first horizontal direction hd1.

Generally, a gate structure (52, 54) comprising a stack of a gate dielectric 52 and a gate electrode 54 can be formed over a semiconductor material layer 10 having a doping of a first conductivity type in a substrate 8. The portion of the semiconductor material layer 10 that is laterally surrounded by the shallow trench isolation structure 20 is employed as a semiconductor channel including dopants of the first conductivity type at a first average atomic concentration. In one embodiment, the atomic concentration of the dopants of the first conductivity type in the semiconductor channel may be uniform throughout, and may be in a range from $1.0 \times 10^{12}/cm^3$ to $1.0 \times 10^{16}/cm^3$, such as from $1.0 \times 10^{13}/cm^3$ to $1.0 \times 10^{15}/cm^3$, although lesser and greater atomic concentrations can also be employed.

Figure 2A:
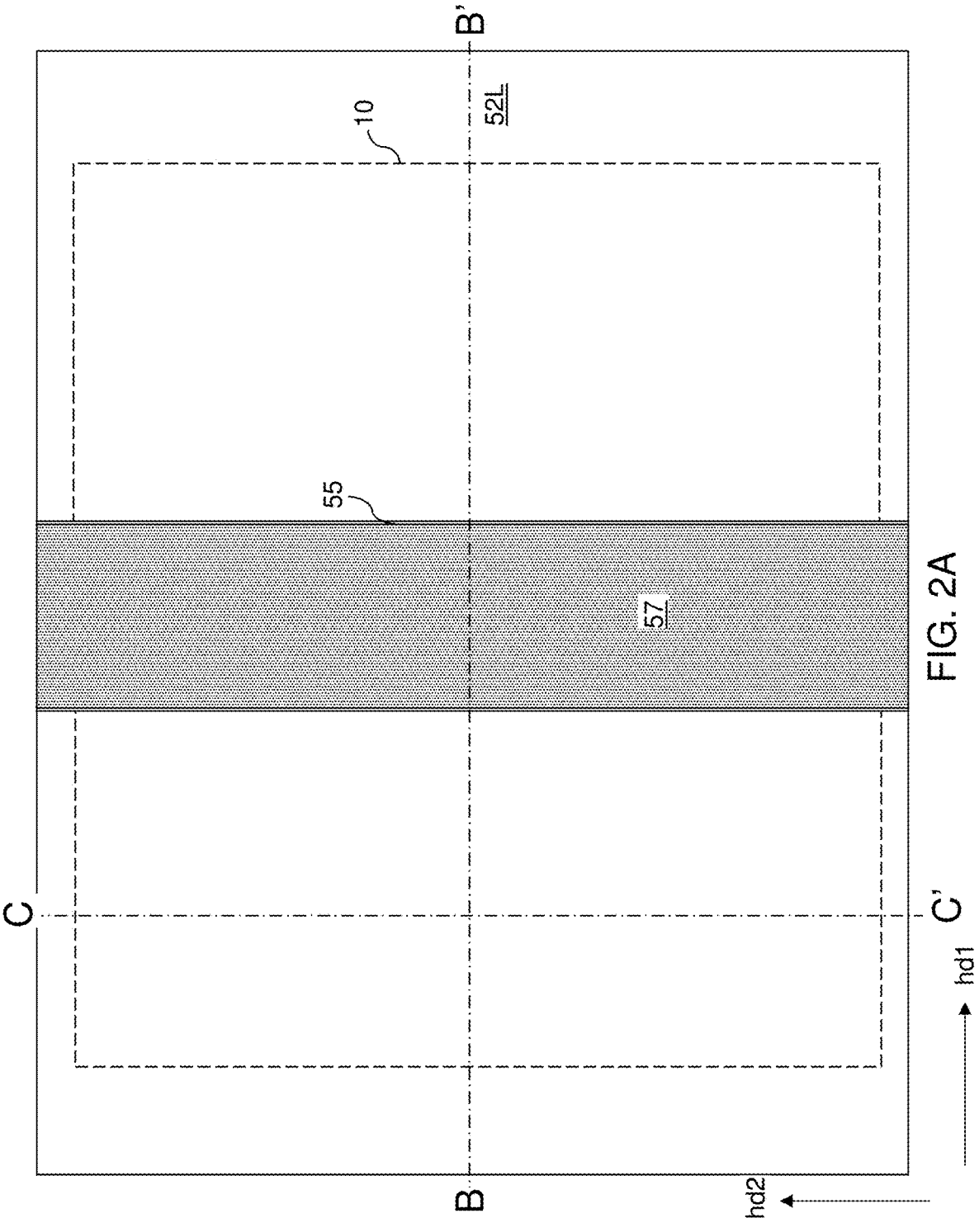
FIGS. 2A-2C are various views of the first exemplary structure after formation of a dielectric sidewall liner according to the first embodiment of the present disclosure.
Figure 2B:
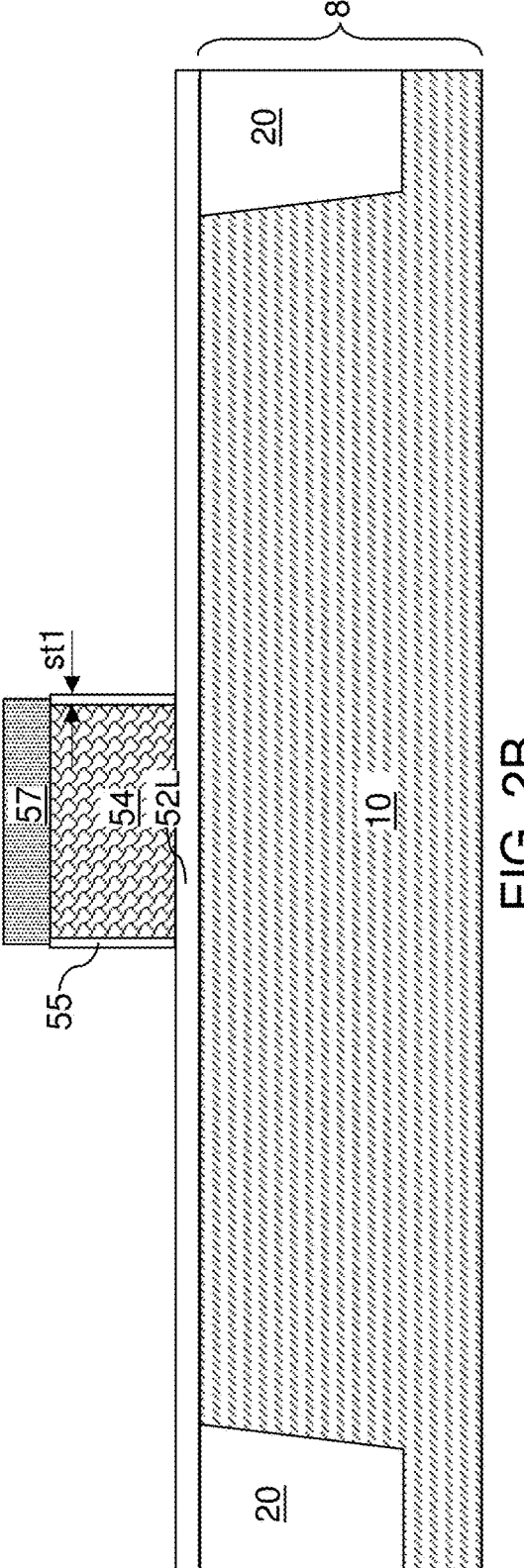
Figure 2C:
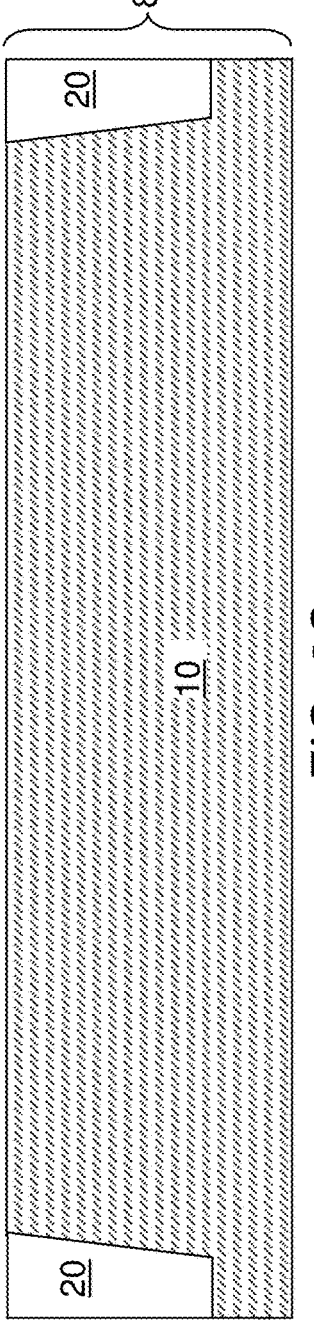

Referring to FIGS. 2A-2C, in case the gate electrode 54 comprises a semiconductor material, such as polysilicon, then an optional oxidation process (such as a thermal oxidation process) can be performed to convert physically exposed surface portions of the gate electrode 54 to form an optional dielectric sidewall liner 55. In one embodiment, the dielectric sidewall liner 55 may consist essentially of silicon oxide. Alternatively, a thin silicon oxide layer may be conformally deposited and anisotropically etched to form the optional dielectric sidewall liner 55. The thickness of the dielectric sidewall liner 55 is herein referred to as a first spacer thickness st1, and may be in a range from 1 nm to 30 nm, such as from 3 nm to 10 nm, although lesser and greater thicknesses may also be employed.

Figure 3A:
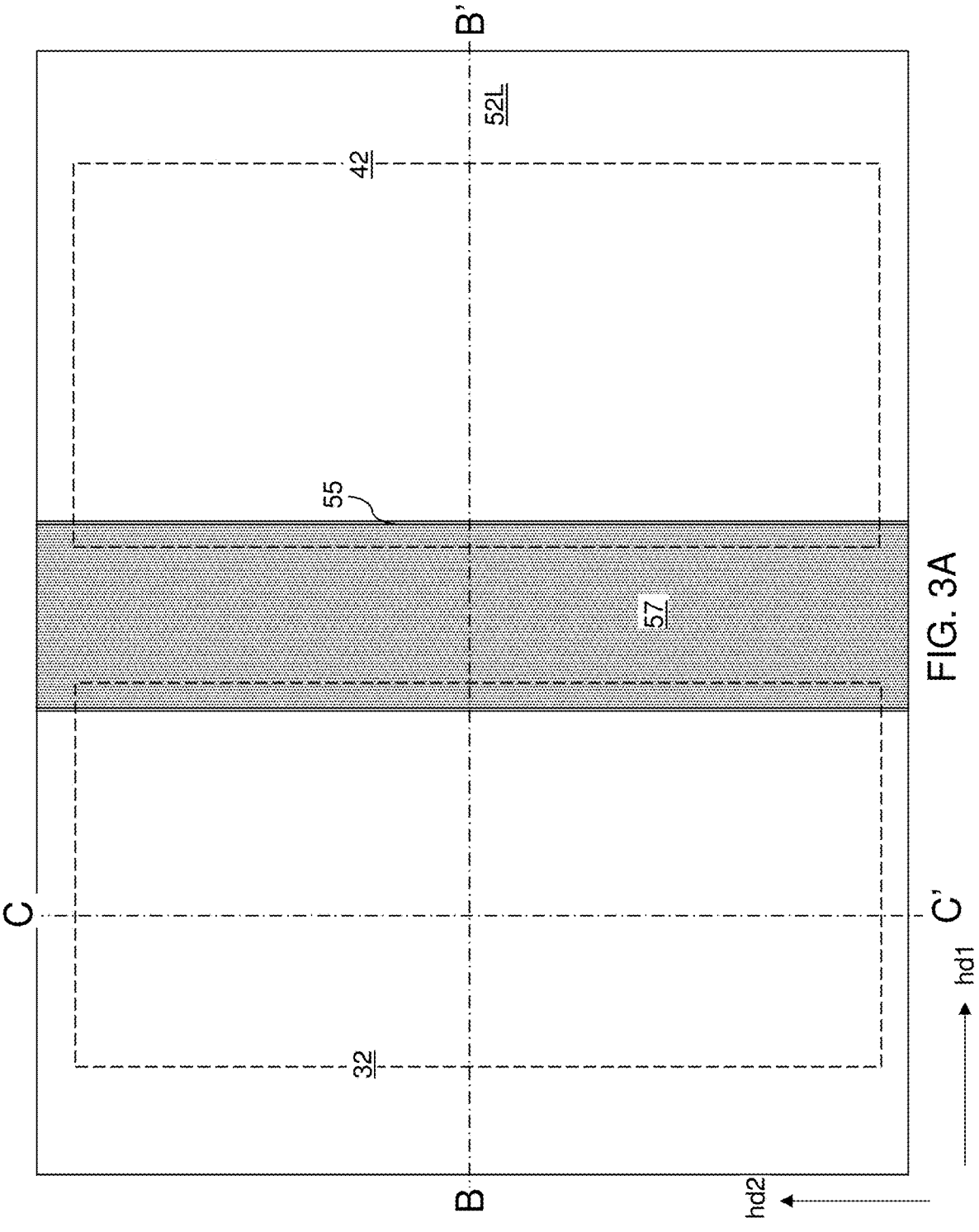
FIGS. 3A-3C are various views of the first exemplary structure after formation of a source-side extension region and a drain-side extension region according to the first embodiment of the present disclosure.
Figure 3B:
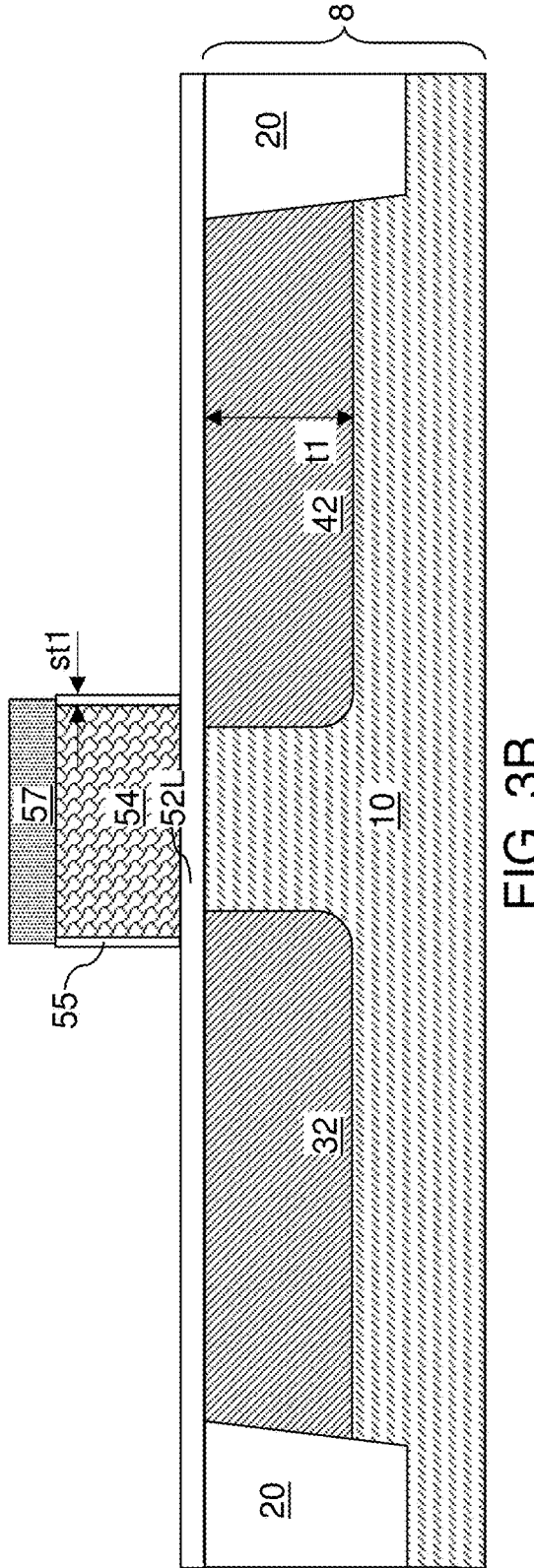
Figure 3C:
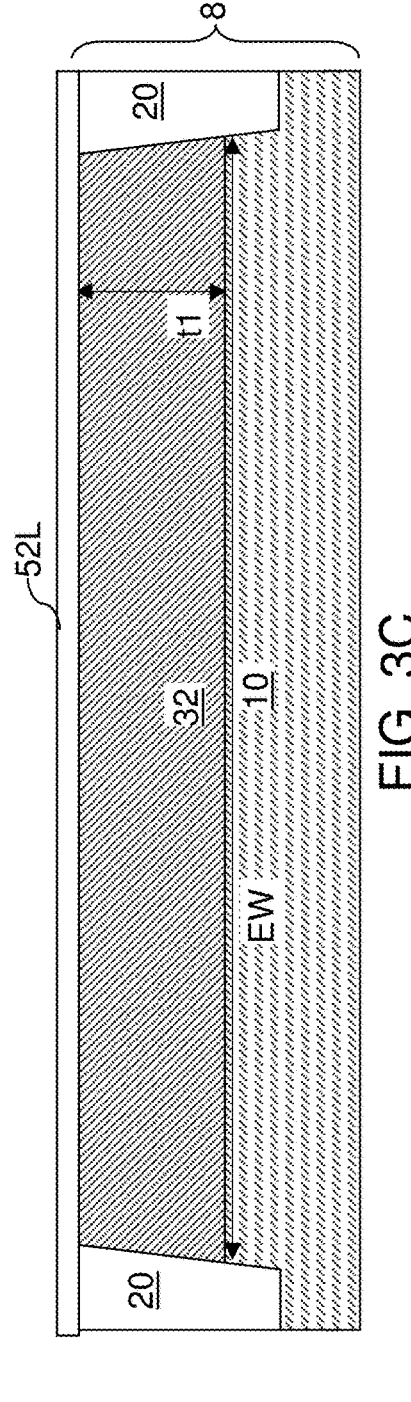
Figure 4A:
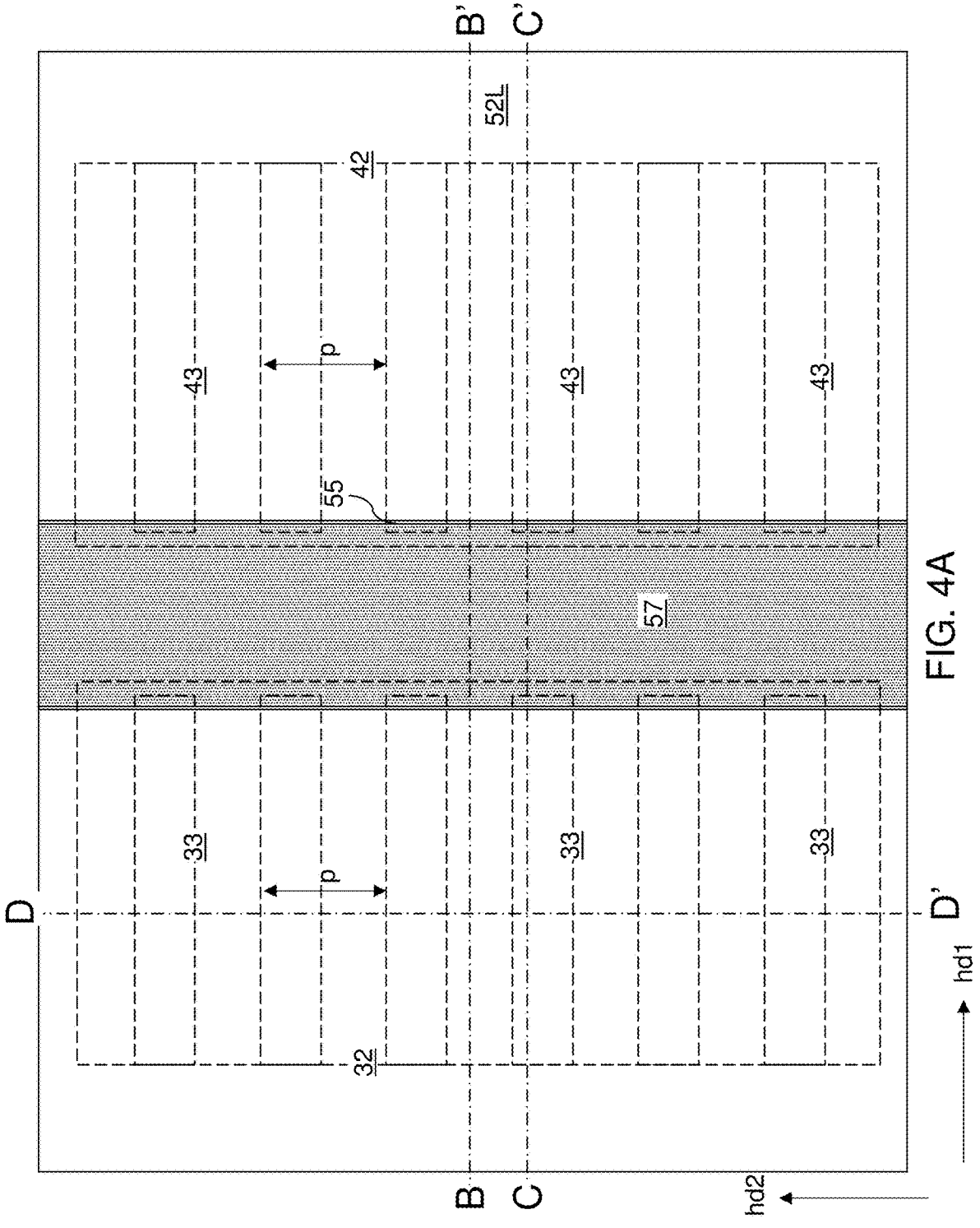
FIGS. 4A-4D are various views of the first exemplary structure after formation of source-side counter-doped rails and drain-side counter-doped rails according to the first embodiment of the present disclosure.
Figures 4B, 4C:
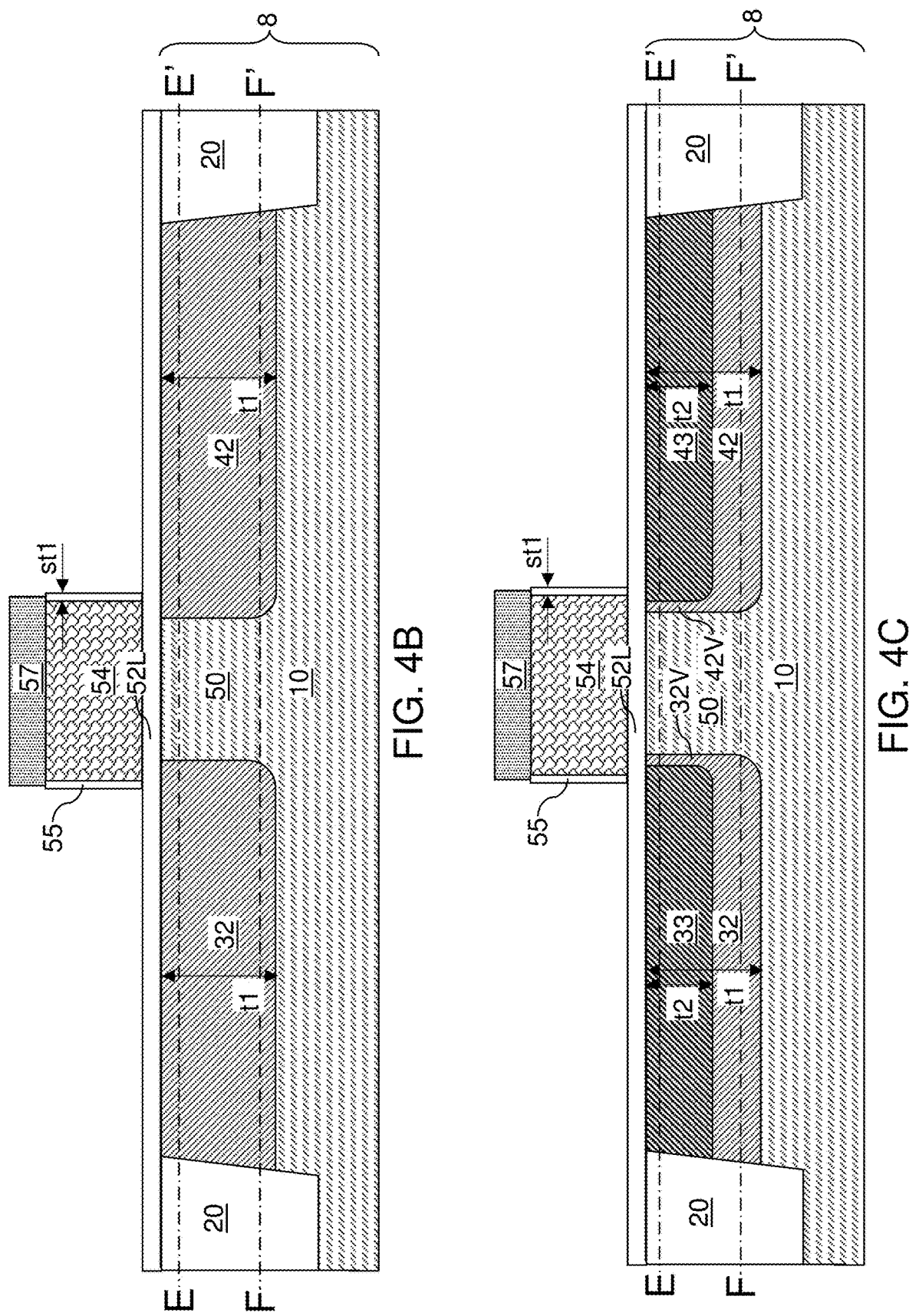
Figure 4D:
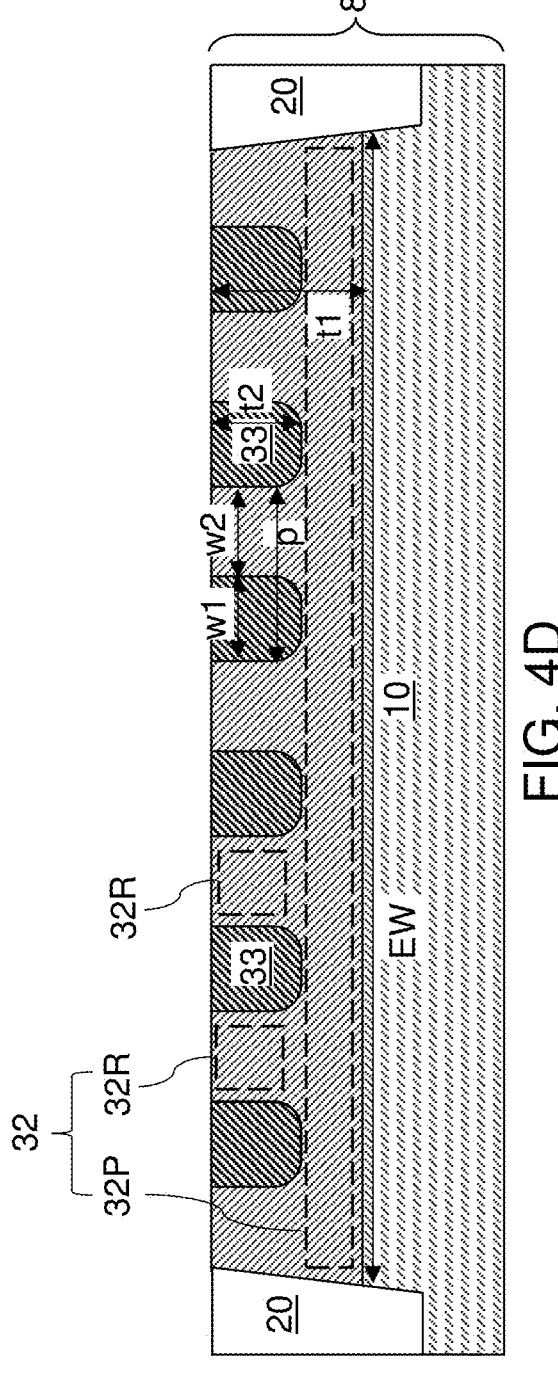
Figure 4E:
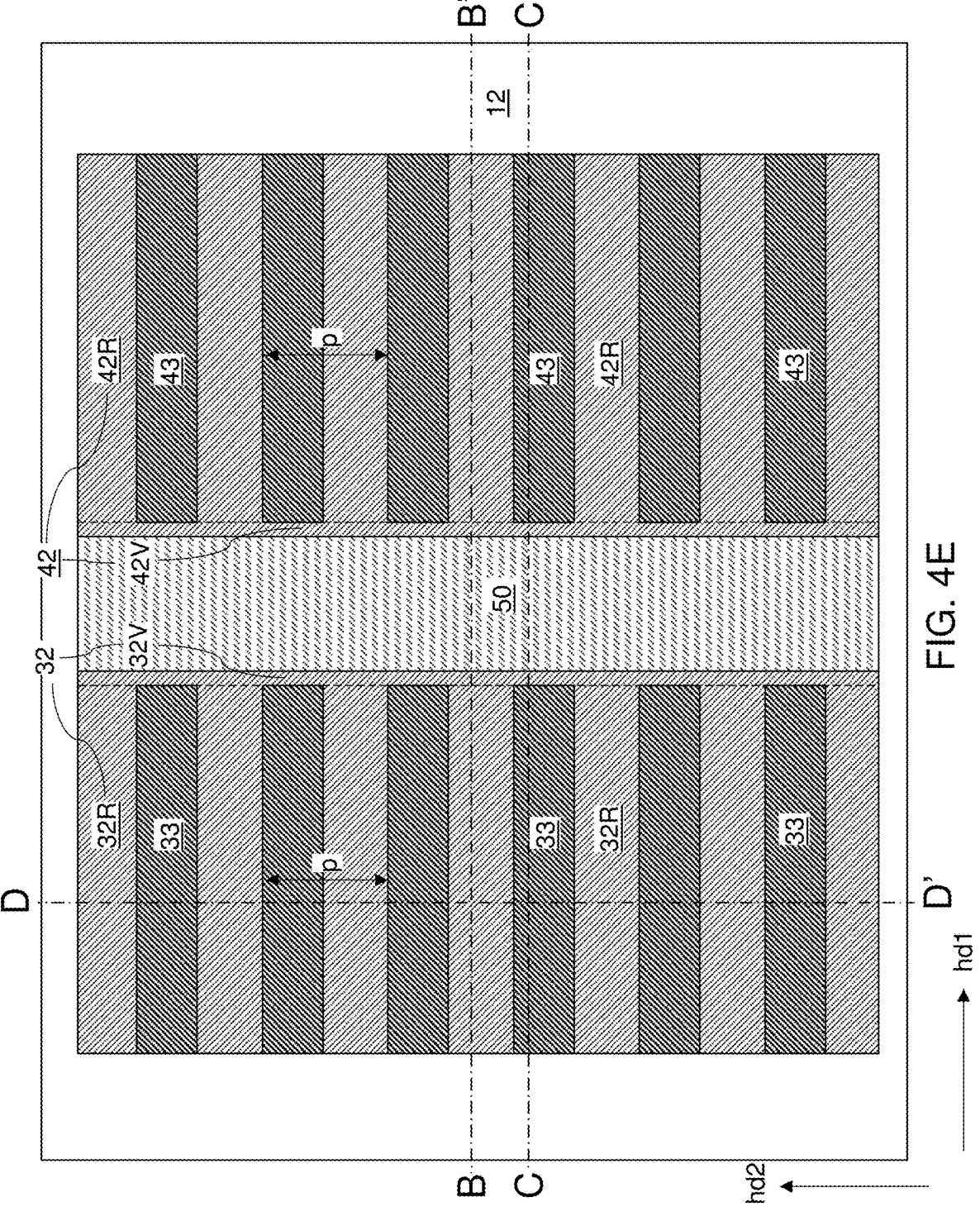
FIG. 4E is a horizontal cross-sectional view of the first exemplary structure along the horizontal plane E-E' of FIGS. 4B and 4C.
Figure 4F:
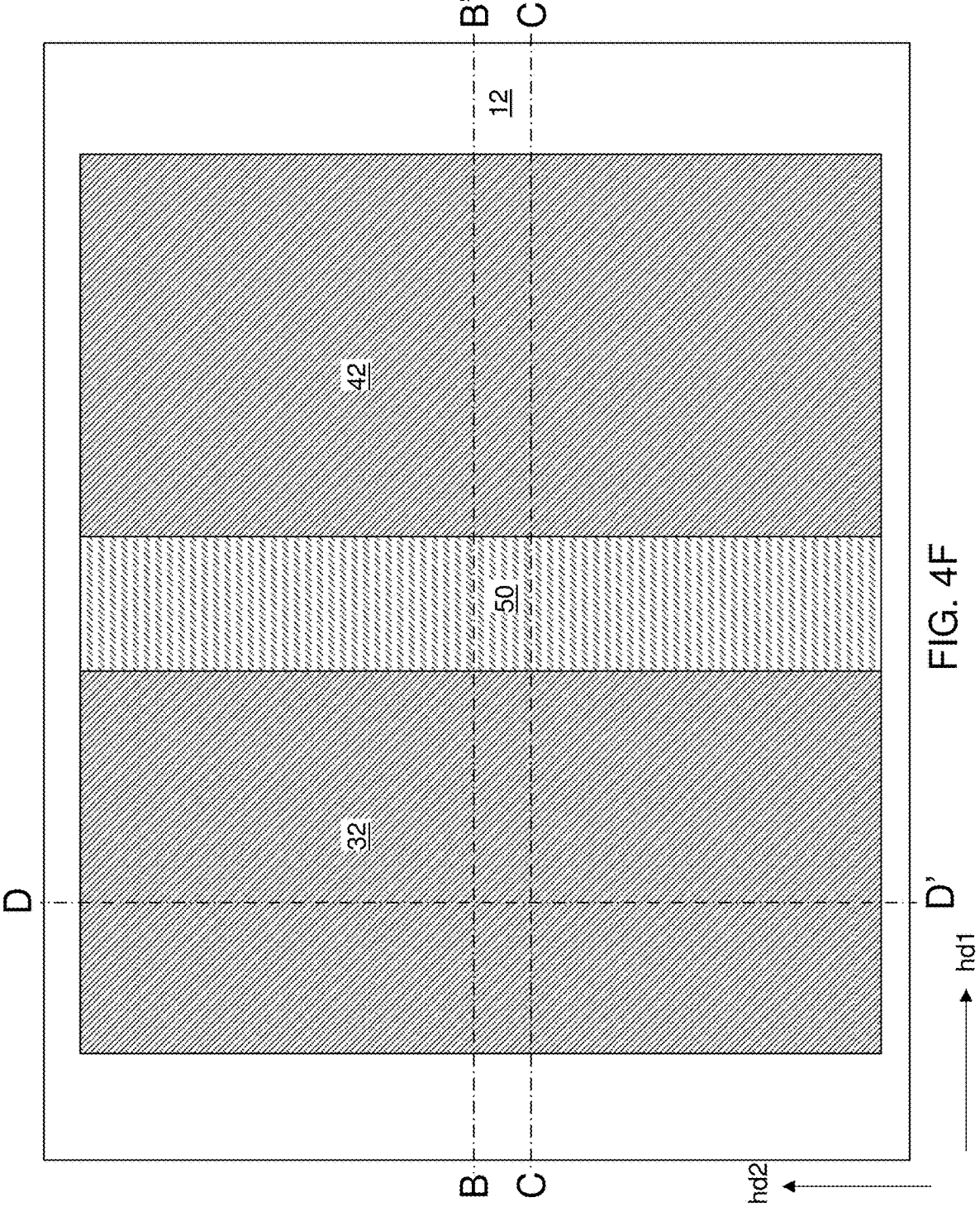
FIG. 4F is a horizontal cross-sectional view of the first exemplary structure along the horizontal plane F-F' of FIGS. 4B and 4C.
Figure 5A:
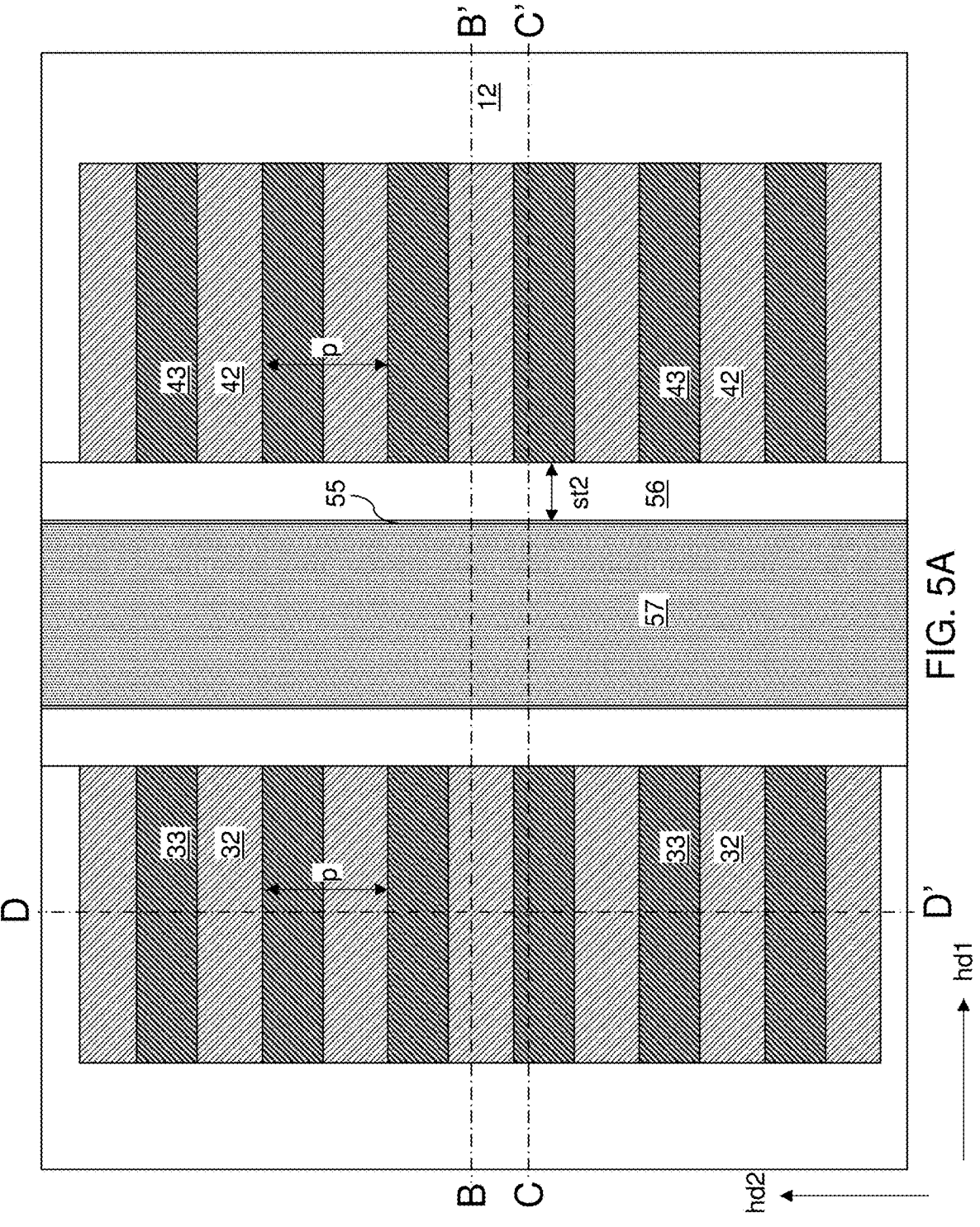
FIGS. 5A-5D are various views of the first exemplary structure after formation of a dielectric gate spacer and patterning the gate dielectric layer into a gate dielectric according to the first embodiment of the present disclosure.
Figures 5B, 5C:
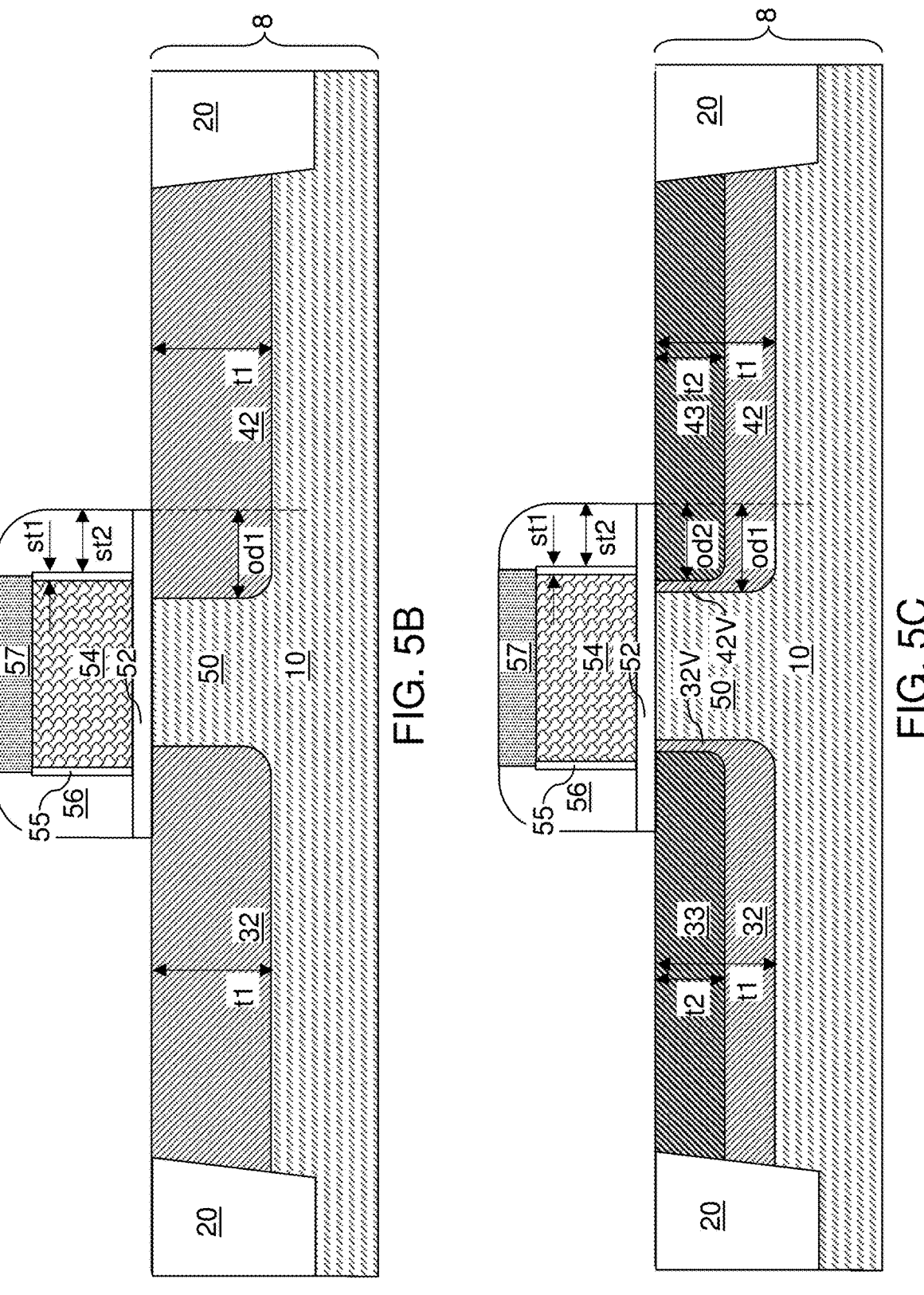
Figure 5D:
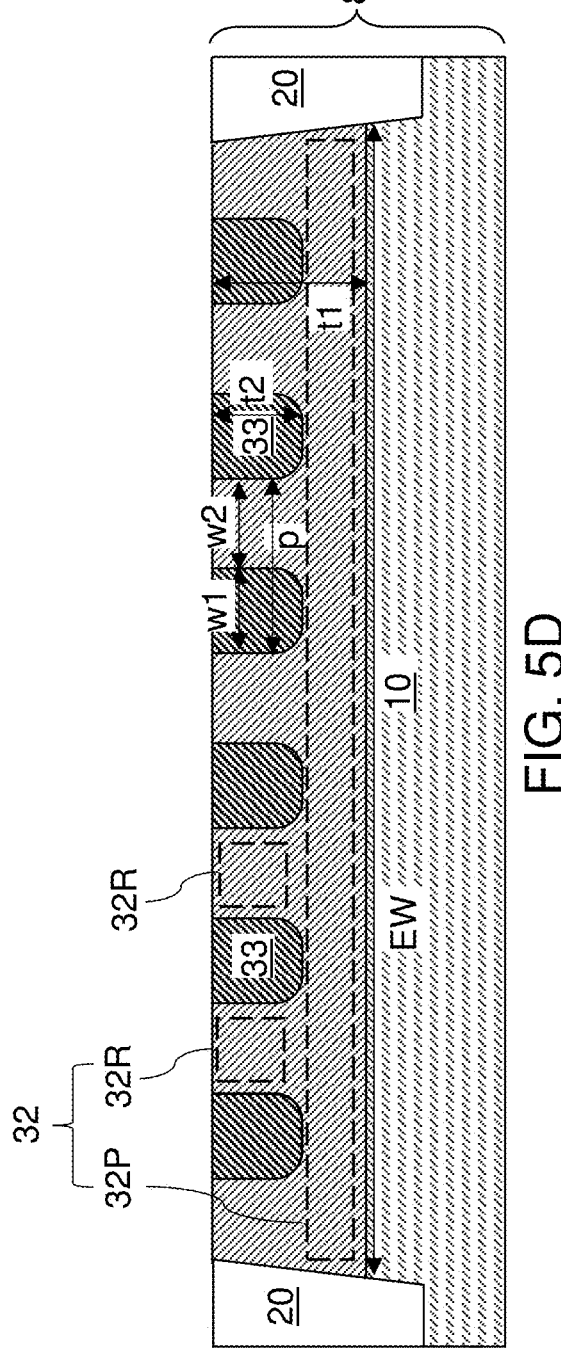
Figure 6A:
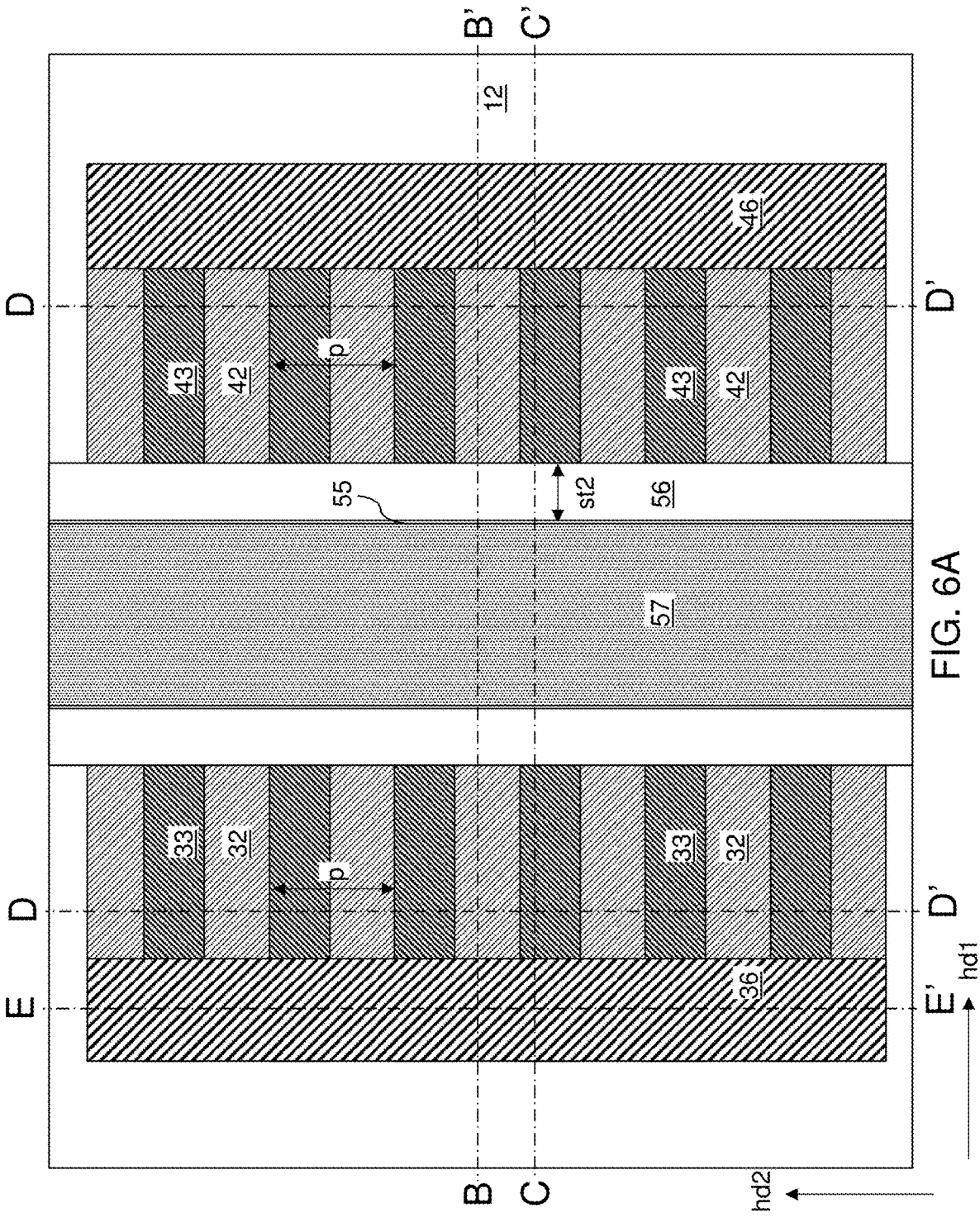
FIGS. 6A-6D are various views of the first exemplary structure after formation of a source region and a drain region according to the first embodiment of the present disclosure.
Figures 6B, 6C:
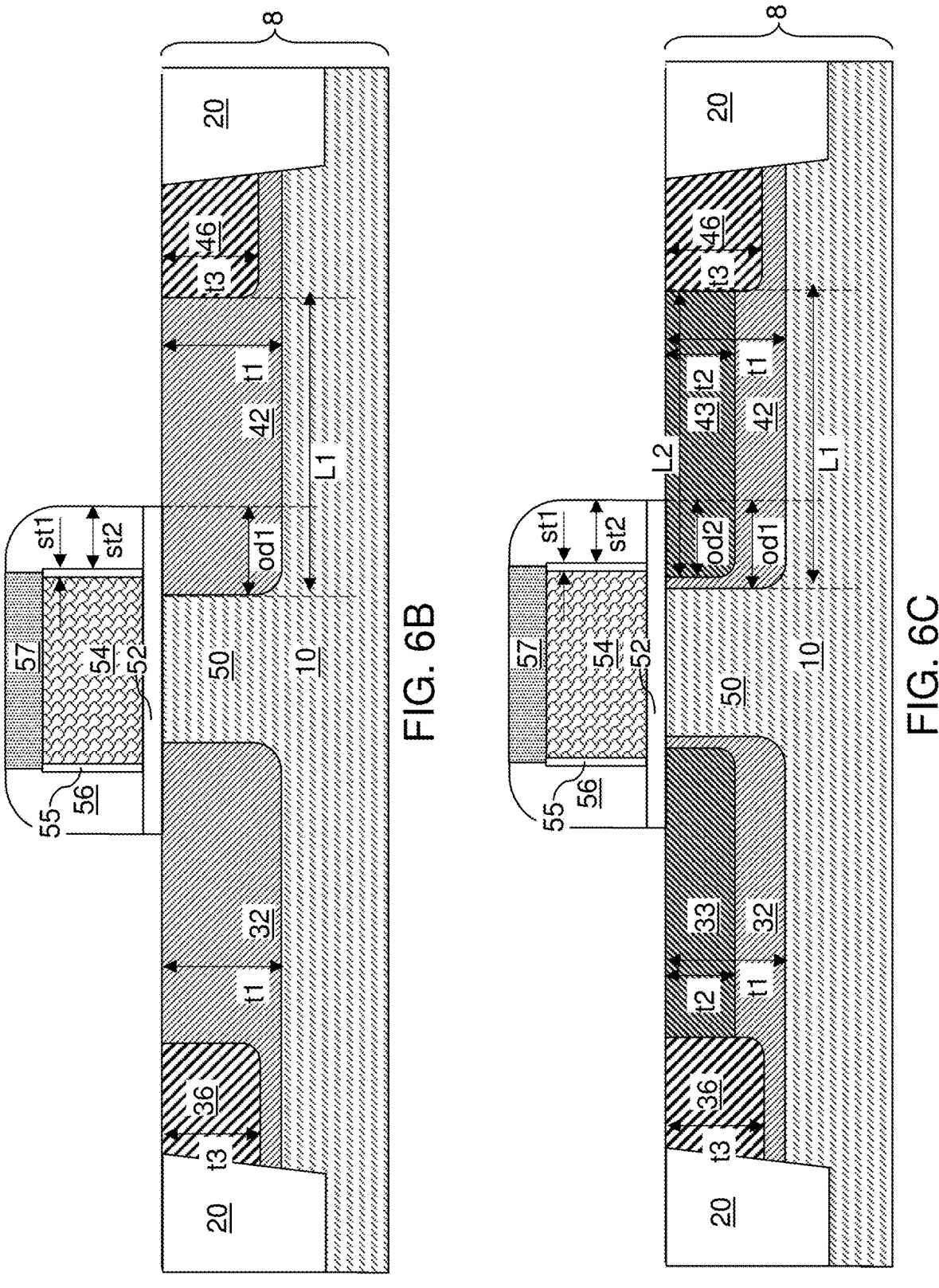
Figure 6D:
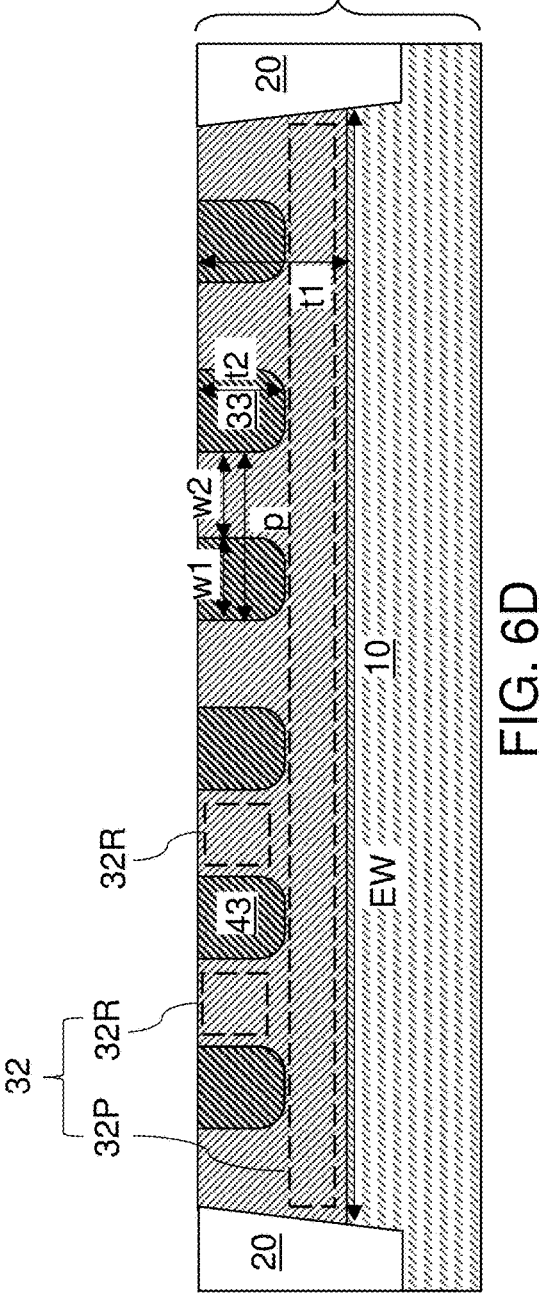
Figure 6E:
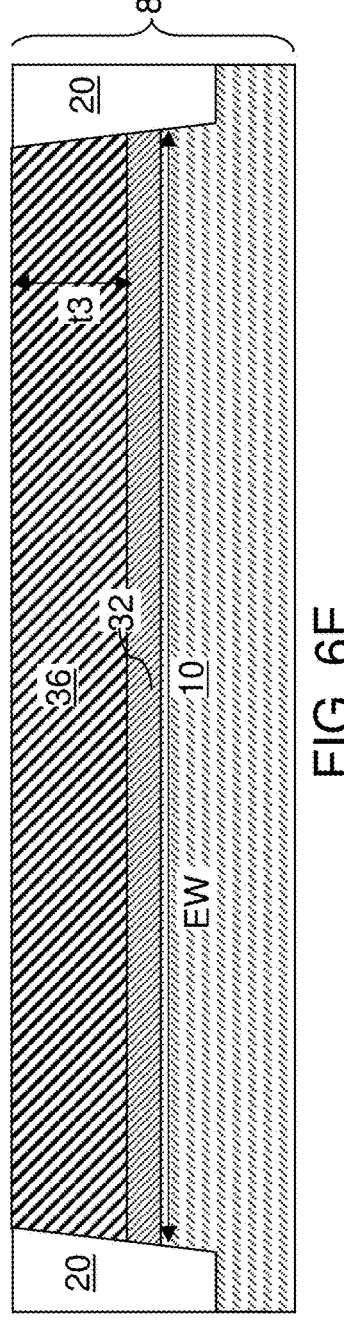
FIG. 6E is a vertical cross-sectional view of the first exemplary structure along the vertical plane E-E' of FIG. 6A.
Figure 7A:
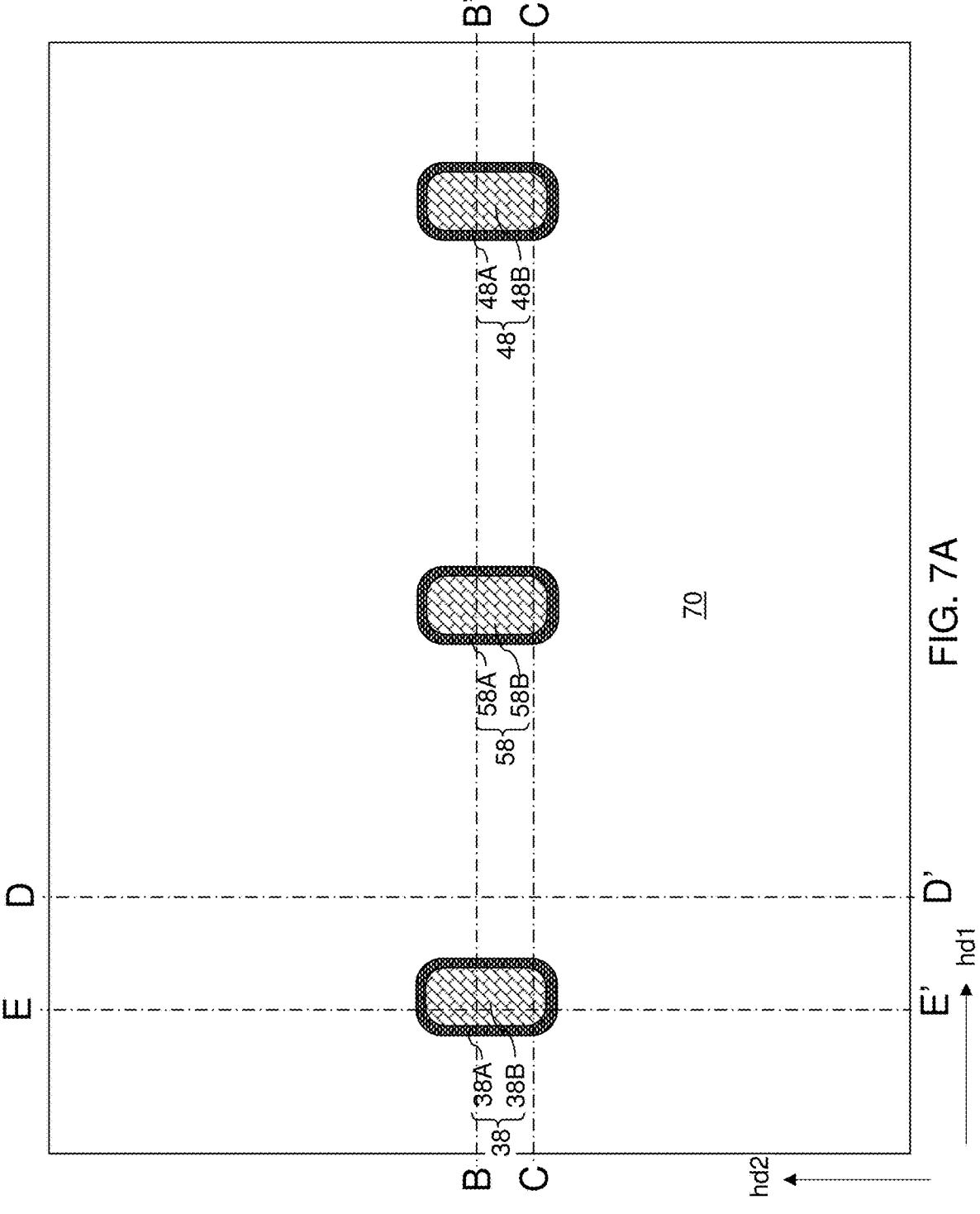
FIGS. 7A-7D are various views of the first exemplary structure after formation of a dielectric material layer and contact via structures according to the first embodiment of the present disclosure.
Figures 7B, 7C:
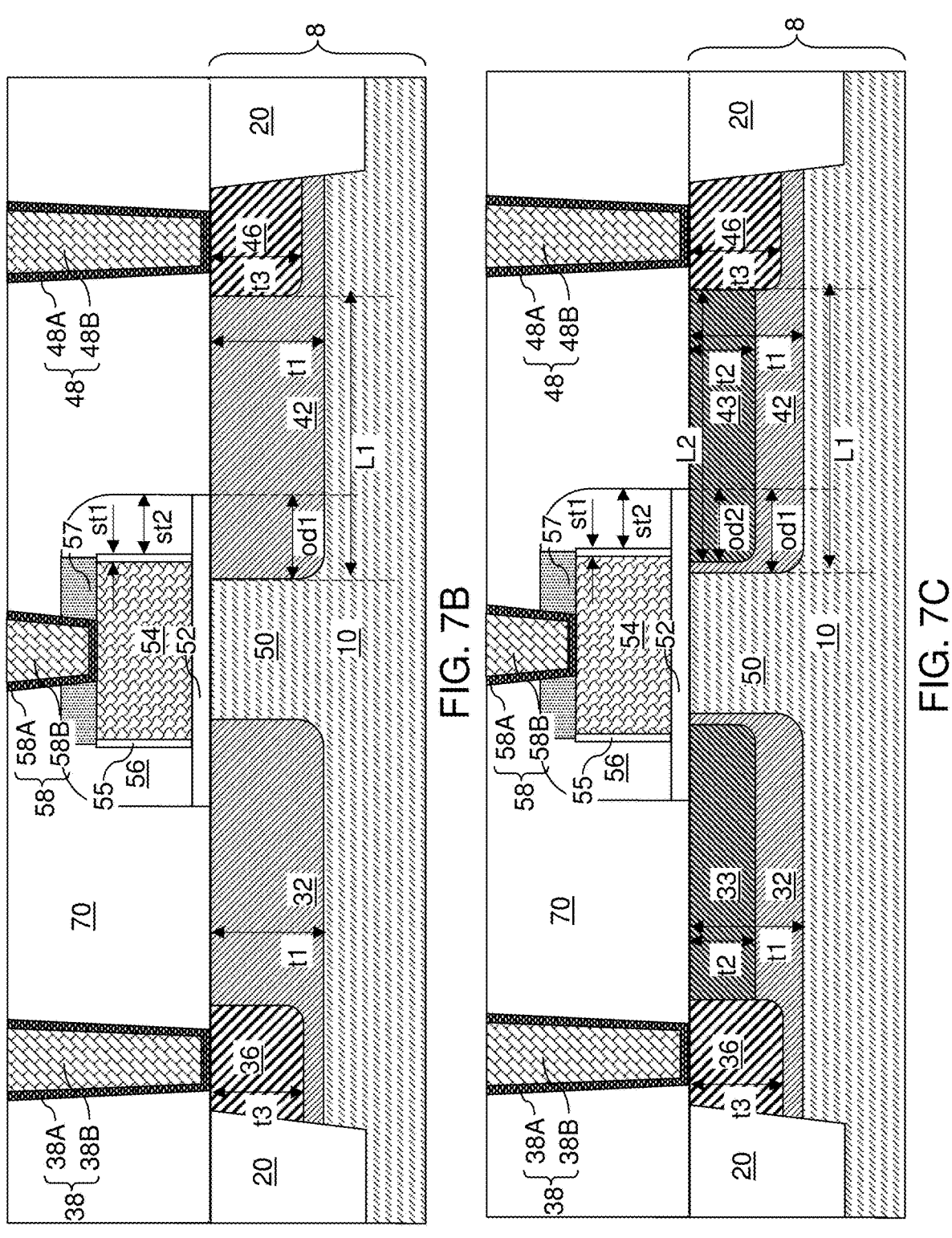
Figures 7D, 7E:
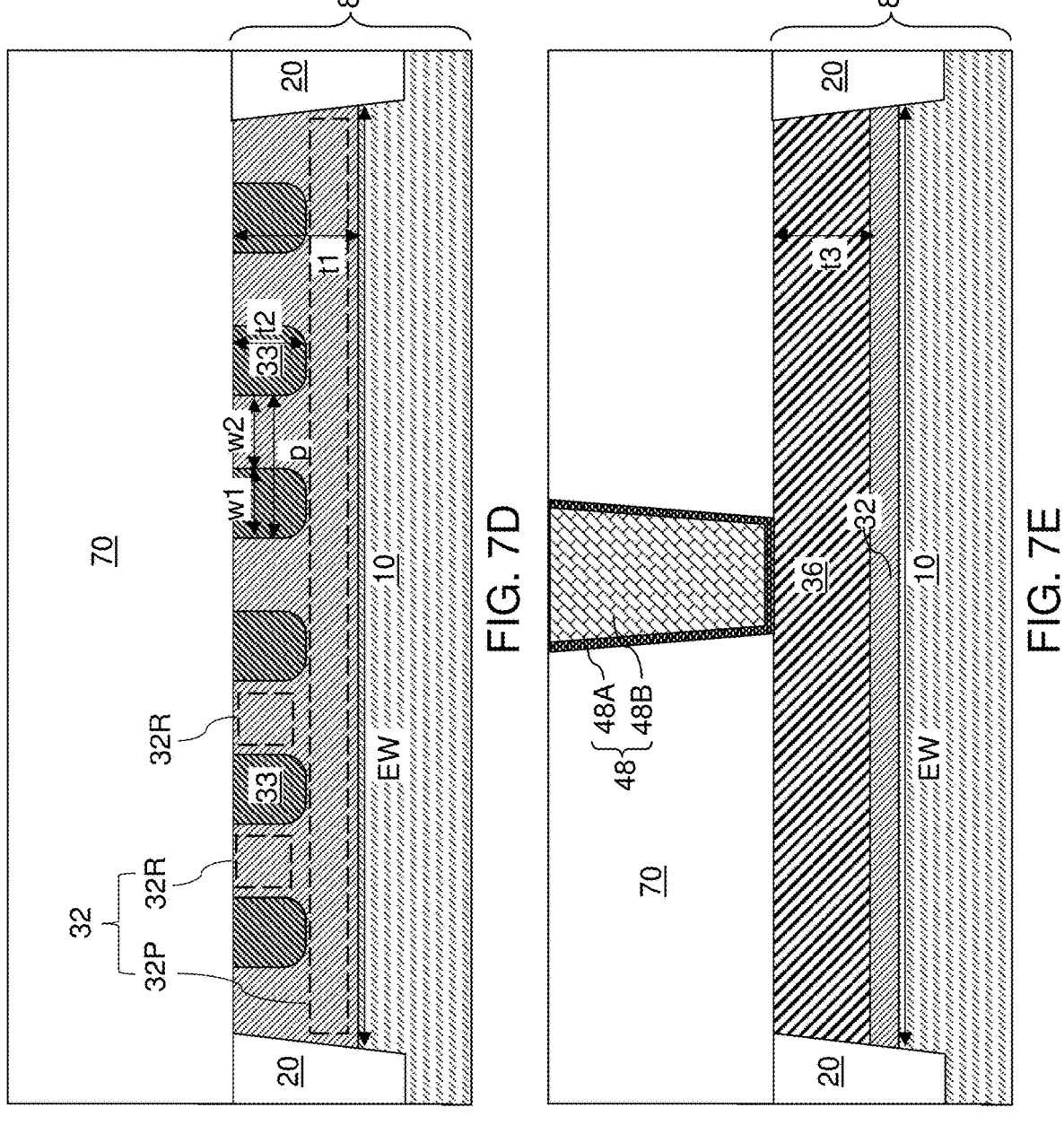
FIG. 7E is a vertical cross-sectional view of the first exemplary structure along the vertical plane E-E' of FIG. 7A.

Referring to FIGS. 3A-3C, doped semiconductor material portions having a doping of a second conductivity type can be formed within surface portions of the semiconductor material layer 10 that is not covered by the gate structure (54, 57). Specifically, a first ion implantation process can be performed to implant dopants of the second conductivity type into the surface portions of the semiconductor material layer 10 employing the gate structure (54, 57) as a first ion implantation mask. The second conductivity type is the opposite of the first conductivity type, which is the conductivity type of the semiconductor material layer 10. For example, if the first conductivity type is p-type, the second conductivity type is n-type, and vice versa.

Source-side extension region 32 and drain-side extension region 42 are formed simultaneously by implanting electrical dopants of the second conductivity type. The source-side extension region 32 and the drain-side extension region 42 are formed within the implanted portions of the semiconductor material layer 10. The source-side extension region 32 and the drain-side extension region 42 can include dopants of the second conductivity type at second average atomic concentration, which may be in a range from $1.0 \times 10^{16}/cm^3$ to $1.0 \times 10^{18}/cm^3$, such as from $3.0 \times 10^{16}/cm^3$ to $3.0 \times 10^{17}/cm^3$, although lesser and greater atomic concentrations may also be employed. The second average atomic concentration is higher than the first average atomic concentration, which may be the uniform atomic concentration of dopants of the first conductivity type in the semiconductor material layer 10.

The source-side extension region 32 and the drain-side extension region 42 can have a uniform thickness, which is herein referred to as a first thickness t1. The thickness t1 can be in a range from 50 nm to 1,000 nm, such as from 100 nm to 500 nm, although lesser and greater depths may also be employed. The lateral dimension of the source-side extension region 32 and the drain-side extension region 42 along the second horizontal direction hd2 is herein referred to as an extension width EW, which is the lateral dimension of the field effect transistor along the second horizontal direction hd2. The extension width EW may be in a range from 200 nm to 10 microns, although lesser and greater dimensions may also be employed.

Due to the lateral straggle of the implanted dopants, the source-side extension region 32 and the drain-side extension region 42 may laterally extend underneath the gate electrode 54. Thus, each of the areas of the source-side extension region 32 and the drain-side extension region 42 can have a respective overlap with the area of the gate electrode 54 is a plan view as illustrated in FIG. 3A.

Referring to FIGS. 4A-4F, a photoresist layer (not shown) can be applied over the first exemplary structure, and can be lithographically patterned into a pattern of strips that laterally extend along the first horizontal direction hd1 and laterally spaced apart along the second horizontal direction hd2. The strips may have a uniform width throughout, and may have a uniform pitch along the second horizontal direction hd2. In case the widths of the strips of the patterned photoresist material are the same and the strips are arranged periodically with a periodicity (i.e., a pitch) along the second horizontal direction, the pattern of strips is referred to as a line-and-space pattern having a uniform pitch.

A second ion implantation process can be performed to implant dopants of the first conductivity type into the surface portions of the source-side extension region 32 and the drain-side extension region 42 employing a combination of the gate structure (54, 57) and the patterned photoresist layer as an ion implantation mask, which is a second ion implantation mask.

Source-side counter-doped rails 33 and drain-side counter-doped rails 43 are formed simultaneously by implanting electrical dopants of the first conductivity type. The source-side counter-doped rails 33 and the drain-side counter-doped rails 43 are formed within the implanted portions of the source-side extension region 32 and the drain-side extension region 42, and have a doping of the opposite conductivity type, i.e., a counter-doping, relative to the doping in the source-side extension region 32 and the drain-side extension region 42. The source-side counter-doped rails 33 and the drain-side counter-doped rails 43 can include dopants of the first conductivity type at a third average atomic concentration, which may be in a range from $2.0 \times 10^{16}/cm^3$ to $2.0 \times 10^{18}/cm^3$, such as from $6.0 \times 10^{16}/cm^3$ to $6.0 \times 10^{17}/cm^3$, although lesser and greater atomic concentrations may also be employed. The third average atomic concentration is higher than the second average atomic concentration. The net atomic concentration of first conductivity type dopants, i.e., the different between the atomic concentration of dopants of the first conductivity type and the atomic concentration of dopants of the second conductivity type, in the source-side counter-doped rails 33 and the drain-side counter-doped rails 43 may be in a range from $1.0 \times 10^{16}/cm^3$ to $1.0 \times 10^{18}/cm^3$, such as from $3.0 \times 10^{16}/cm^3$ to $3.0 \times 10^{17}/cm^3$, although lesser and greater atomic concentrations may also be employed.

Generally, the source-side counter-doped rails 33 are formed by implantation of dopants of the first conductivity type into surface portions of the source-side extension region 32, and the drain-side counter-doped rails 43 are formed by implantation of additional dopants of the first conductivity type into surface portions of the drain-side extension region 42. The photoresist layer can be subsequently removed.

Each of the source-side counter-doped rails 33 and the drain-side counter-doped rails 43 may have a uniform width throughout along the second horizontal direction hd2, which is herein referred to as a first width w1. The first width w1 may be in a range from 50 nm to 500 nm, although lesser and greater widths may also be employed. The source-side counter-doped rails 33 and the drain-side counter-doped rails 43 have a second thickness t2 that is less than the first thickness t1. The second thickness t2 may be 25 nm to 800 nm, such as from 60 nm to 300 nm, although lesser and greater depths may also be employed.

Each portion of the source-side extension region 32 forming at least one vertical p-n junction laterally extending along the first horizontal direction hd1 with the source-side counter-doped rails 33 may have a respective rail shape, and is herein referred to as a source-side-extension rail portion 32R. Each portion of the drain-side extension region 42 forming at least one vertical p-n junction laterally extending along the first horizontal direction hd1 with the drain-side counter-doped rails 43 may have a respective rail shape, and is herein referred to as a drain-side-extension rail portion 42R. The remaining portion of the source-side extension region 32 outside of the source-side-extension rail portions 32R includes a source-side-extension plate portion 32P, which includes a horizontally-extending portion located below a horizontal plane including bottom surfaces of the source-side-extension rail portions 32R and further includes a vertically-extending portion 32V that is laterally more proximal to the drain-side extension region 42 than the vertical plane including vertical surfaces of the source-side-extension rail portions 32R that are proximal to the drain-side extension region 42. The remaining portion of the drain-side extension region 42 outside of the drain-side-extension rail portions 42R includes a drain-side-extension plate portion 42P, which includes a horizontally-extending portion located below a horizontal plane including bottom surfaces of the drain-side-extension rail portions 42R and further includes a vertically-extending portion 42V that is laterally more proximal to the source-side extension region 32 than the vertical plane including vertical surfaces of the drain-side-extension rail portions 42R that are proximal to the source-side extension region 32. A portion of the semiconductor material layer 10 located under the gate electrode 54 between the respective vertical portions 32V, 42V comprises a semiconductor channel 50 of the field effect transistor.

The source-side-extension rail portions 32R laterally extend along the first horizontal direction hd1 and may have a respective uniform width (such as a second width w2) along the second horizontal direction hd2. The drain-side-extension rail portions 42R laterally extend along the first horizontal direction hd1 and may have a respective uniform width (such as the second width w2) along the second horizontal direction hd2. The second width w2 may be in a range from 50 nm to 500 nm, although lesser and greater widths may also be employed. The sum of the first width w1 and the second width w2 is the periodicity p, of the laterally alternating sequence of the source-side-extension rail portions 32R and the source-side counter-doped rails 33, and of the laterally alternating sequence of the drain-side-extension rail portions 42R and the drain-side counter-doped rails 43.

Generally, the source-side counter-doped rails 33 and the drain-side counter-doped rails 43 can be formed within upper portions of the source-side extension region 32 and the drain-side extension region 42, respectively, by implanting dopants of the first conductivity type. The source-side extension region 32 comprises a source-side-extension plate portion 32P, the vertically-extending portion 32V, and source-side-extension rail portions 32R that overlie the source-side-extension plate portion 32P after formation of the source-side counter-doped rails 33. The drain-side extension region 42 comprises a drain-side-extension plate portion 42P, vertically-extending portion 42V, and drain-side-extension rail portions 42R that overlie the drain-side-extension plate portion 42P after formation of the drain-side counter-doped rails 43. The source-side counter-doped rails 33 are interlaced with the source-side-extension rail portions 32R along the second horizontal direction hd2 to provide a first superjunction structure (32, 33), and the drain-side counter-doped rails 43 are interlaced with the drain-side-extension rail portions 42R along the second horizontal direction hd2 to provide a second superjunction structure (42, 43).

In one embodiment, the source-side counter-doped rails 33 and the source-side-extension rail portions 32R with a uniform periodicity p along the second horizontal direction hd2. In one embodiment, the source-side counter-doped rails 33 are not in direct contact with the channel 50 in the semiconductor material layer 10, and the drain-side counter-doped rails 43 are not in direct contact with the channel 50 in the semiconductor material layer 10. In one embodiment, top surfaces of the source-side counter-doped rails 33 are located within a same horizontal plane as a top surface of the source-side extension region 32, the source-side extension region 32 and the drain-side extension region 42 have a first thickness t1, and the source-side counter-doped rails 33 and the drain-side counter-doped rails 43 have a second thickness t2 that is less than the first thickness t1. In one embodiment, each of the source-side counter-doped rails 33 and the drain-side counter-doped rails 43 has an areal overlap with a respective portion of the gate electrode 54 in a plan view. Such an overlap may increase the effect of the first superjunction (32, 33) and the second superjunction (42, 43).

Referring to FIGS. 5A-5D, a dielectric material layer can be conformally deposited over and around the gate electrode 54 and the gate cap dielectric 57 and over the top surface of the substrate 8. The dielectric material layer includes at least one dielectric material such as silicon oxide, silicon nitride, silicon carbonitride, and/or silicon oxynitride. An anisotropic sidewall spacer etch process can be performed to remove horizontally-extending portions of the dielectric material layer. Further, the anisotropic etch process can be continued to remove unmasked portions of the gate dielectric layer 52L selective to semiconductor materials in the substrate 8, e.g., selective to the materials of the first superjunction (32, 33) and the second superjunction (42, 43).

A remaining portion of the dielectric material layer that laterally surrounds the gate electrode 54 constitutes an optional dielectric gate spacer 56. The lateral thickness of the dielectric gate spacer 56 is herein referred to as a second spacer thickness st2, which may be in a range from 30 nm to 600 nm, such as from 60 nm to 300 nm, although lesser and greater thicknesses may also be employed. A remaining portion of the gate dielectric layer 52L constitutes a gate dielectric 52. The sidewall of the gate dielectric 52 may be vertically coincident with an outer sidewall of the dielectric gate spacer 56. The combination of the gate dielectric 52, the gate electrode 54, the gate cap dielectric 57, and the dielectric gate spacer 56 constitutes a gate assembly (52, 54, 56, 57).

The dielectric gate spacer 56 laterally surrounds the gate electrode 54. Each of the source-side counter-doped rails 33 and the drain-side counter-doped rails 43 may have an areal overlap with a respective portion of the dielectric gate spacer 56 in a plan view that is perpendicular to an interface between the 4 and the gate dielectric 52. In one embodiment, each of the source-side-extension rail portions 32R and the source-side counter-doped rails 33 are in contact with a respective segment of a bottom surface of the gate dielectric 52.

A sidewall of the source-side extension region 32 that is proximal to the drain-side extension region 42 is herein referred to as proximal sidewalls of the source-side extension region 32. Sidewalls of the source-side counter-doped rails 33 that are proximal to the drain-side extension region 42 are herein referred to as proximal sidewalls of the source-side counter-doped rails 33. A sidewall of the drain-side extension region 42 that is proximal to the source-side extension region 32 is herein referred to as proximal sidewalls of the drain-side extension region 42. Sidewalls of the drain-side counter-doped rails 44 that are proximal to the source-side extension region 32 are herein referred to as proximal sidewalls of the drain-side counter-doped rails 44.

The proximal sidewall of the source-side extension region 32 can be laterally offset from an outer sidewall of the dielectric gate spacer 56 that overlies the source-side extension region 32 by a first offset distance od1 that is greater than the sum of the second spacer thickness st2 and the first spacer thickness st1. The proximal sidewall of the drain-side extension region 42 can be laterally offset from an outer sidewall of the dielectric gate spacer 56 that overlies the drain-side extension region 42 by the first offset distance od1. The proximal sidewalls of the source-side counter-doped rails 33 can be laterally offset from the outer sidewall of the dielectric gate spacer 56 that overlies the source-side extension region 32 by a second offset distance od2 that is greater than the sum of the second spacer thickness st2 and the first spacer thickness st1. The proximal sidewalls of the drain-side counter-doped rails 43 can be laterally offset from the outer sidewall of the dielectric gate spacer 56 that overlies the drain-side extension region 42 by the second offset distance od2.

Referring to FIGS. 6A-6E, a photoresist layer (not shown) can be applied over the first exemplary structure, and can be lithographically patterned to form a pair of openings therein. One of the openings in the photoresist layer can be formed in an area proximal to an interface between a distal portion of the source-side extension region 32 and the shallow trench isolation structure 20 and does not overlap with the dielectric gate spacer 56. Another of the openings in the photoresist layer can be formed in an area proximal to an interface between a distal portion of the drain-side extension region 42 and the shallow trench isolation structure 20 and does not overlap with the dielectric gate spacer 56.

Dopants of the second conductivity type can be implanted through the openings in the photoresist layer into an upper portion of the distal region of the first superjunction structure (32, 33) and into an upper portion of the distal region of the second superjunction structure (42, 43). As used herein, a distal region of the first superjunction structure (32, 33) refers to a region of the first superjunction structure (32, 33) that is distal from the gate electrode 54, and a distal region of the second superjunction structure (42, 43) refers to a region of the second superjunction structure (42, 43) that is distal from the gate electrode 54. A source region 36 having a doping of the second conductivity type is formed in the implanted region within the first superjunction structure (32, 33). A drain region 46 having a doping of the second conductivity type is formed in the implanted region within the second superjunction structure (42, 43).

Generally, the source region 36 and the drain region 46 have a doping of the second conductivity type, and are formed in the substrate 8 such that the source region 36 contacts the first superjunction structure (32, 33) and the drain region 46 contacts the second superjunction structure (42, 43). The source region 36 and the drain region 46 are laterally spaced from the gate structure (52, 54) and from each other along the first horizontal direction hd1. In one embodiment, the source region 36 and the drain region 46 do not have any areal overlap with the dielectric gate spacer 56.

The source region 36 and the drain region 46 include dopants of the second conductivity type at an average atomic concentration in a range from $5.0 \times 10^{18}/cm^3$ to $2.0 \times 10^{21}/cm^3$, such as from $1.0 \times 10^{19}/cm^3$ to $1.0 \times 10^{21}/cm^3$. Generally, the average atomic concentration of the dopants of the second conductivity type in the source region 36 and the drain region 46 is greater than the third average atomic concentration and the second average atomic concentration. As such, the source region 36 and the drain region 46 comprises dopants of the second conductivity type at a higher average atomic concentration than the source-side-extension rail portions 32R and the drain-side-extension rail portions 42R. The source region 36 and the drain region 46 have a third thickness t3 that is less than the first thickness t1 and is greater than the second thickness t2.

In one embodiment, the source-side counter-doped rails 33 are in contact with a sidewall of the source region 36, and the drain-side counter-doped rails 43 are in contact with a sidewall of the drain region 46. In one embodiment, the source-side extension region 32 can laterally extend between the source region 36 and a first bottom surface segment of the gate dielectric 52, and can include a source-side-extension plate portion 32P and source-side-extension rail portions 32R that overlie the source-side-extension plate portion 32P. The source-side counter-doped rails 33 have a doping of the first conductivity type, are embedded in the source-side extension region 32, and are interlaced with the source-side-extension rail portions 32R along the second horizontal direction hd2 to provide the first superjunction structure (32, 33).

In one embodiment, the drain-side extension region 42 can laterally extend between the drain region 46 and a second bottom surface segment of the gate dielectric 52, and can include a drain-side-extension plate portion 42P and drain-side-extension rail portions 42R that overlie the drain-side-extension plate portion 42P. The drain-side counter-doped rails 43 have a doping of the first conductivity type, are embedded in the drain-side extension region 42, and are interlaced with the drain-side-extension rail portions 42R along the second horizontal direction hd2 to provide the second superjunction structure (42, 43).

Referring to FIGS. 7A-7E, a contact-level dielectric layer 70 can be formed over the gate structure (54, 57) and dielectric gate spacer 56. The contact-level dielectric layer 70 can include a self-planarizing dielectric material, such as flowable oxide (FOX), or a planarizable dielectric material, such as undoped silicate glass or a doped silicate glass. In case the contact-level dielectric layer 70 includes undoped silicate glass or a doped silicate glass, a top surface of the contact-level dielectric layer 70 can be planarized by performing a chemical mechanical polishing process. The top surface of the contact-level dielectric layer 70 may be vertically spaced above the horizontal plane including the bottom surfaces of the gate cap dielectric 57 by a vertical distance in a range from 100 nm to 1,000 nm, such as from 200 nm to 500 nm, although lesser and greater vertical spacings may also be employed.

A photoresist layer (not shown) can be applied over the contact-level dielectric layer 70, and can be lithographically patterned to form discrete openings in areas that overlie the source region 36, the drain region 46, and the gate electrode 54 of the field effect transistor. An anisotropic etch process can be performed to transfer the pattern of the openings in the photoresist layer through the contact-level dielectric layer 70 and the gate cap dielectric 57. Contact via cavities are formed through the contact-level dielectric layer 70 and the gate cap dielectric 57. Top surfaces of the source region 36, the drain region 46, and the gate electrode 54 of the field effect transistor are physically exposed underneath the contact via cavities. The photoresist layer can be subsequently removed, for example, by ashing.

At least one conductive material can be deposited in the via cavities to form various contact via structures (38, 48, 58). For example, a metallic liner (such as a conductive metal nitride liner including TiN, TaN, or WN) and a metallic fill material (such as W, Ti, Co, Cu, Ru, or Al) may be sequentially deposited in the via cavities. Excess portions of the metallic liner and the metallic fill material can be removed from above the horizontal plane including the top surface of the contact-level dielectric layer 70 by a planarization process, such as chemical mechanical polishing or a recess etch. Each contiguous set of remaining conductive material portions constitutes a contact via structure (38, 48, 58).

In one embodiment, the contact via structures (38, 48, 58) may comprise a source contact via structure 38 contacting a top surface of the source region 36, a drain contact via structure 48 contacting a top surface of the drain region 46, and a gate contact via structure contacting a top surface of the gate electrode 54. The source contact via structure 36 may comprise a combination of a source metallic barrier liner 38A and a source metallic fill material portion 38B. The drain contact via structure 46 may comprise a combination of a drain metallic barrier liner 48A and a drain metallic fill material portion 48B. The gate contact via structure 56 may comprise a combination of a gate metallic barrier liner 58A and a gate metallic fill material portion 58B.

Figure 8A:
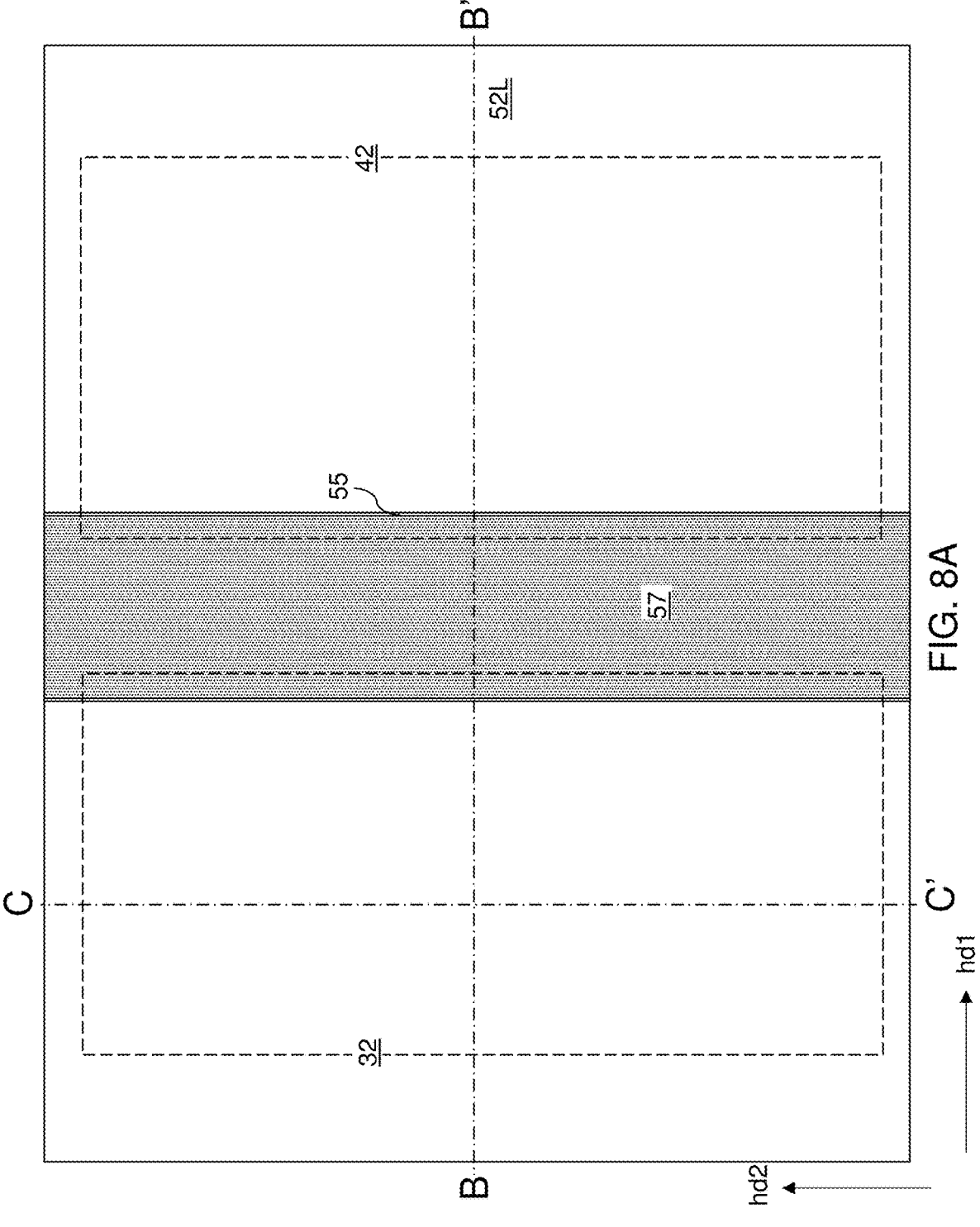
FIGS. 8A-8C are various views of a second exemplary structure after formation of a source-side extension region and a drain-side extension region according to the second embodiment of the present disclosure.
Figure 8B:
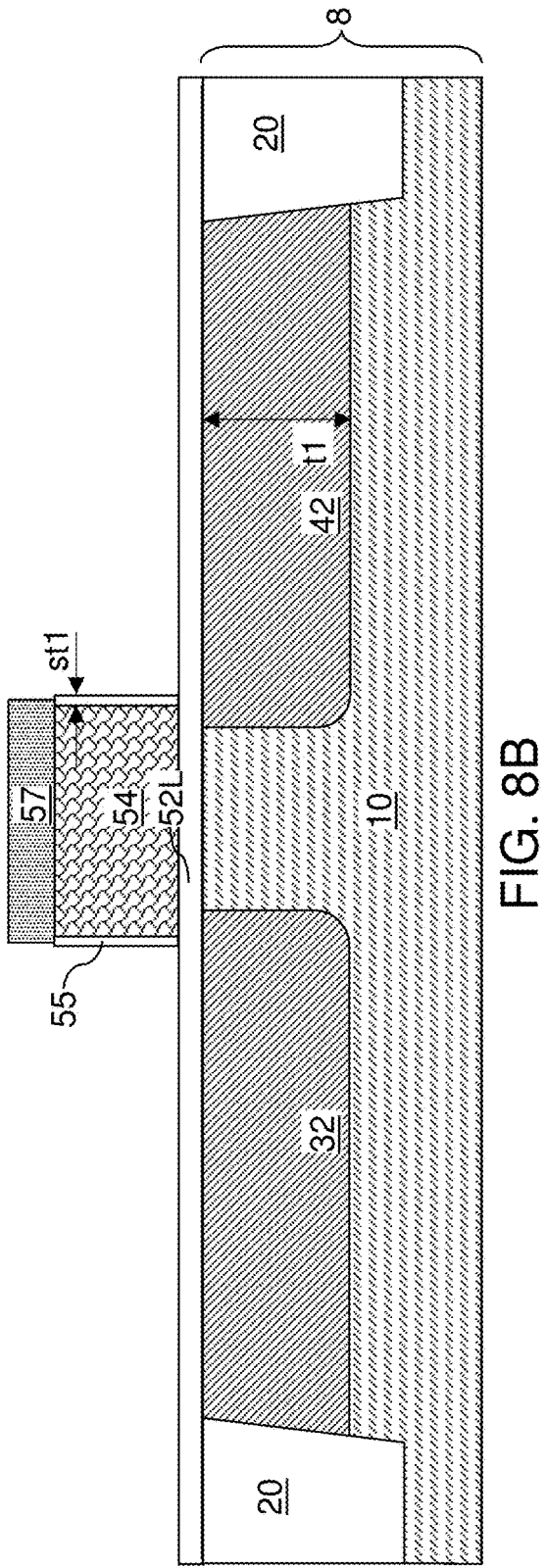
Figure 8C:
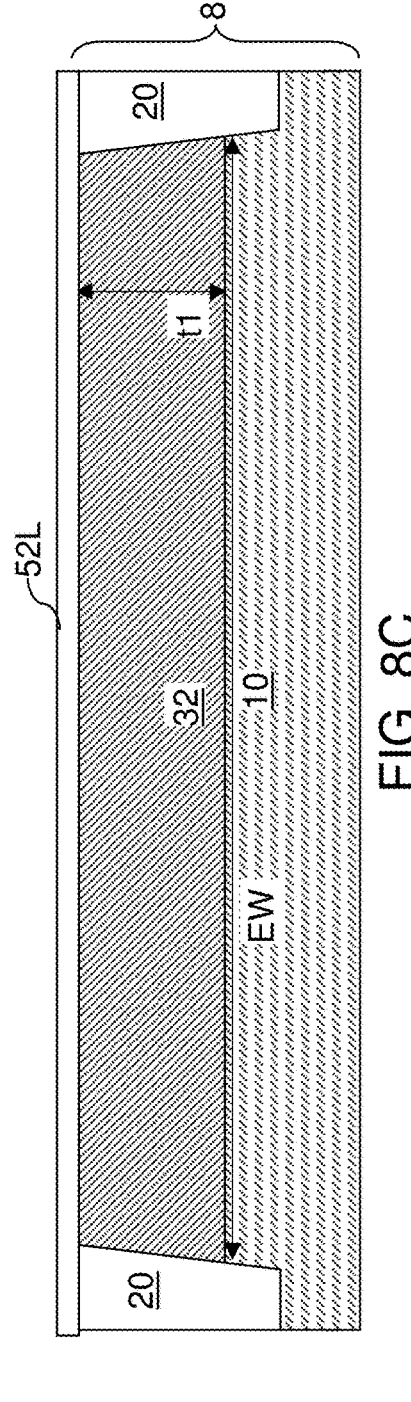

Referring to FIGS. 8A-8C, a second exemplary structure according to a second embodiment of the present disclosure is illustrated, which may be the same as the first exemplary structure illustrated in FIGS. 3A-3C.

Figure 9A:
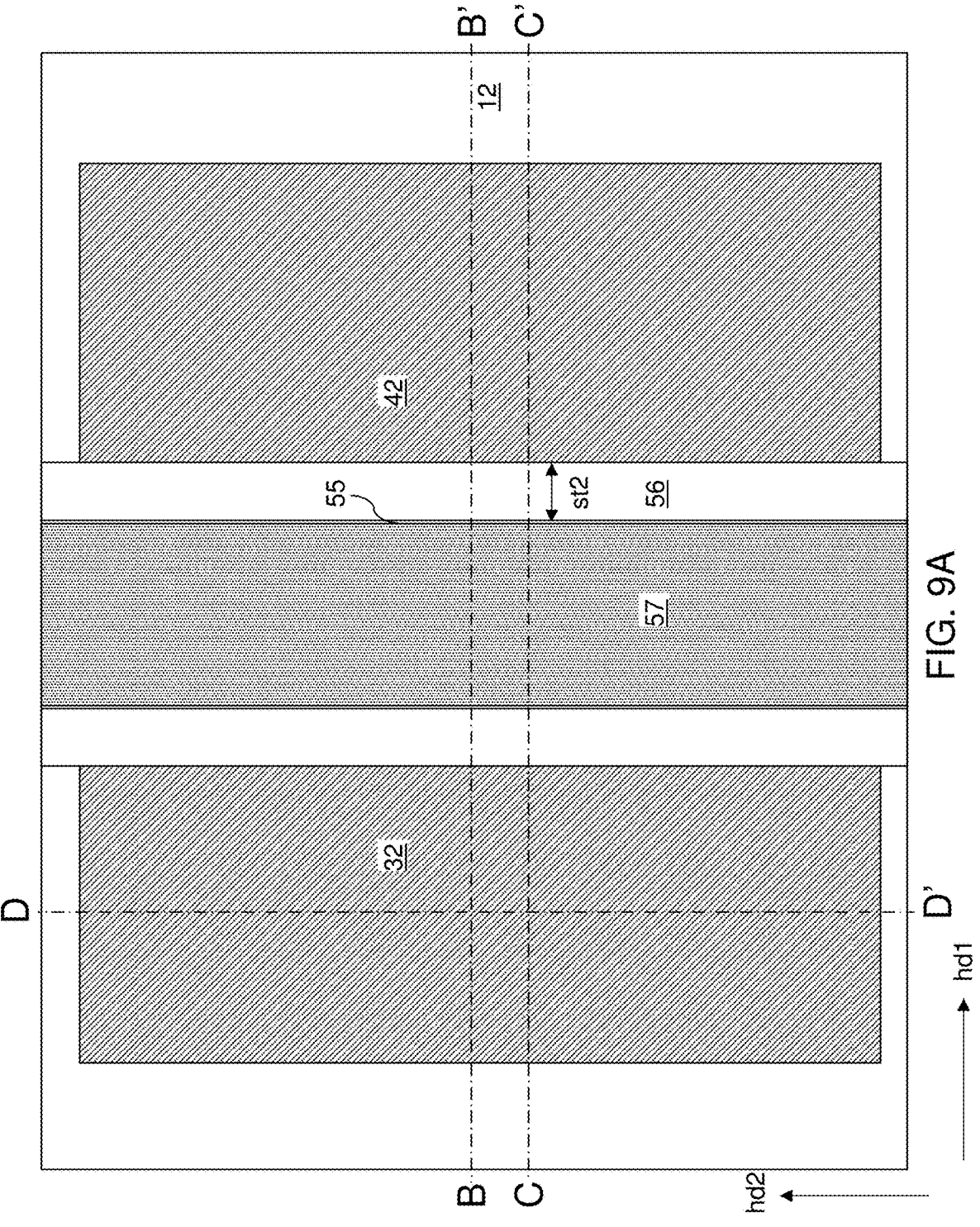
FIGS. 9A-9C are various views of the second exemplary structure after formation of a dielectric gate spacer and patterning the gate dielectric layer into a gate dielectric according to the second embodiment of the present disclosure.
Figure 9B:
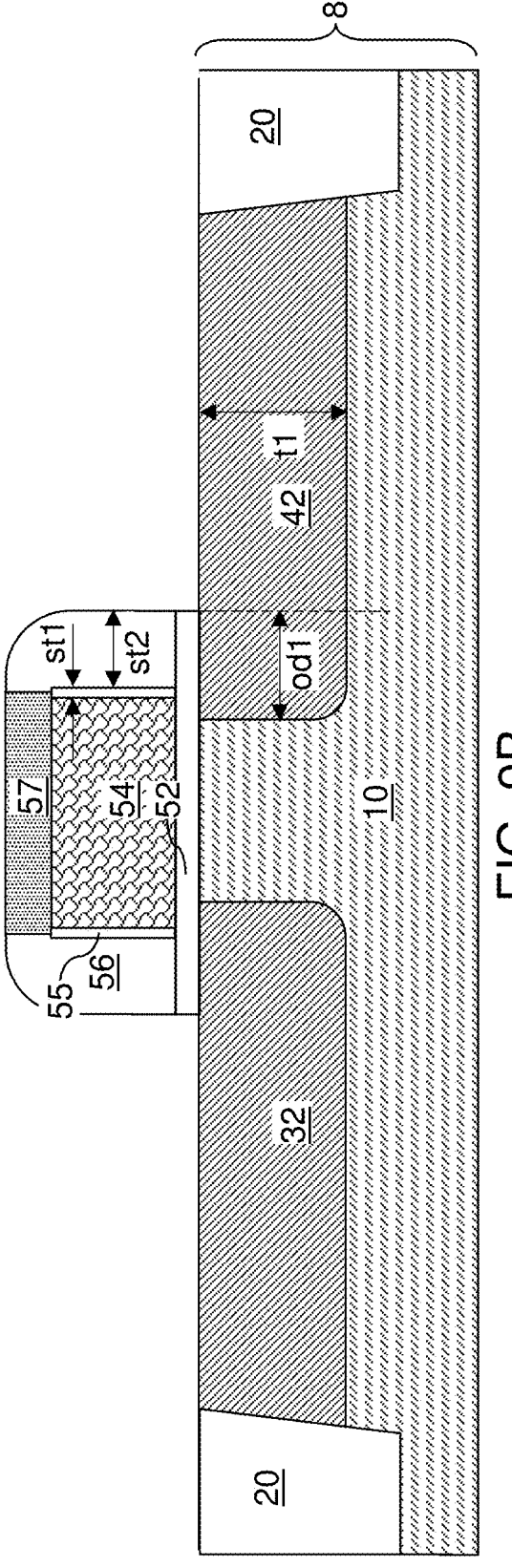
Figure 9C:
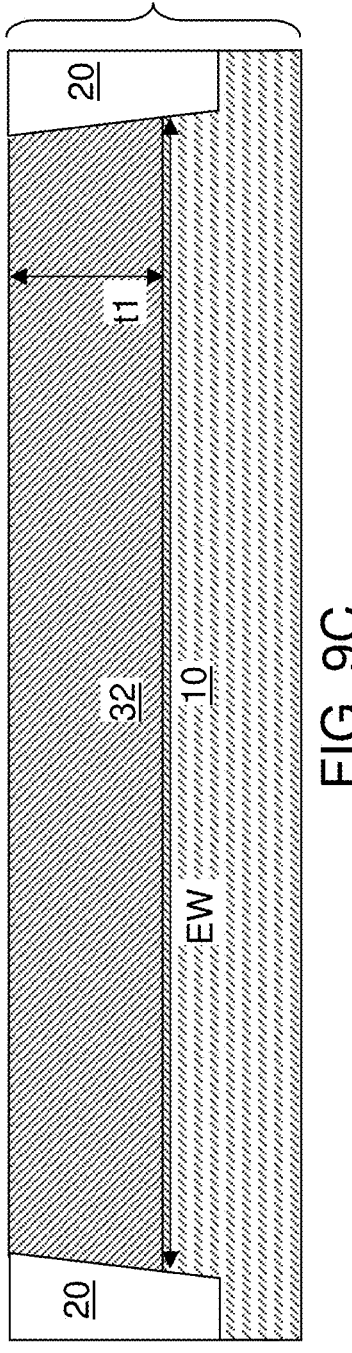
Figure 10A:
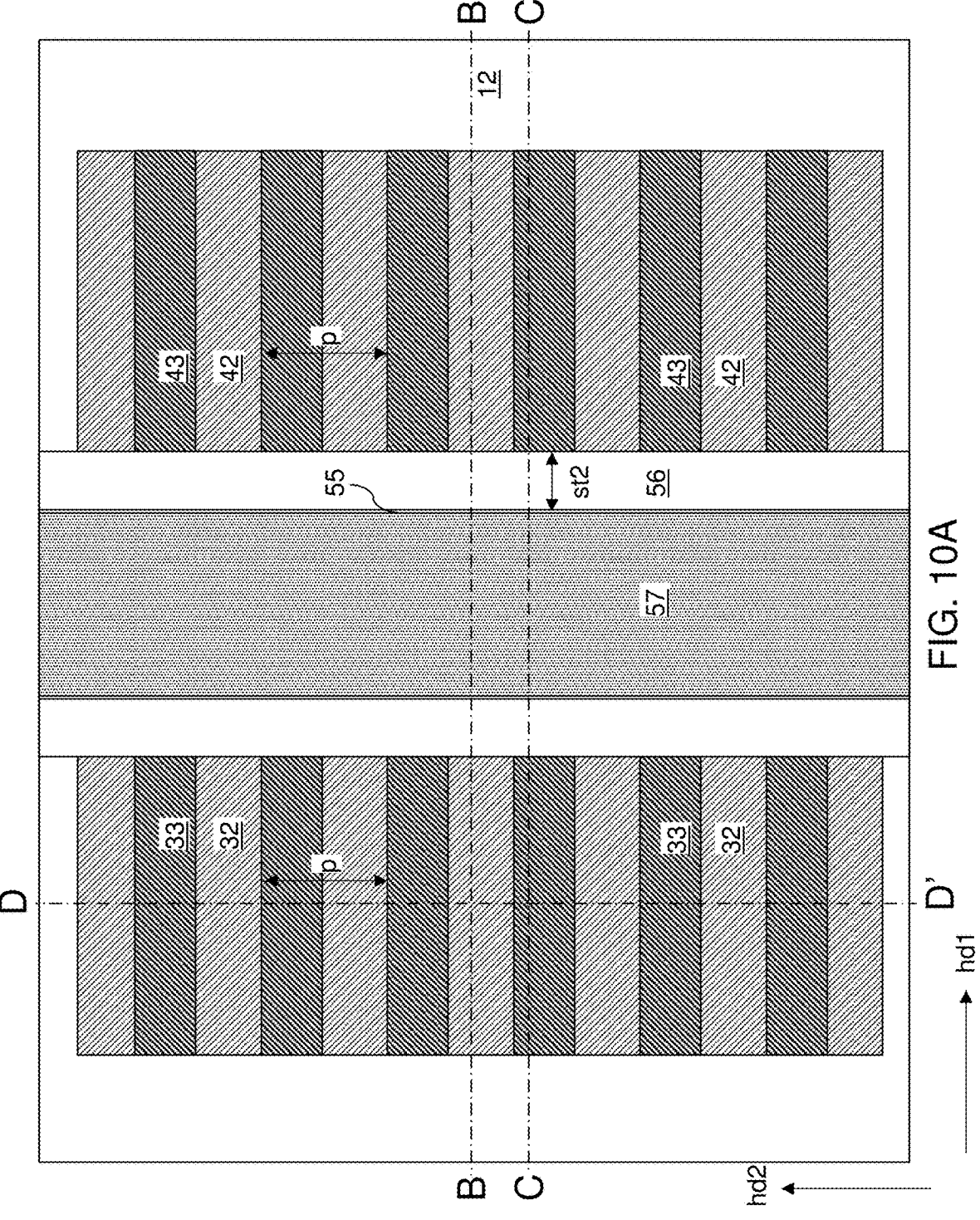
FIGS. 10A-10D are various views of the second exemplary structure after formation of source-side counter-doped rails and drain-side counter-doped rails according to the second embodiment of the present disclosure.
Figures 10B, 10C:
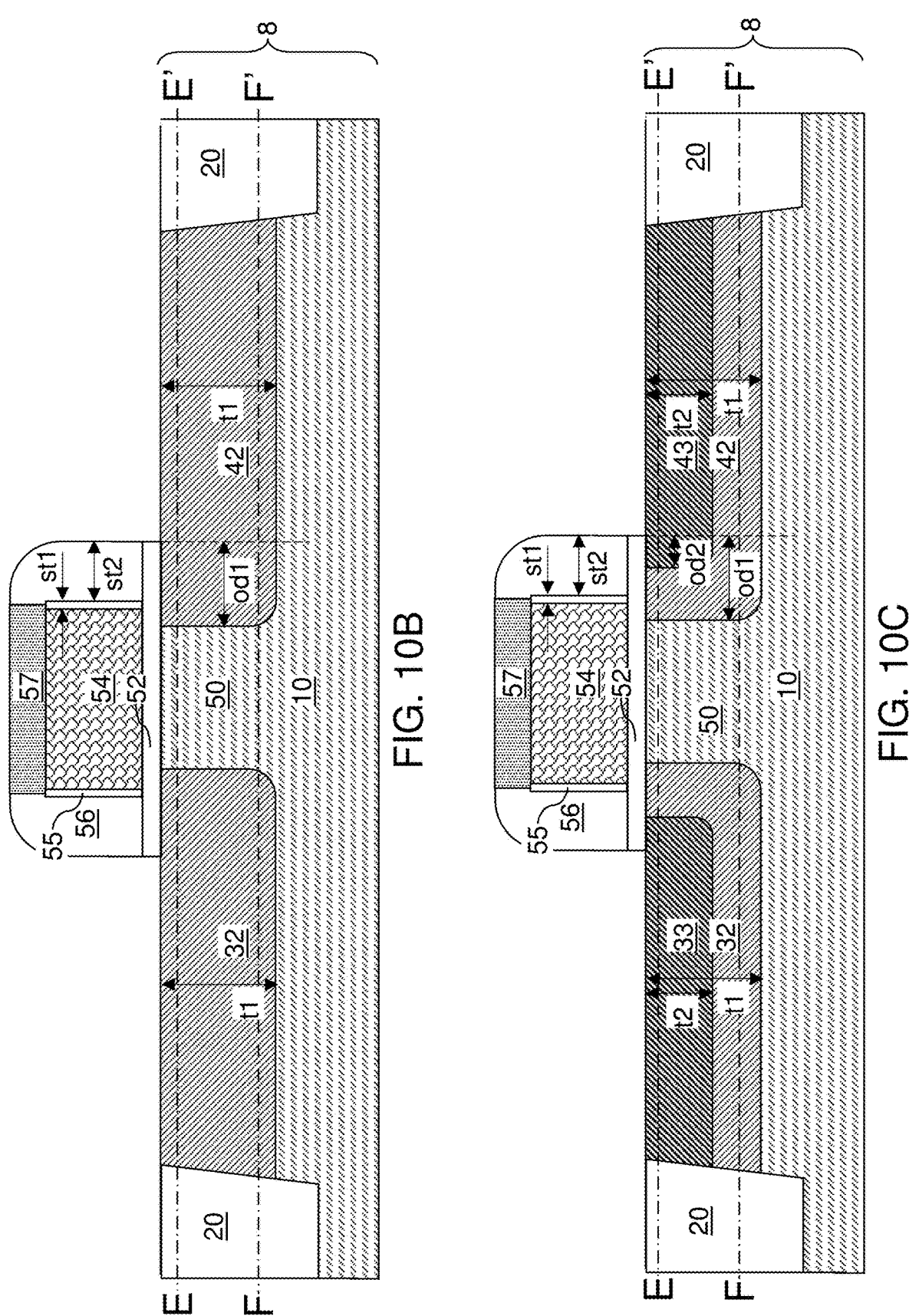
Figure 10D:
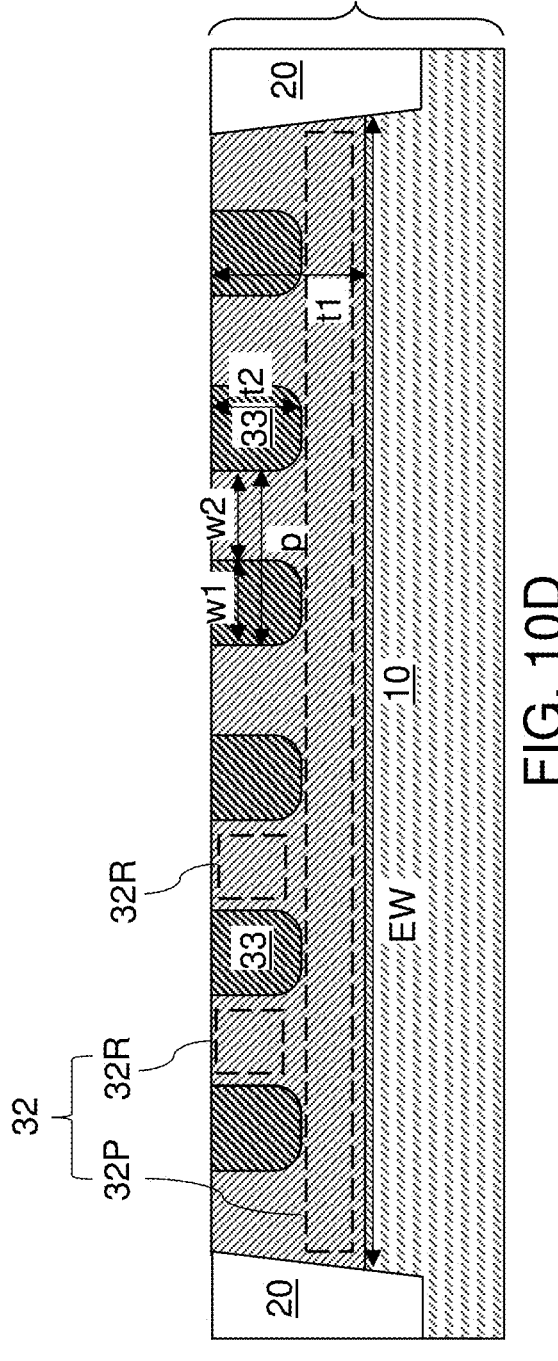
Figure 10E:
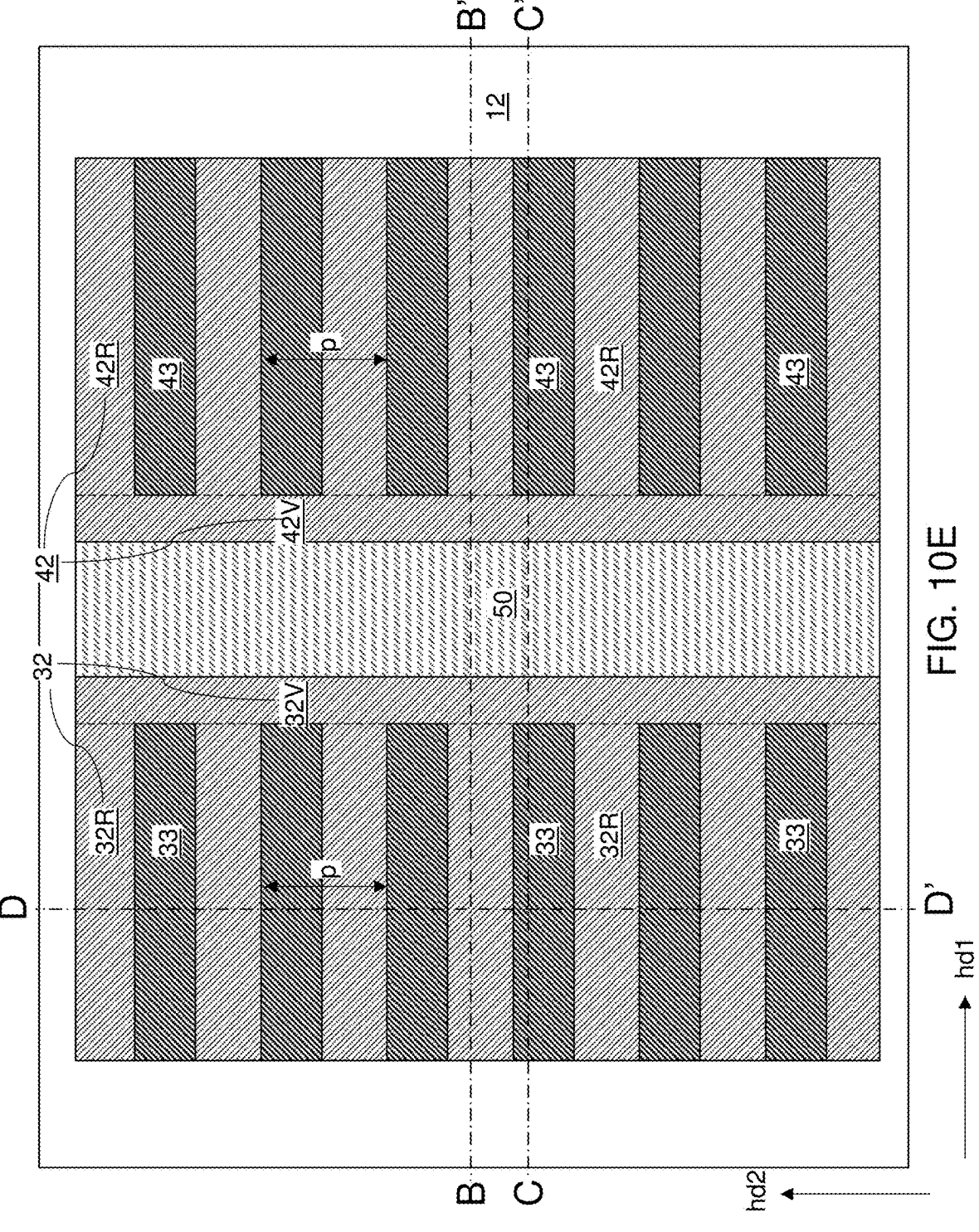
FIG. 10E is a horizontal cross-sectional view of the second exemplary structure along the horizontal plane E-E' of FIGS. 10B and 10C.
Figure 10F:
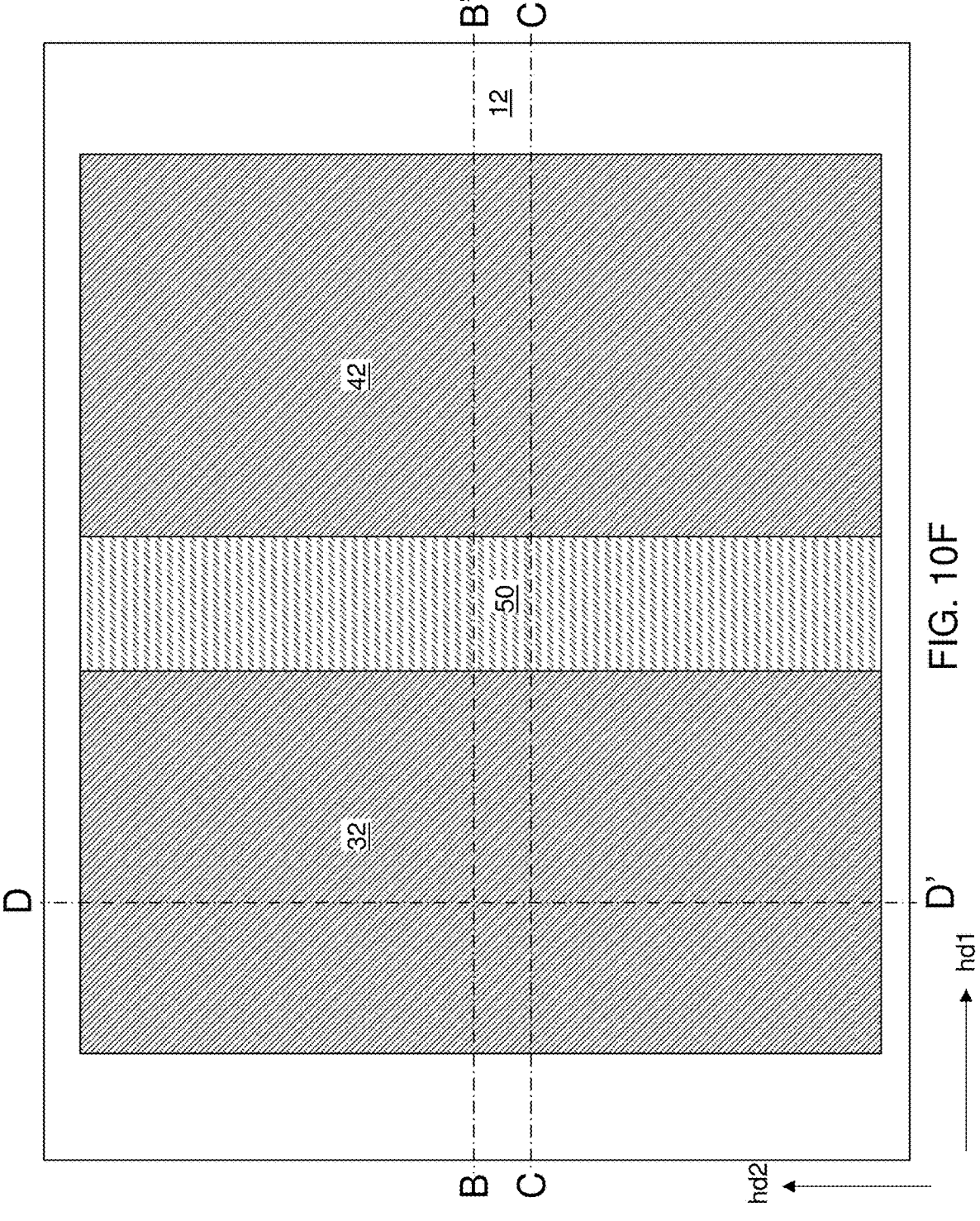
FIG. 10F is a horizontal cross-sectional view of the second exemplary structure along the horizontal plane F-F' of FIGS. 10B and 10C.
Figure 11A:
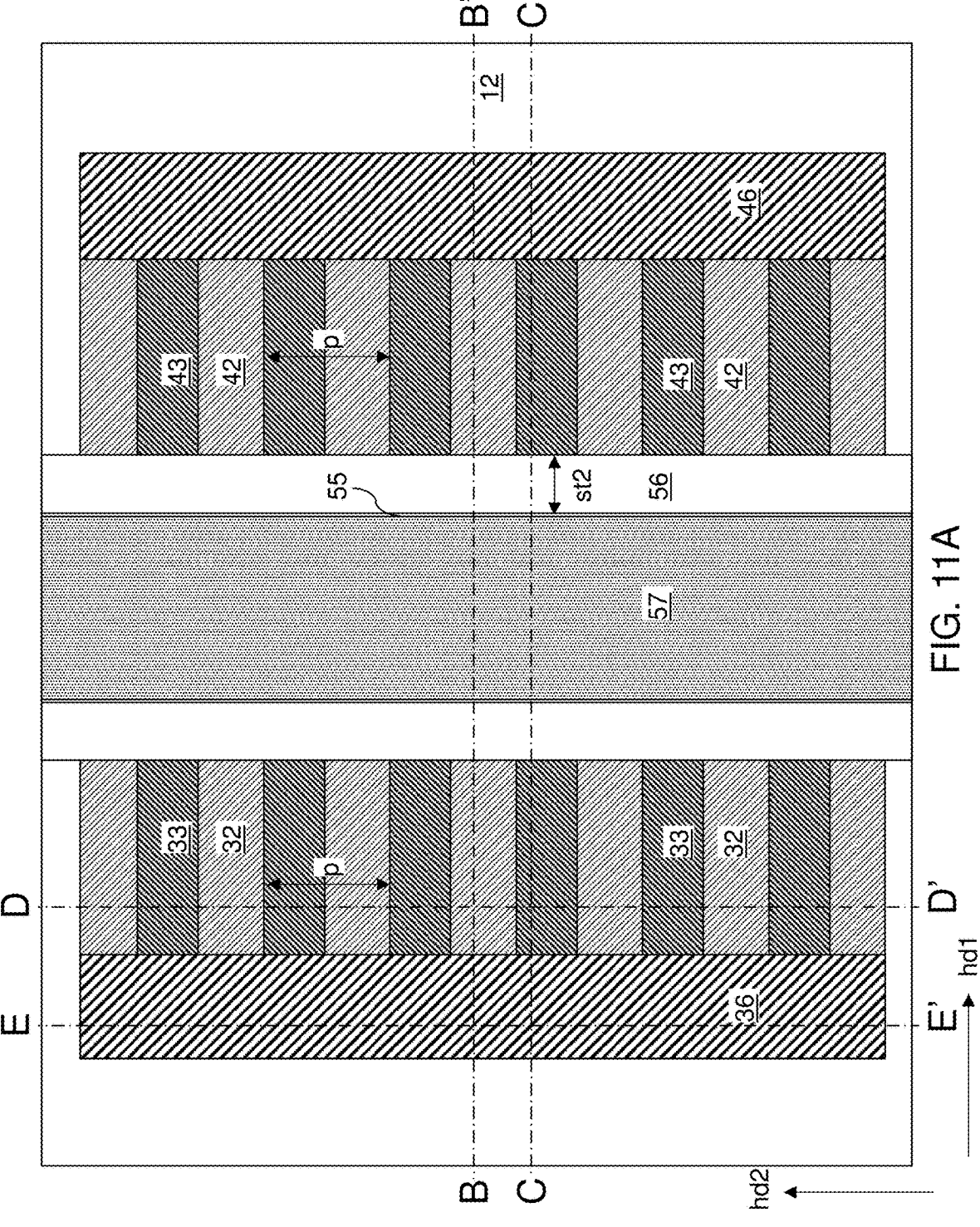
FIGS. 11A-11D are various views of the second exemplary structure after formation of a source region and a drain region according to the second embodiment of the present disclosure.
Figures 11B, 11C:
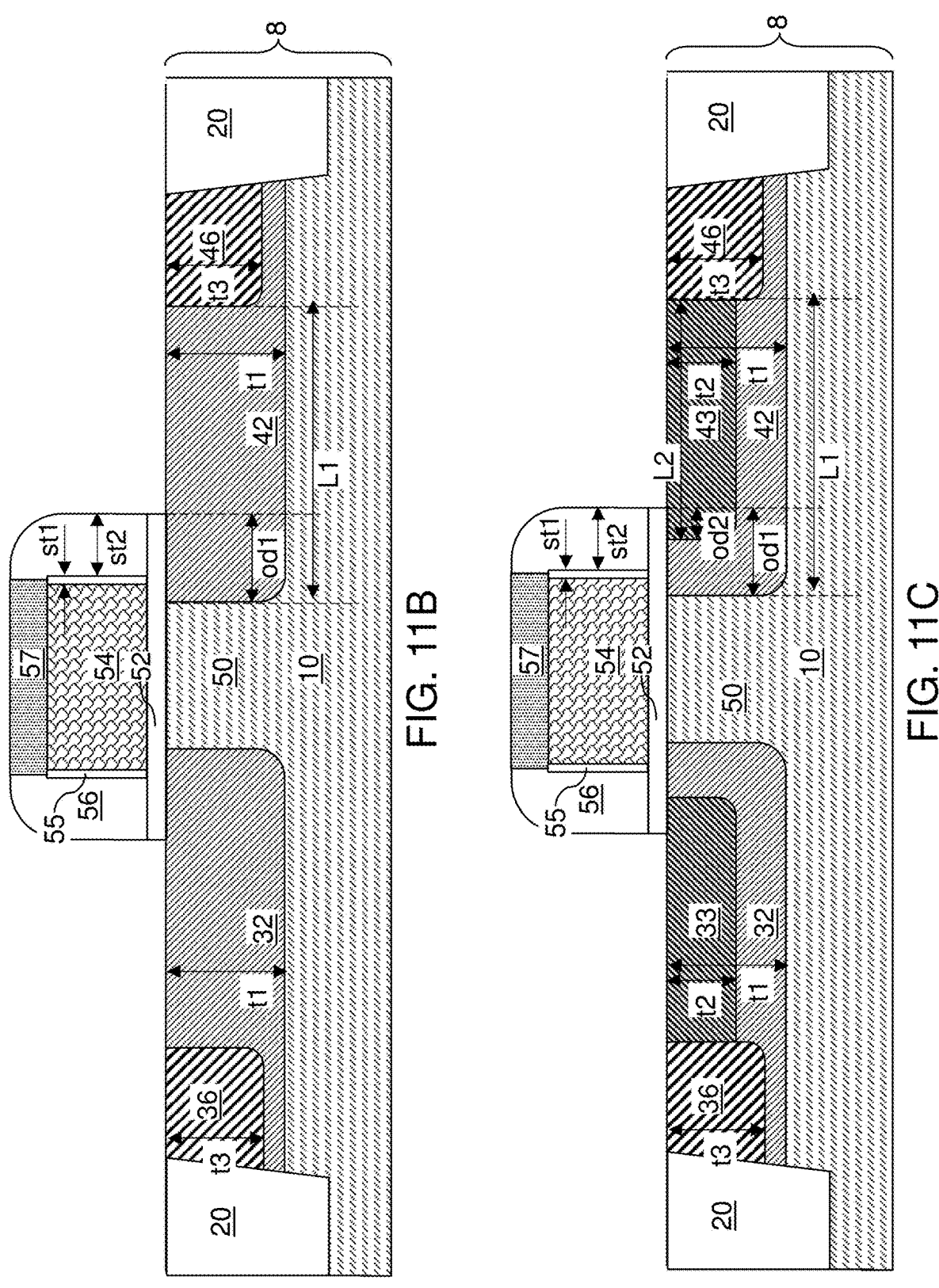
Figure 11D:
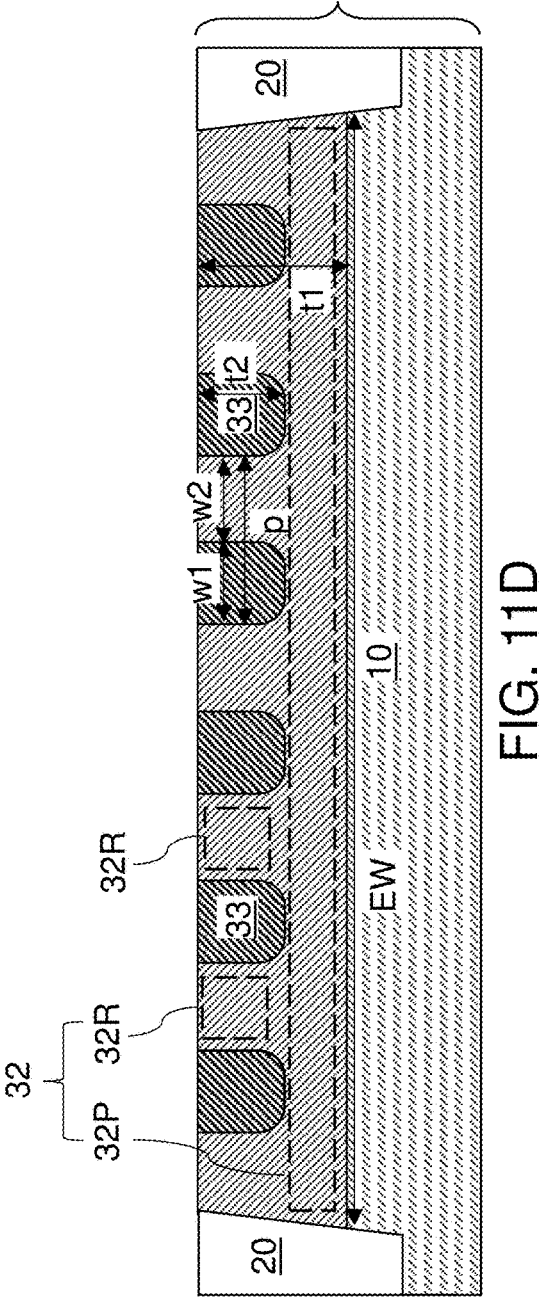
Figure 11E:
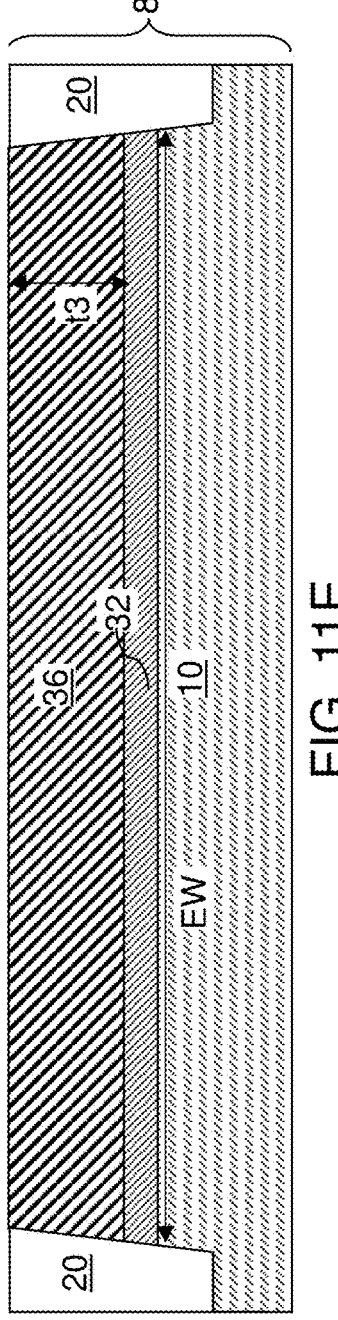
FIG. 11E is a vertical cross-sectional view of the second exemplary structure along the vertical plane E-E' of FIG. 11A.
Figure 12A:
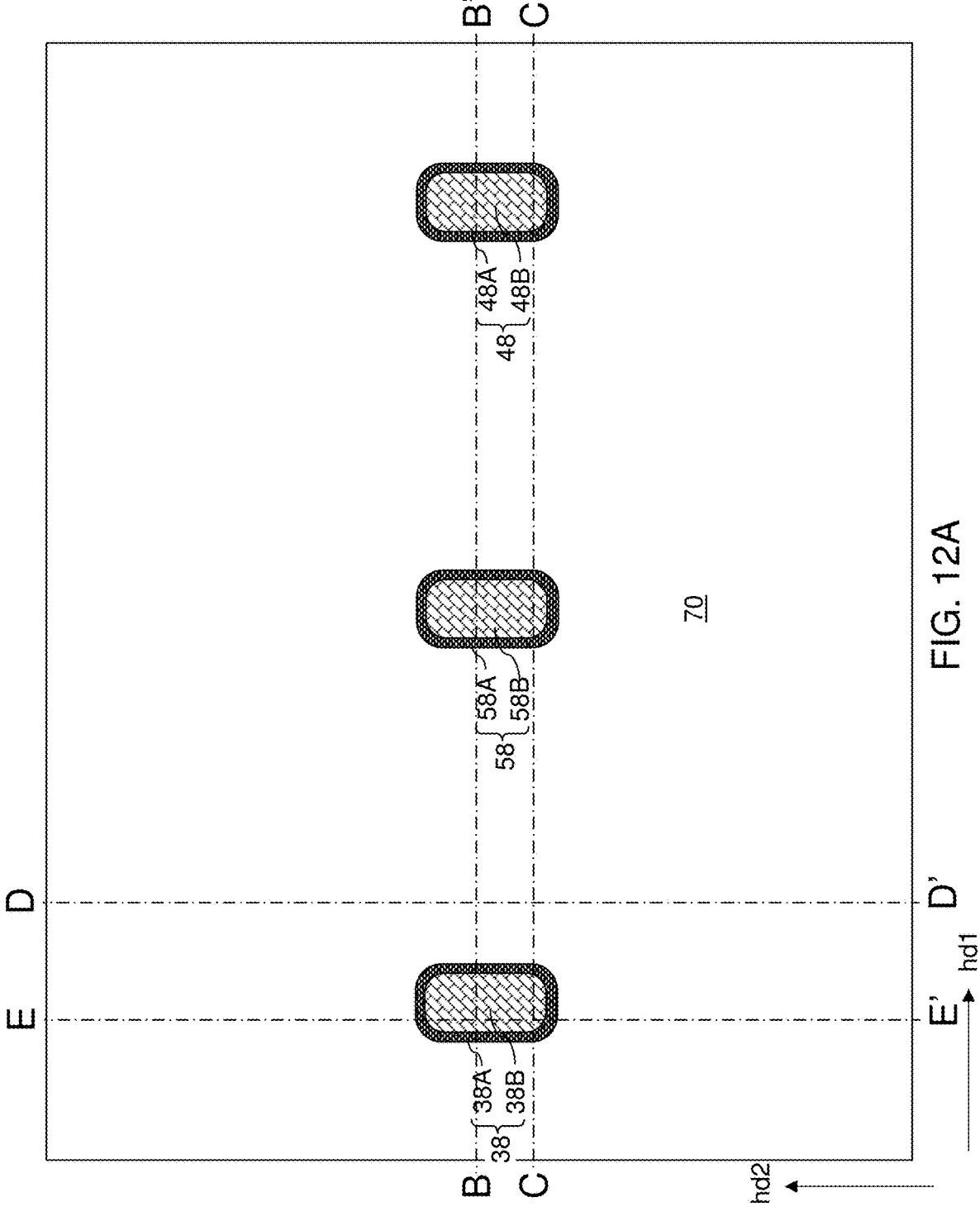
FIGS. 12A-12D are various views of the second exemplary structure after formation of a dielectric material layer and contact via structures according to the second embodiment of the present disclosure.
Figures 12B, 12C:
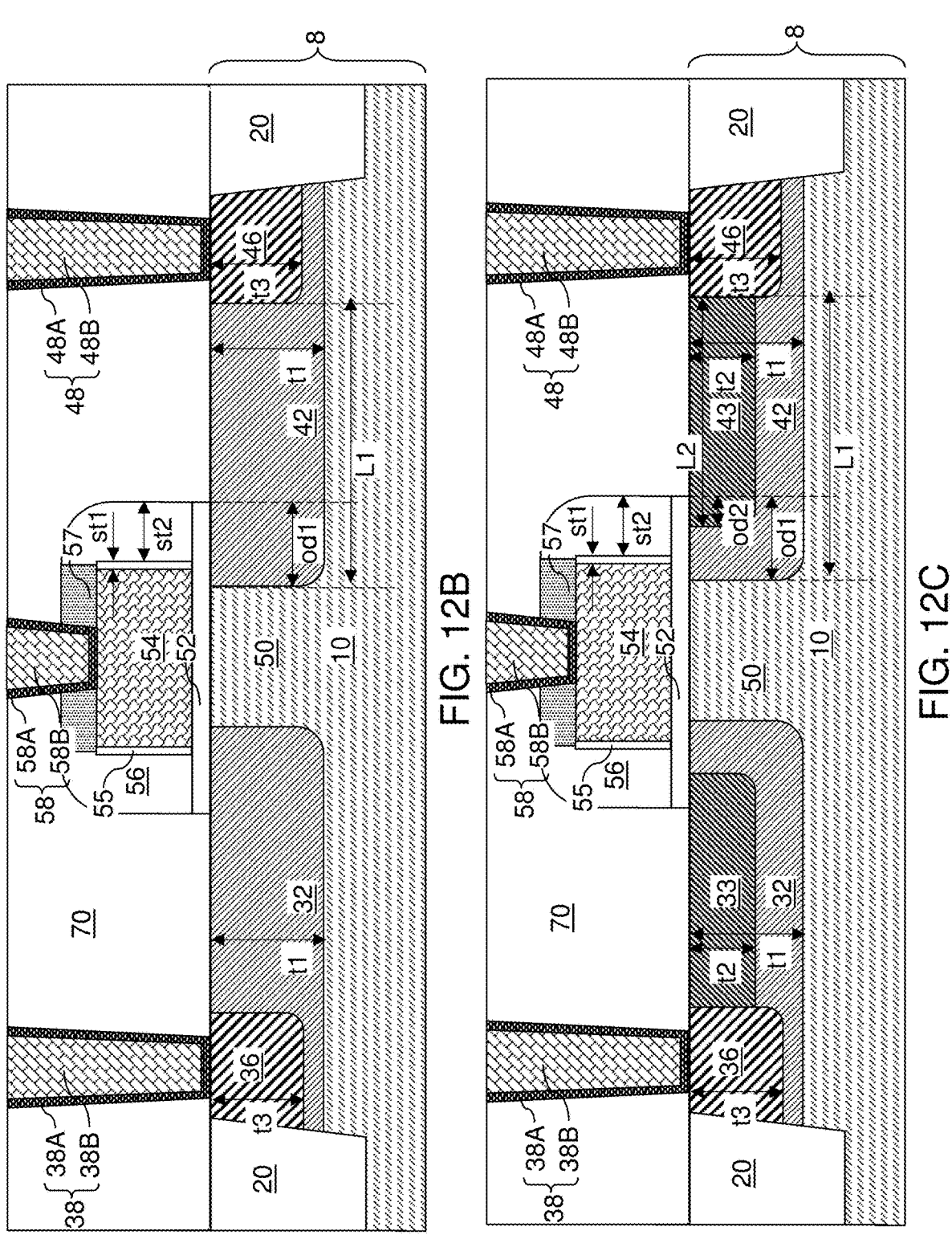
Figures 12D, 12E:
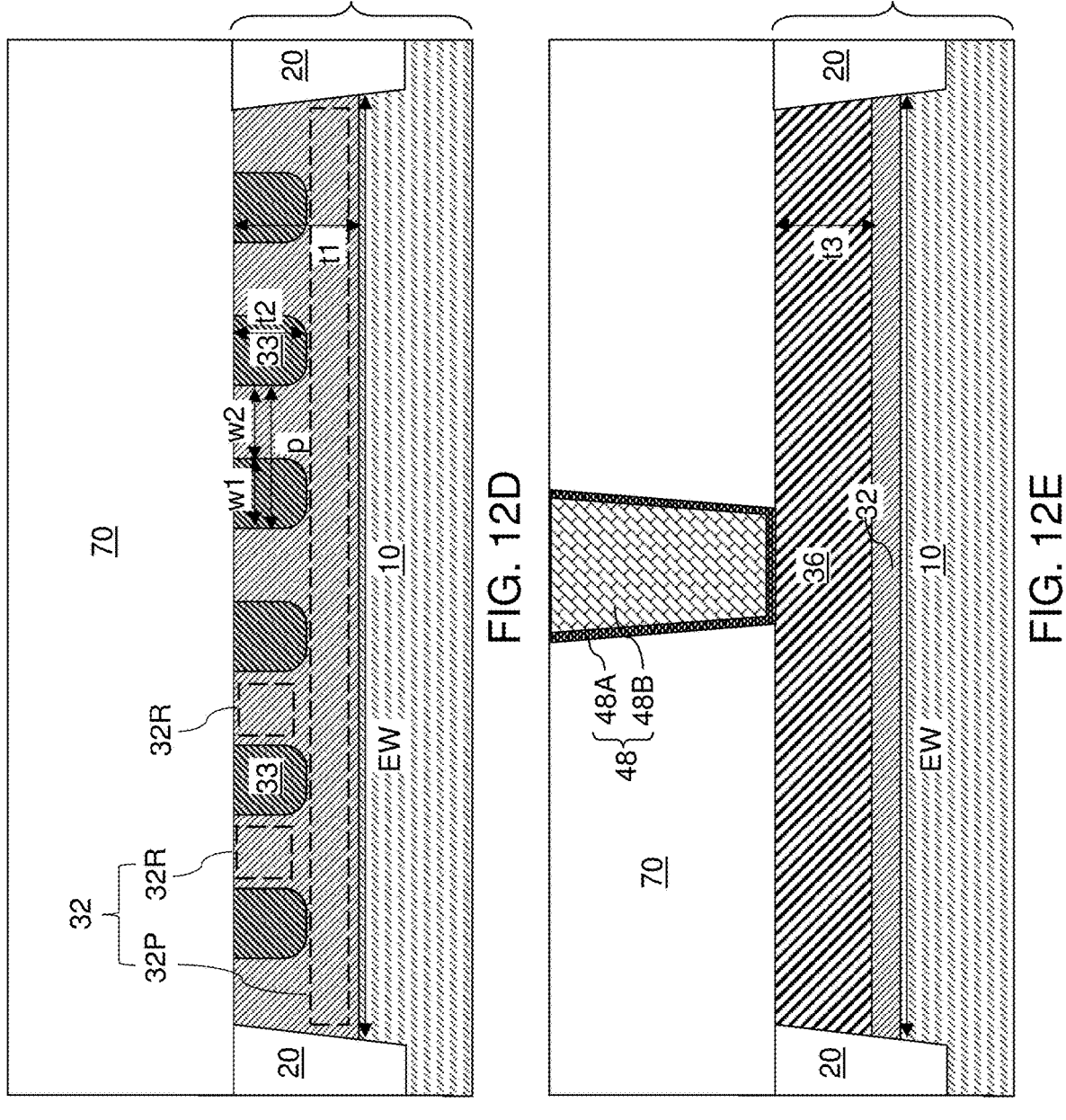
FIG. 12E is a vertical cross-sectional view of the second exemplary structure along the vertical plane E-E' of FIG. 12A.

Referring to FIGS. 9A-9C, the processing steps described with reference to FIGS. 5A-5D can be performed to form a dielectric gate spacer 56 and a gate dielectric 52. In other words, the second exemplary structure can be derived from the first exemplary structure illustrated in FIGS. 3A-3C by performing the processing steps described with reference to FIGS. 5A-5D prior to performing the processing steps described with reference to FIGS. 4A-4F.

The dielectric gate spacer 56 laterally surrounds the gate electrode 54. The proximal sidewall of the source-side extension region 32 can be laterally offset from an outer sidewall of the dielectric gate spacer 56 that overlies the source-side extension region 32 by a first offset distance od1 that is greater than the sum of the second spacer thickness st2 and the first spacer thickness st1. The proximal sidewall of the drain-side extension region 42 can be laterally offset from an outer sidewall of the dielectric gate spacer 56 that overlies the drain-side extension region 42 by the first offset distance od1.

Referring to FIGS. 10A-10F, the processing steps described with reference to FIGS. 4A-4F can be performed with any needed changes to form source-side counter-doped rails 33 and drain-side counter-doped rails 43. In the second exemplary structure, the second ion implantation process may be formed after formation of the dielectric gate spacer 56 and after patterning the gate dielectric layer 52L into the gate dielectric 52.

Generally, the source-side counter-doped rails 33 are formed by implantation of dopants of the first conductivity type into surface portions of the source-side extension region 32, and the drain-side counter-doped rails 43 are formed by implantation of additional dopants of the first conductivity type into surface portions of the drain-side extension region 42. The photoresist layer can be subsequently removed.

In one embodiment, each of the source-side counter-doped rails 33 and the drain-side counter-doped rails 43 has an areal overlap with a respective portion of the gate electrode 54 in a plan view. Such an overlap may increase the effect of the first superjunction (32, 33) and the second superjunction (42, 43). In one embodiment, each of the source-side counter-doped rails 33 and the drain-side counter-doped rails 43 has an areal overlap with a respective portion of the dielectric gate spacer 56 in a plan view that is perpendicular to an interface between the semiconductor channel and the gate dielectric 52.

Referring to FIGS. 11A-11E, the processing steps described with reference to FIGS. 6A-6E can be performed to form a source region 36 and a drain region 46. Generally, the source region 36 and the drain region 46 have a doping of the second conductivity type, and are formed in the substrate 8 such that the source region 36 contacts the first superjunction structure (32, 33) and the drain region 46 contacts the second superjunction structure (42, 43). The source region 36 and the drain region 46 are laterally spaced from the gate structure (52, 54) and from each other along the first horizontal direction hd1. In one embodiment, the source region 36 and the drain region 46 do not have any areal overlap with the dielectric gate spacer 56.

Referring to FIGS. 12A-12E, the processing steps described with reference to FIGS. 7A-7E can be performed to form a contact-level dielectric layer 70 and various contact via structures (38, 48, 58).

Figure 13A:
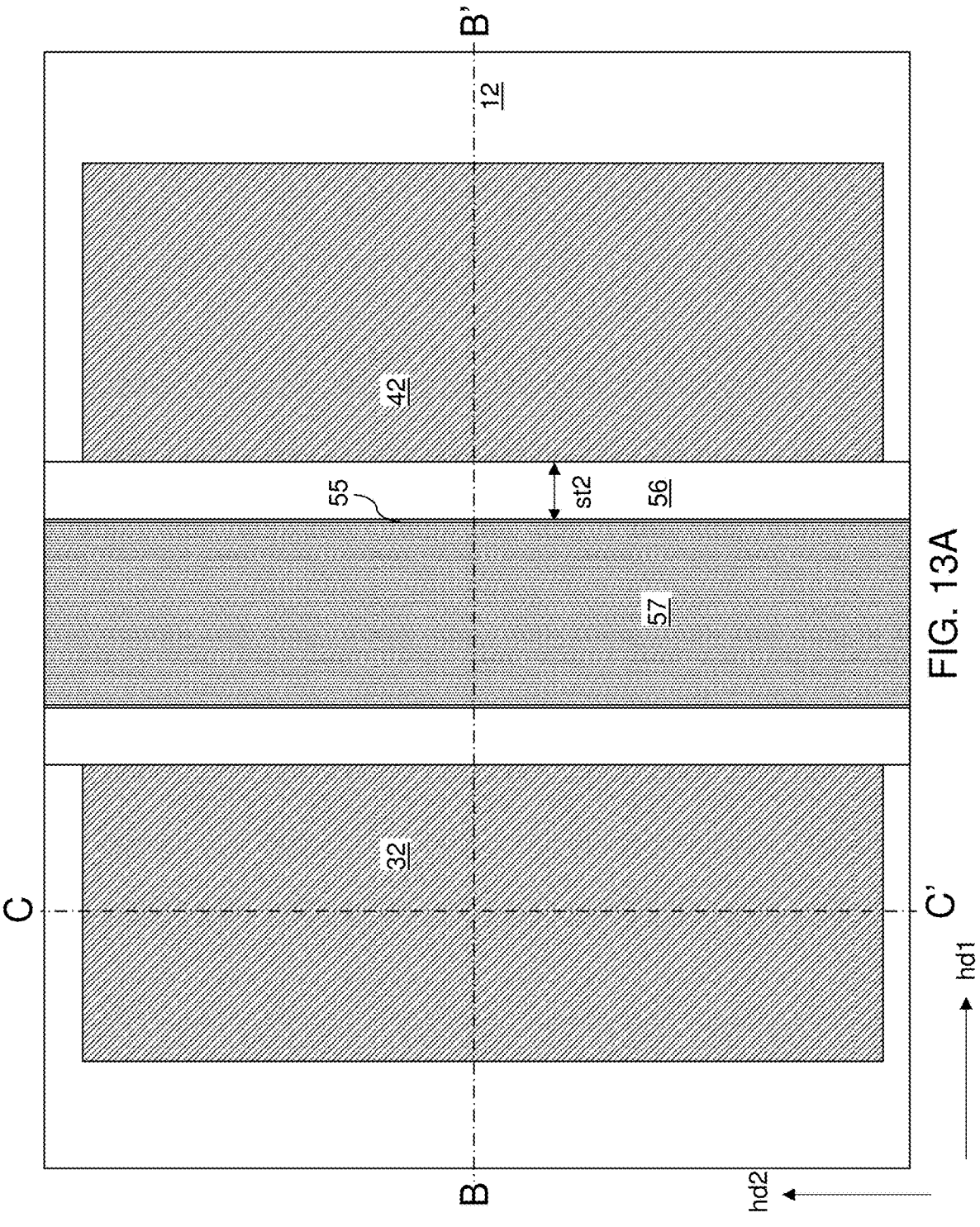
FIGS. 13A-13C are various views of a third exemplary structure after formation of a source-side extension region and a drain-side extension region according to the third embodiment of the present disclosure.
Figure 13B:
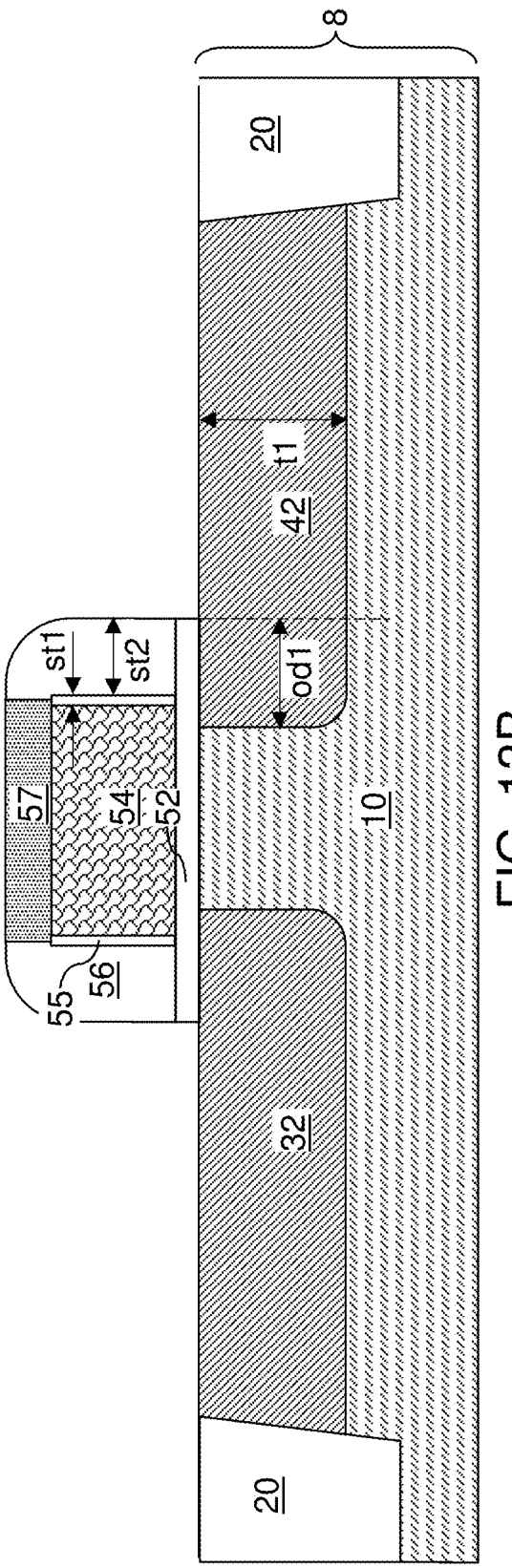
Figure 13C:
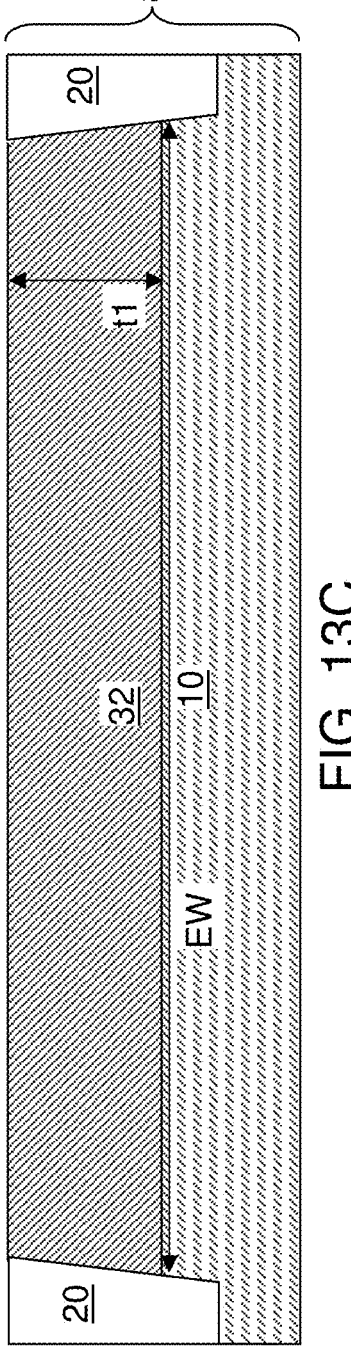
Figure 14A:
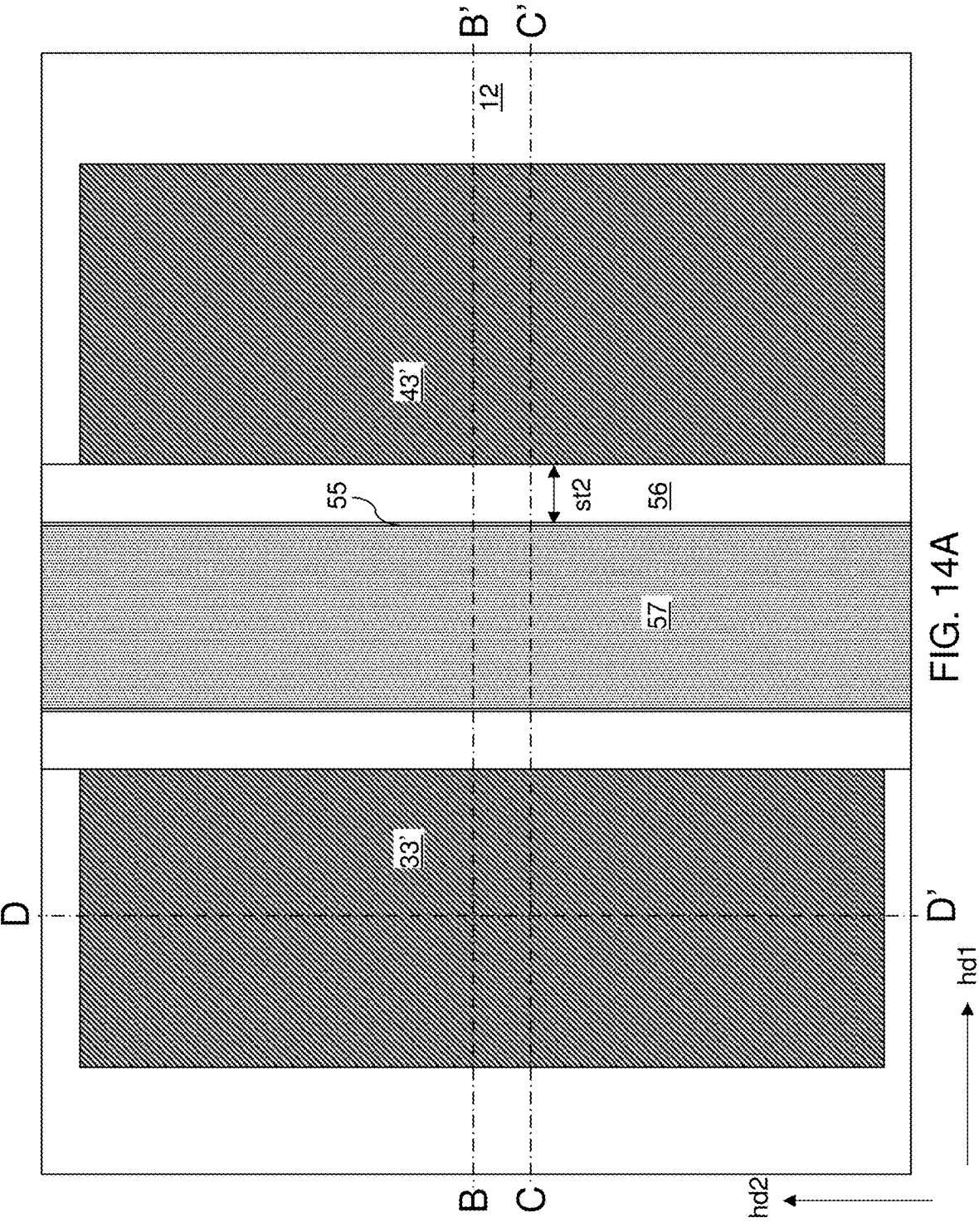
FIGS. 14A-14D are various views of the third exemplary structure after formation of a source-side counter-doped plate and a drain-side counter-doped plate according to the third embodiment of the present disclosure.
Figures 14B, 14C:
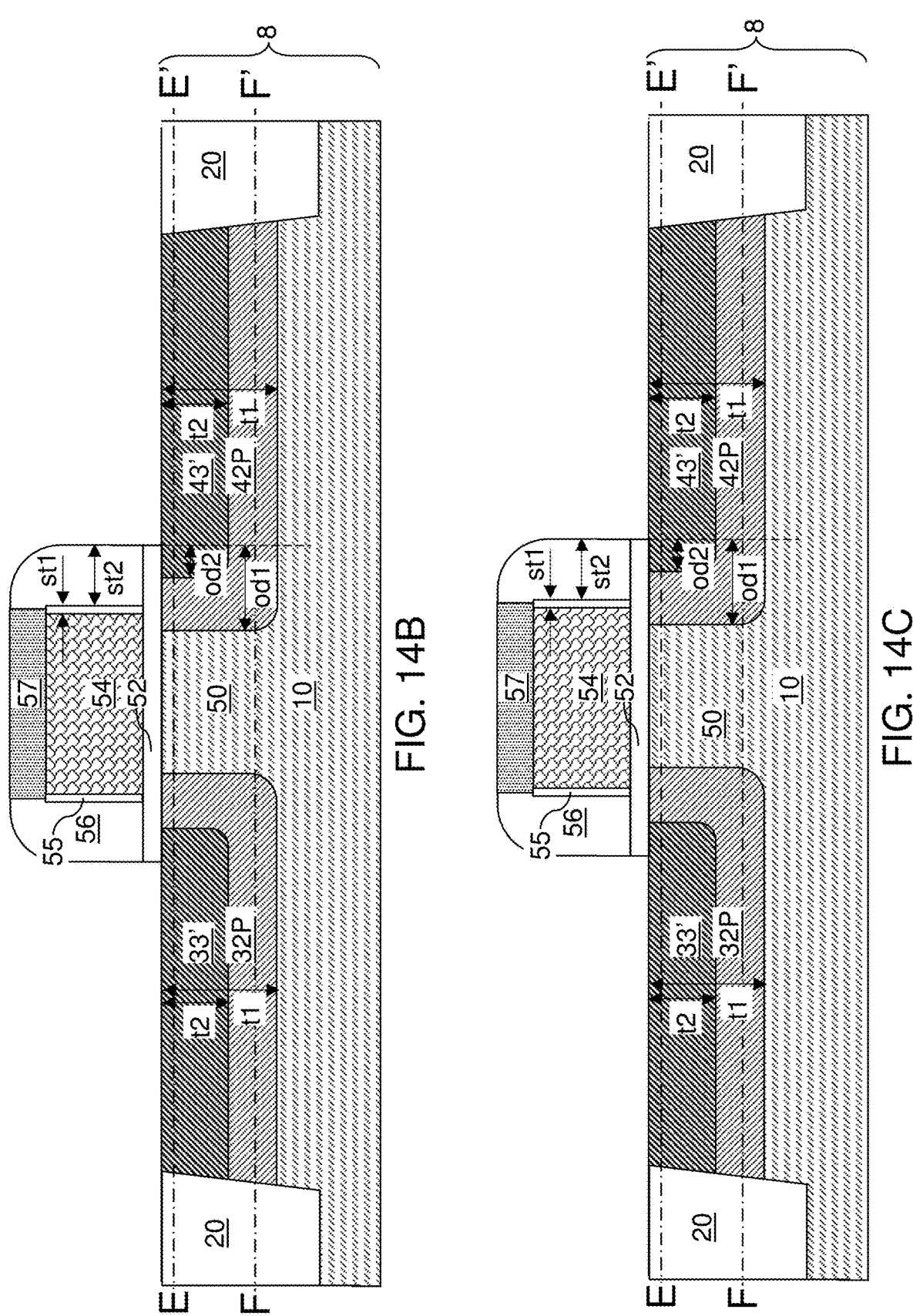
Figure 14D:
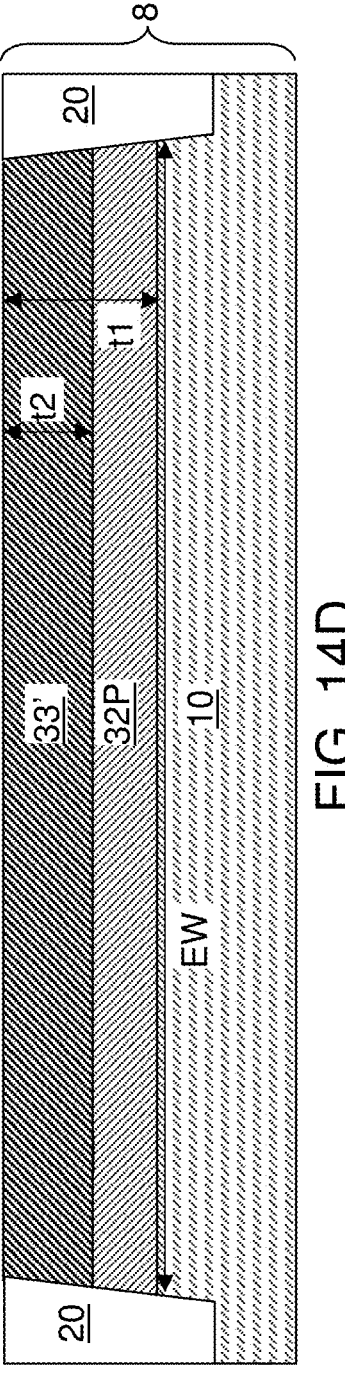
Figure 14E:
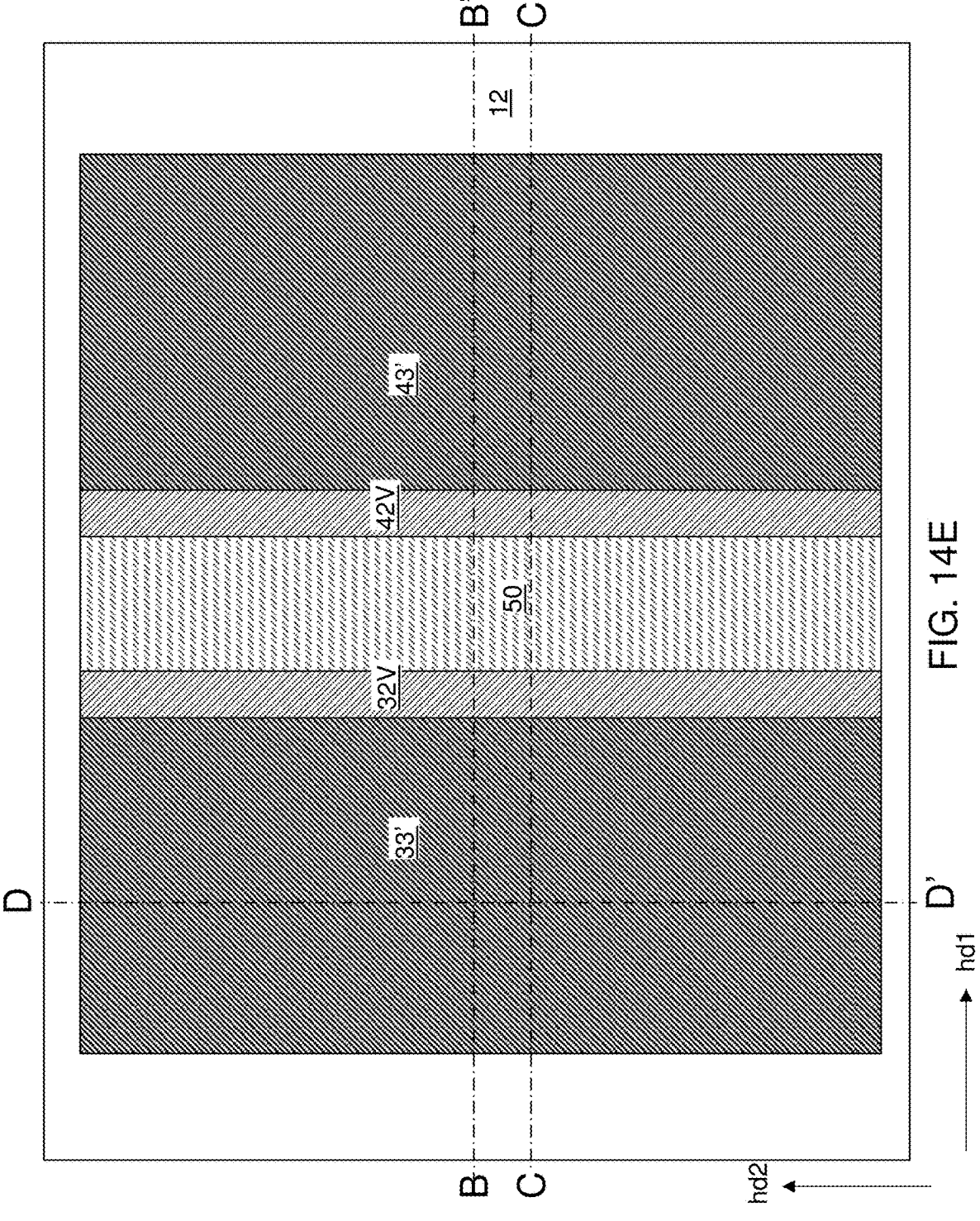
FIG. 14E is a horizontal cross-sectional view of the third exemplary structure along the horizontal plane E-E' of FIGS. 14B and 14C.
Figure 14F:
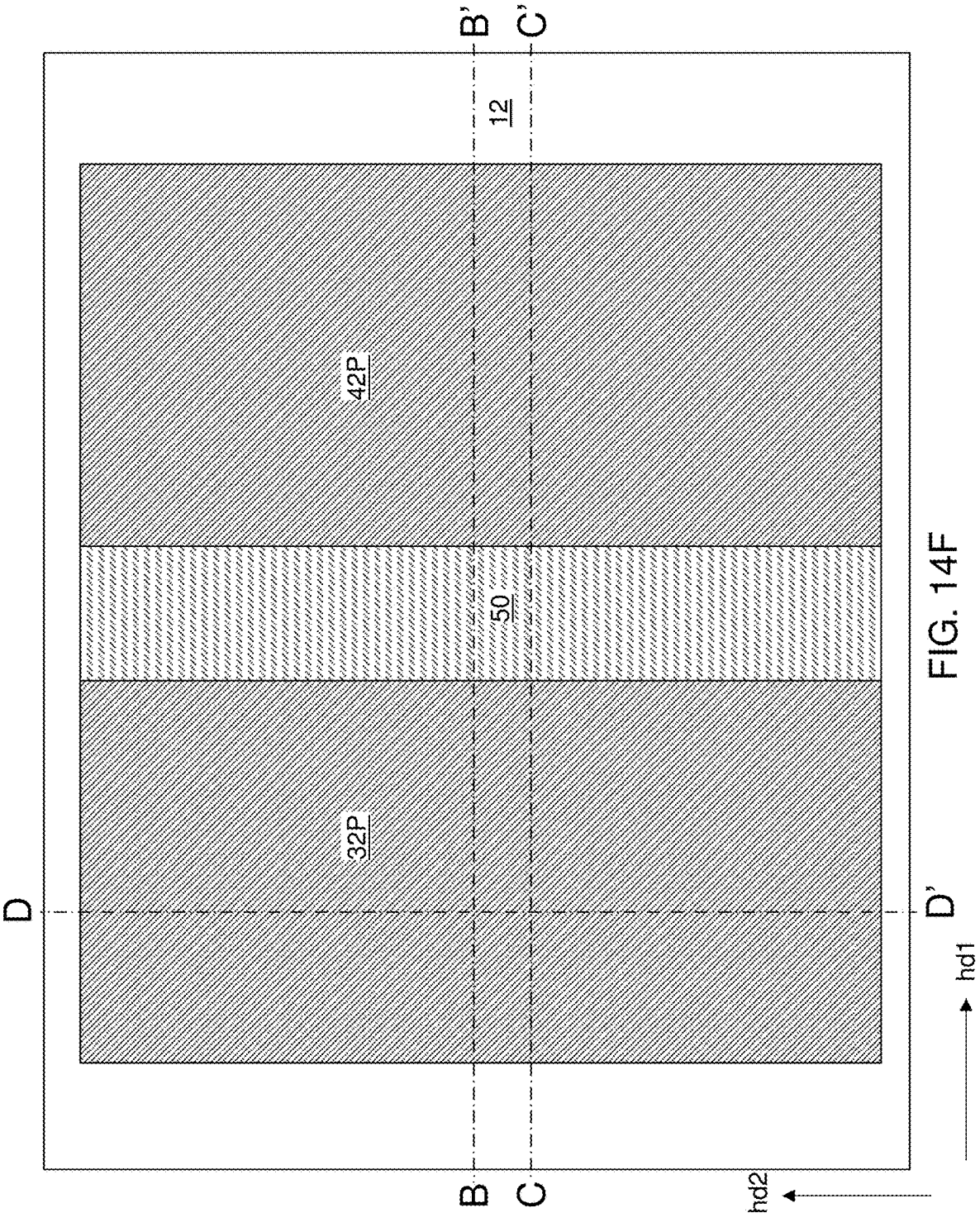
FIG. 14F is a horizontal cross-sectional view of the third exemplary structure along the horizontal plane F-F' of FIGS. 14B and 14C.
Figure 15A:
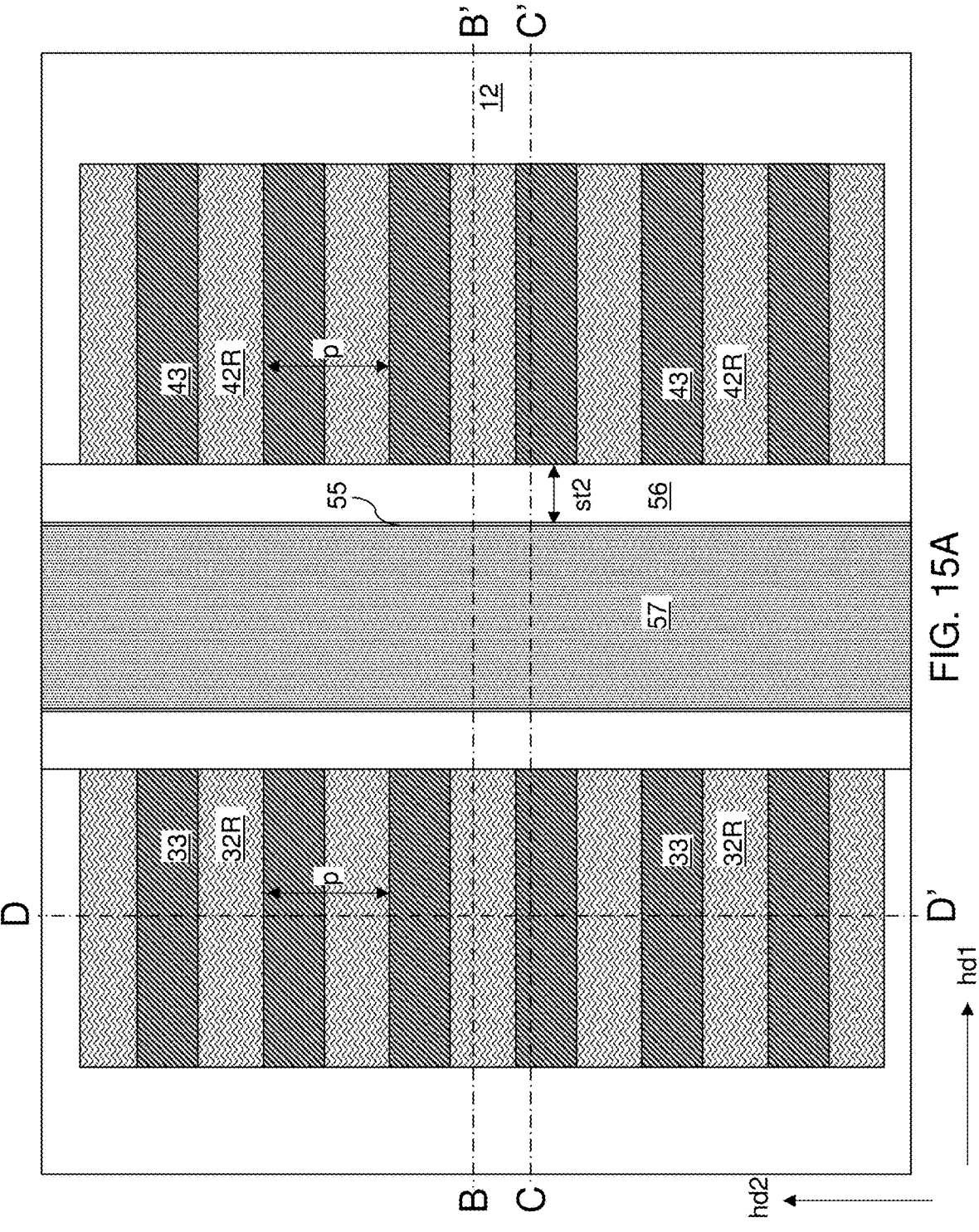
FIGS. 15A-15D are various views of the third exemplary structure after an ion implantation process that converts portions of the source-side counter-doped plate and the drain-side counter-doped plate into portions of the source-side extension region and the drain-side extension region according to the third embodiment of the present disclosure.
Figures 15B, 15C:
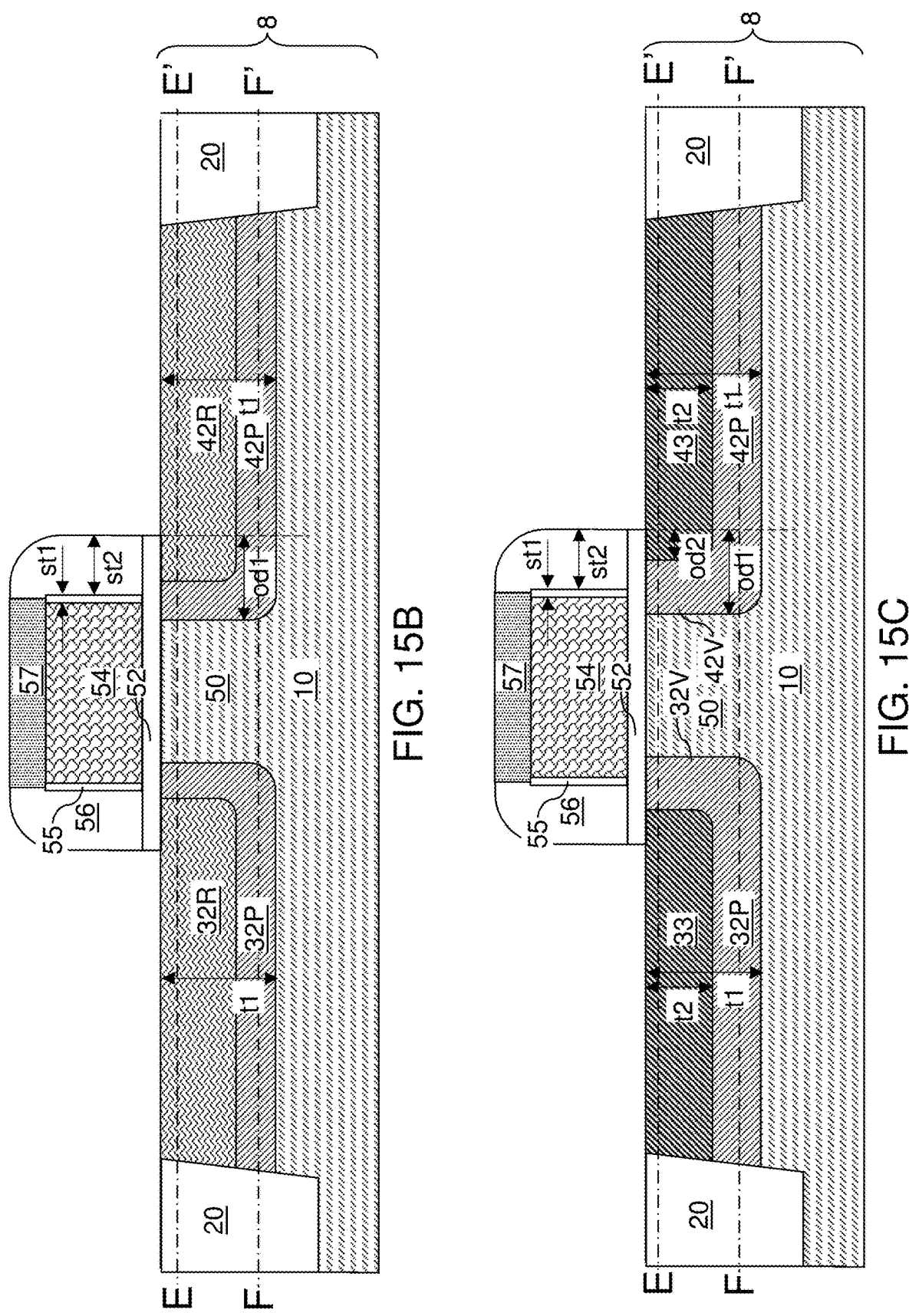
Figure 15D:
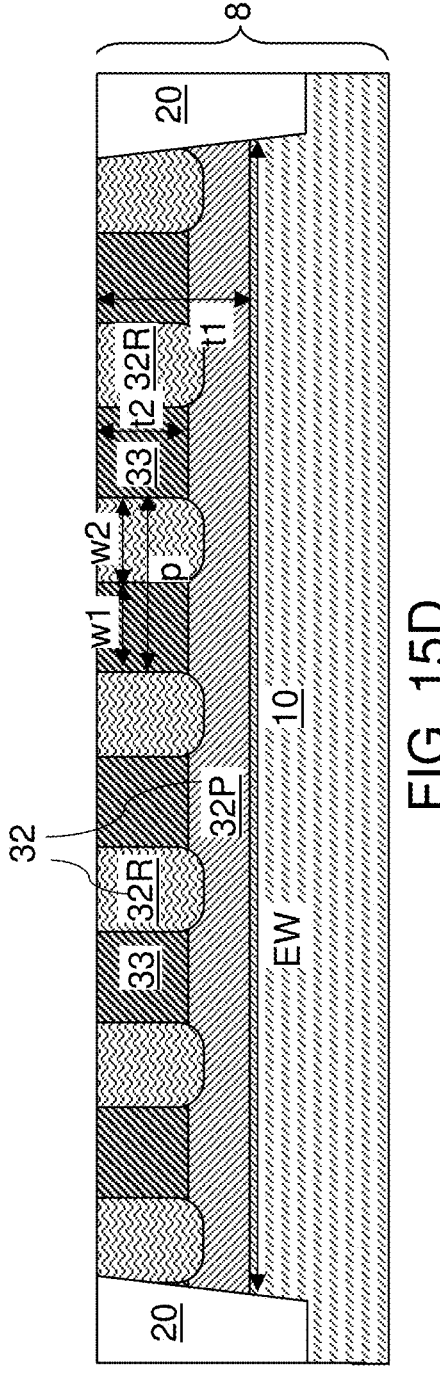
Figure 15E:
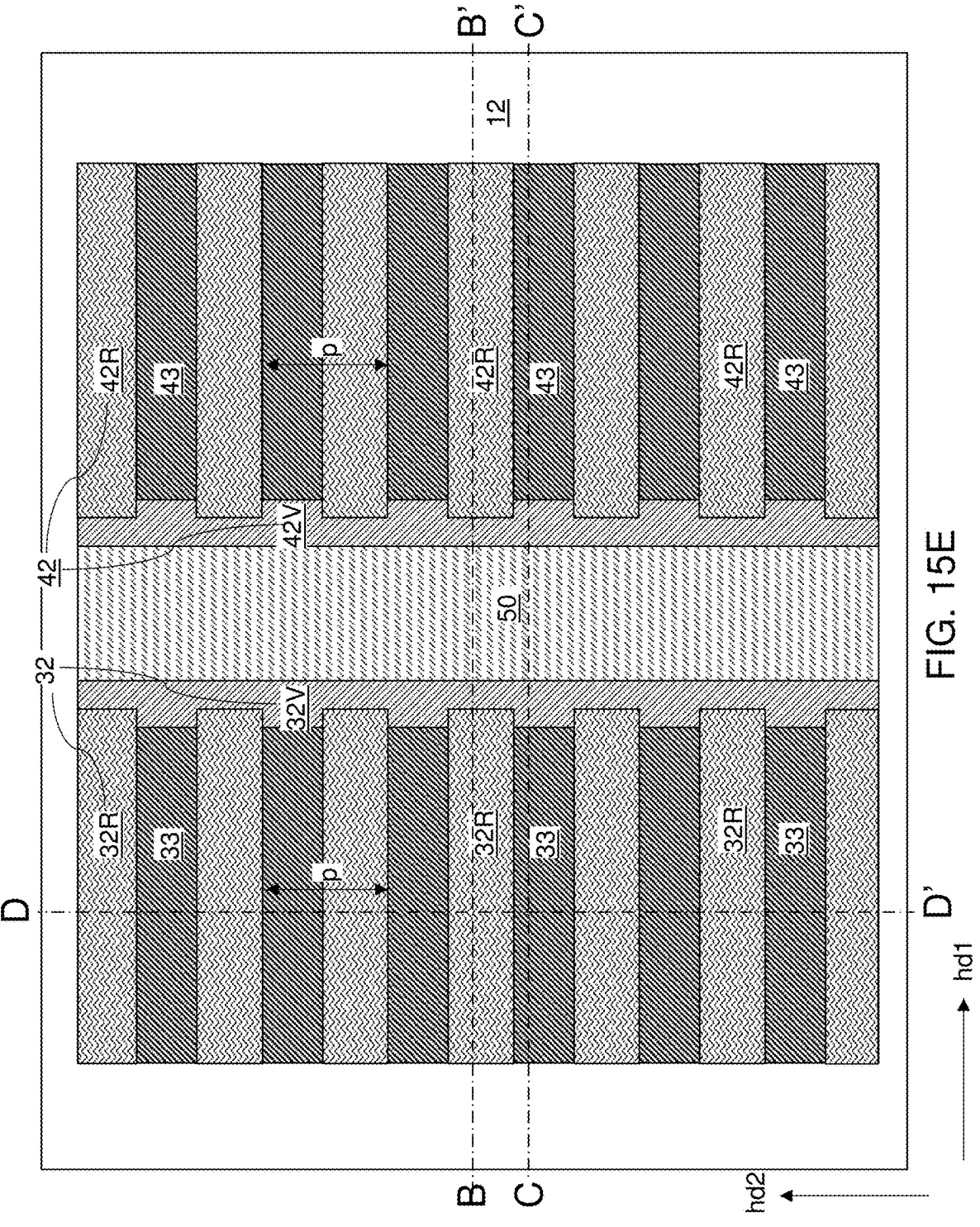
FIG. 15E is a horizontal cross-sectional view of the third exemplary structure along the horizontal plane E-E' of FIGS. 15B and 15C.
Figure 15F:
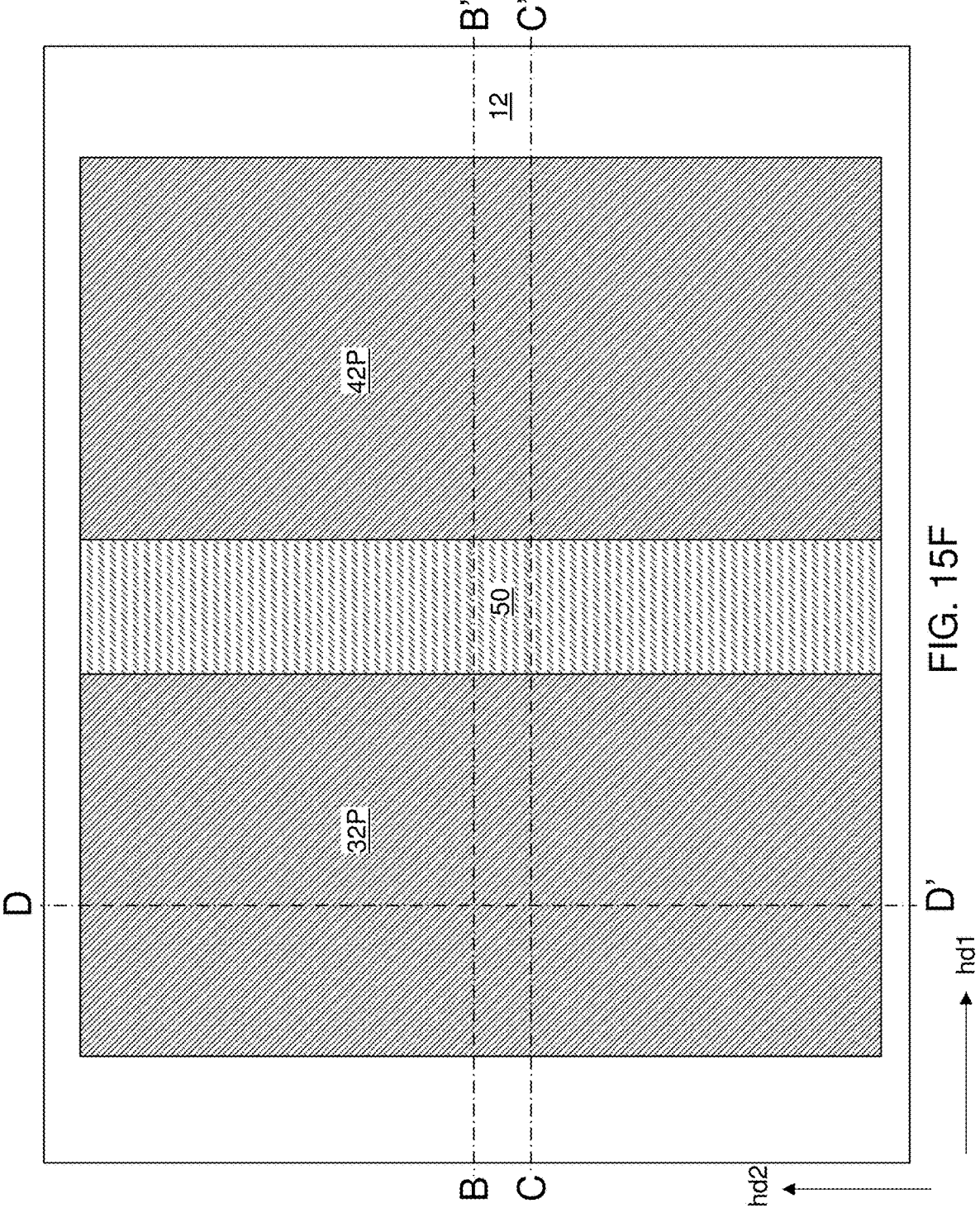
FIG. 15F is a horizontal cross-sectional view of the third exemplary structure along the horizontal plane F-F' of FIGS. 15B and 15C.
Figure 16A:
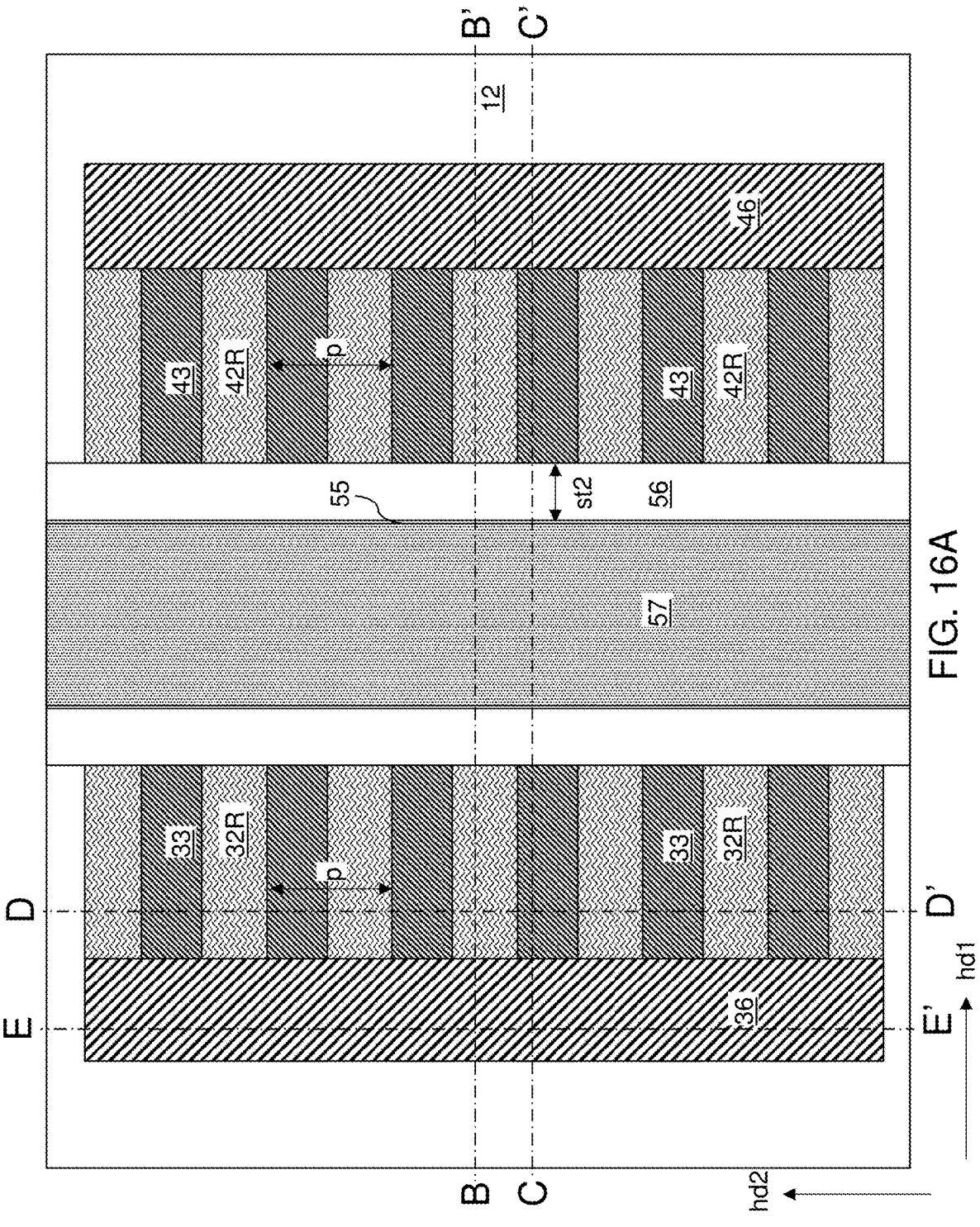
FIGS. 16A-16D are various views of the third exemplary structure after formation of a source region and a drain region according to the third embodiment of the present disclosure.
Figures 16B, 16C:
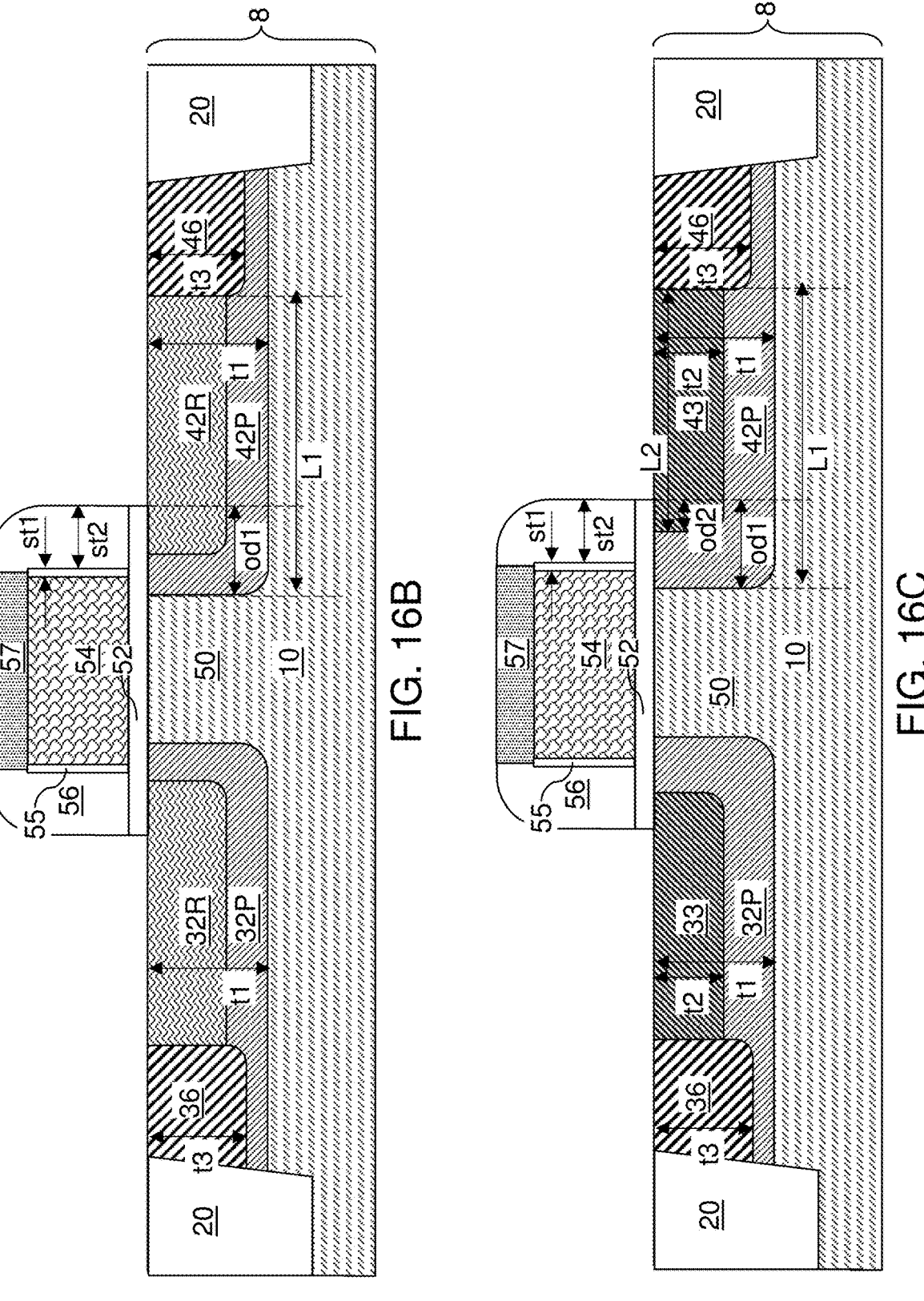
Figure 16D:
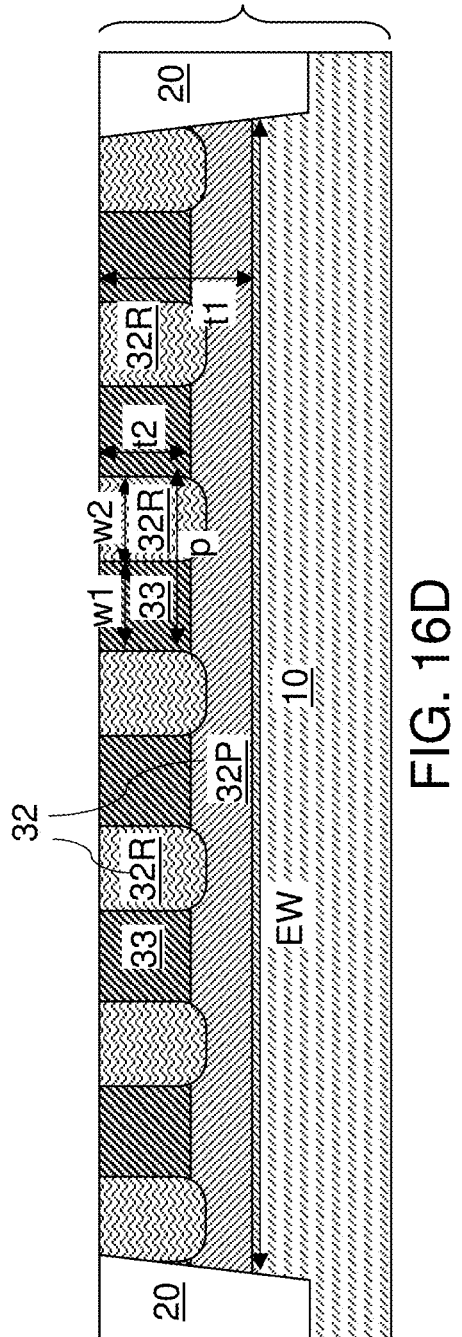
Figure 16E:
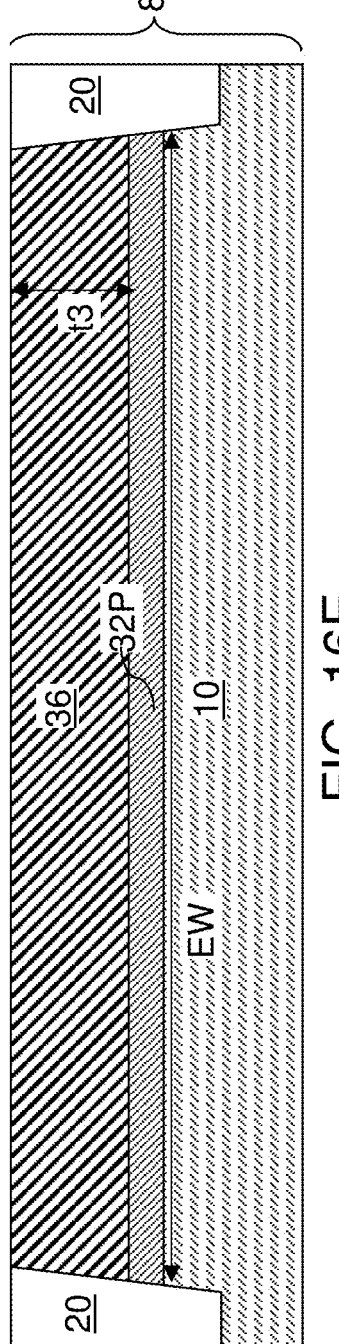
FIG. 16E is a vertical cross-sectional view of the third exemplary structure along the vertical plane E-E' of FIG. 16A.
Figure 17A:
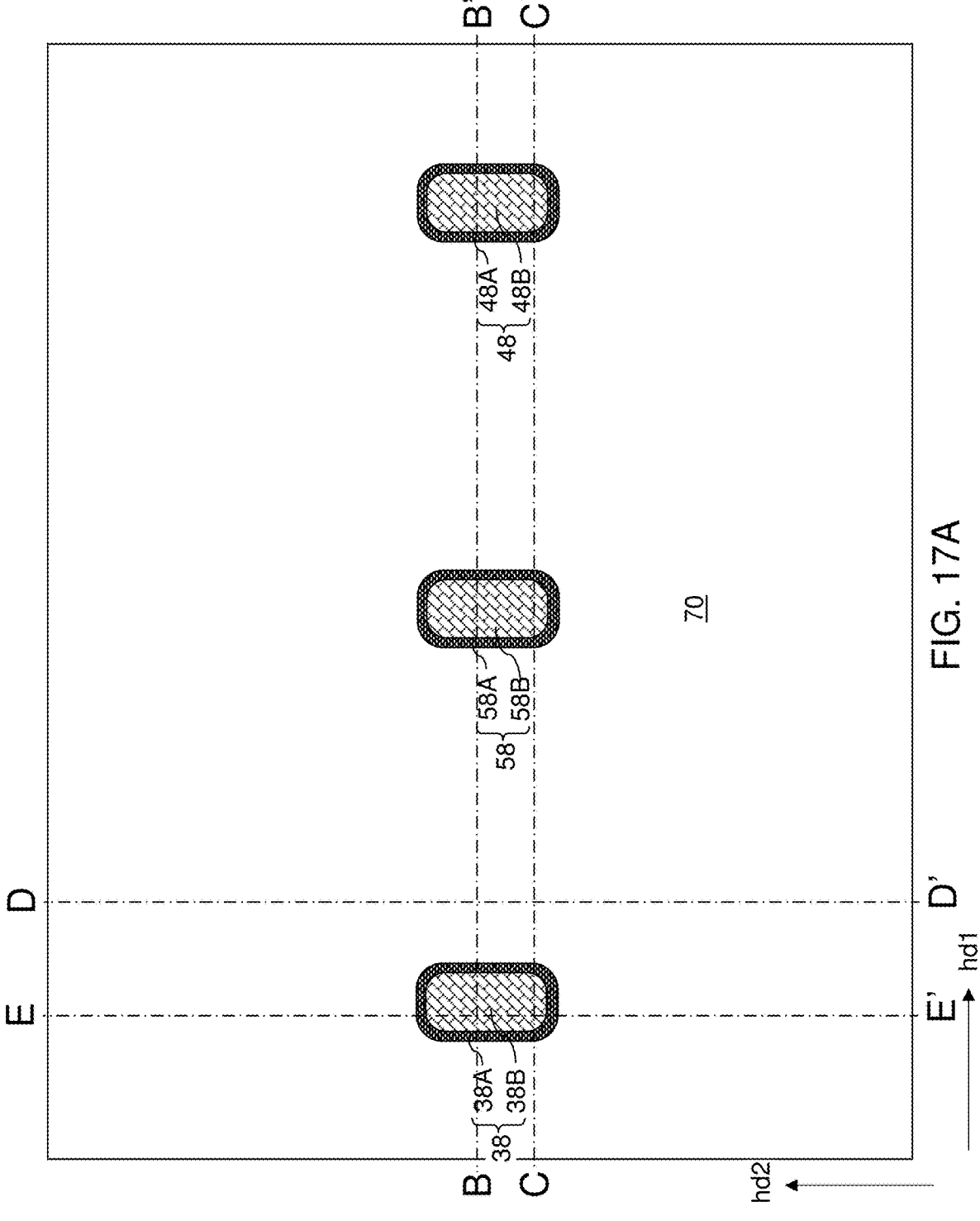
FIGS. 17A-17D are various views of the third exemplary structure after formation of a dielectric material layer and contact via structures according to the third embodiment of the present disclosure.
Figures 17B, 17C:
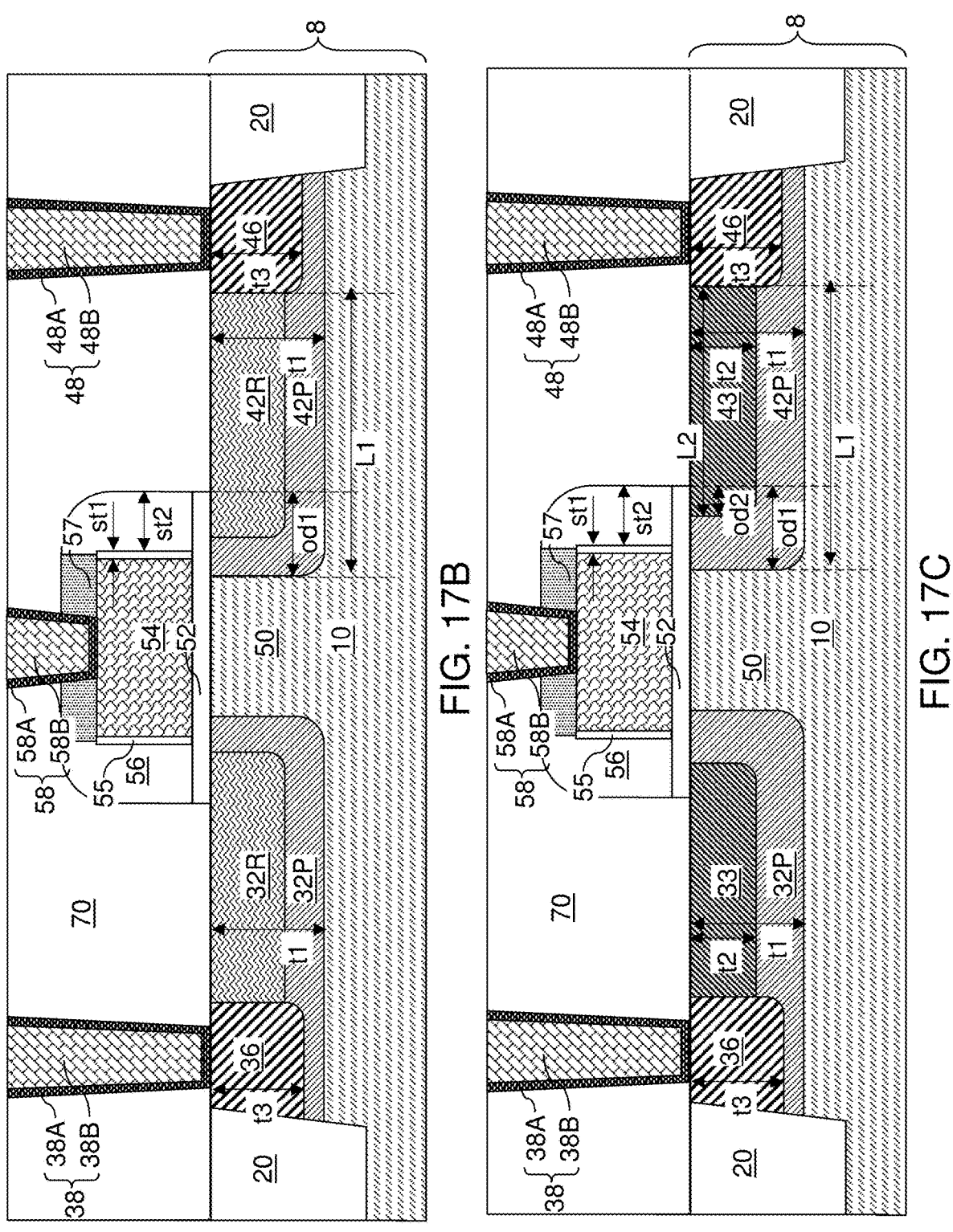
Figures 17D, 17E:
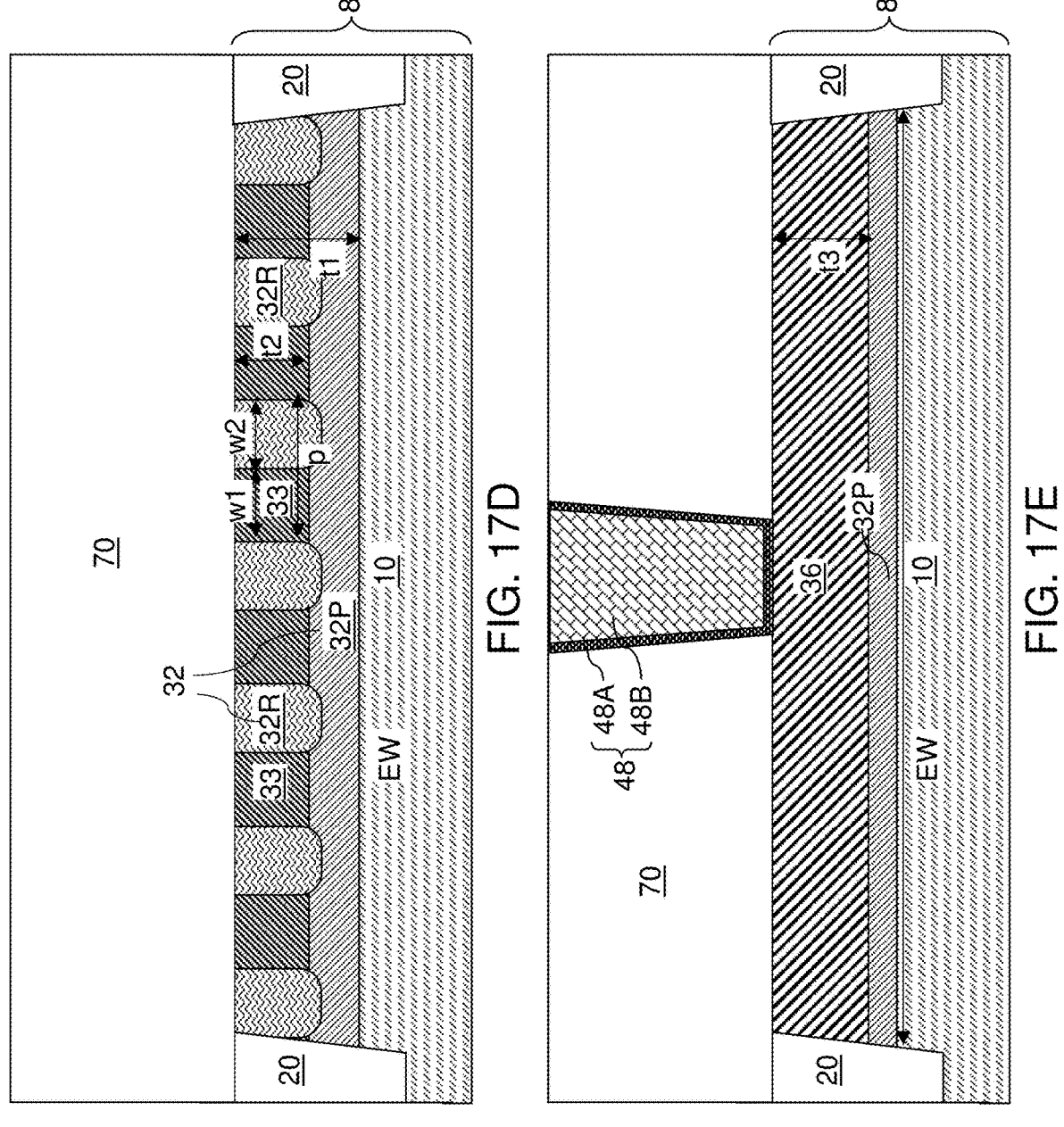
FIG. 17E is a vertical cross-sectional view of the third exemplary structure along the vertical plane E-E' of FIG. 17A.

Referring to FIGS. 13A-13C, a third exemplary structure according to an embodiment of the present disclosure may be the same as the second exemplary structure illustrated in FIGS. 9A-9C.

Referring to FIGS. 14A-14F, an ion implantation process can be performed employing at least the gate electrode 54 as an ion implantation mask. In one embodiment, the ion implantation process can be performed without employing a patterned photoresist layer. Specifically, dopants of the first conductivity type can be implanted into upper portions of the source-side extension region 32 and the drain-side extension region 42 employing a combination of the gate structure (54, 57) and the dielectric gate spacer 56 as an ion implantation mask.

A source-side counter-doped plate 33' and a drain-side counter-doped plate 43' are formed simultaneously by implanting electrical dopants of the first conductivity type. The source-side counter-doped plate 33' and the drain-side counter-doped plate 43' are formed within the implanted portions of the source-side extension region 32 and the drain-side extension region 42, and have a doping of the opposite conductivity type, i.e., a counter-doping, relative to the doping in the source-side extension region 32 and the drain-side extension region 42. A portion of the source-side extension region 32 located under the source-side counter-doped plate 33' is herein referred to as a source-side-extension plate portion 32P, and a portion of the drain-side extension region 42 located under the drain-side counter-doped plate 43' is herein referred to as a drain-side-extension plate portion 42P.

The source-side counter-doped plate 33' and the drain-side counter-doped plate 43' can include dopants of the first conductivity type at a third average atomic concentration, which may be in a range from $2.0 \times 10^{16}/\text{cm}^3$ to $2.0 \times 10^{18}/\text{cm}^3$, such as from $6.0 \times 10^{16}/\text{cm}^3$ to $6.0 \times 10^{17}/\text{cm}^3$, although lesser and greater atomic concentrations may also be employed. The third average atomic concentration is higher than the second average atomic concentration. The net atomic concentration of first conductivity type dopants, i.e., the different between the atomic concentration of dopants of the first conductivity type and the atomic concentration of dopants of the second conductivity type, in the source-side counter-doped plate 33' and the drain-side counter-doped plate 43' may be in a range from $1.0 \times 10^{16}/\text{cm}^3$ to $1.0 \times 10^{18}/\text{cm}^3$, such as from $3.0 \times 10^{16}/\text{cm}^3$ to $3.0 \times 10^{17}/\text{cm}^3$, although lesser and greater atomic concentrations may also be employed.

Generally, the source-side counter-doped plate 33' and the drain-side counter-doped plate 43' can be formed by implantation of dopants of the first conductivity type into surface portions of the source-side extension region 32 and the drain-side extension region 42, respectively. Each of the source-side counter-doped plate 33' and the drain-side counter-doped plate 43' may have a second thickness t2 that is less than the first thickness t1. In one embodiment, each of the source-side counter-doped plate 33' and the drain-side counter-doped plate 43' does not have any areal overlap with the gate electrode 54 in a plan view that is perpendicular to an interface between the semiconductor channel and the gate dielectric 52.

Referring to FIGS. 15A-15F, a photoresist layer (not shown) can be applied over the third exemplary structure, and can be lithographically patterned into a pattern of strips that laterally extend along the first horizontal direction hd1 and laterally spaced apart along the second horizontal direction hd2. The strips may have a uniform width throughout, and may have a uniform pitch along the second horizontal direction hd2.

An ion implantation process can be performed to implant dopants of the second conductivity type into the strip portions of source-side counter-doped plate 33' and the drain-side counter-doped plate 43' employing a combination of the gate structure (54, 57) and the patterned photoresist layer as a composite ion implantation mask.

Source-side-extension rail portions 32R and drain-extension rail portions 42R are formed simultaneously by implanting electrical dopants of the second conductivity type. The source-side-extension rail portions 32R and the drain-extension rail portions 42R are formed within the implanted portions of the source-side counter-doped plate 33' and the drain-side counter-doped plate 43, respectively, and have a doping of the second conductivity type, which is the same conductivity type as the conductivity type of the source-side-extension plate portion 32P and the drain-side-extension plate portion 42P. Each remaining portion of the source-side counter-doped plate 33' having a doping of the first conductivity type constitutes a source-side counter-doped rail 33. Each remaining potion of the drain-side counter-doped plate 43' having a doping of the first conductivity type constitutes a drain-side counter-doped rail 43.

The source-side-extension rail portions 32R and the drain-extension rail portions 42R can include dopants of the second conductivity type at a fourth average atomic concentration, which may be in a range from $3.0 \times 10^{16}/\text{cm}^3$ to $3.0 \times 10^{18}/\text{cm}^3$, such as from $1.0 \times 10^{17}/\text{cm}^3$ to $1.0 \times 10^{18}/\text{cm}^3$, although lesser and greater atomic concentrations may also be employed. The source-side-extension rail portions 32R and the drain-extension rail portions 42R can include dopants of the first conductivity type at third average atomic concentration, which may be in a range from $2.0 \times 10^{16}/\text{cm}^3$ to $2.0 \times 10^{18}/\text{cm}^3$, such as from $6.0 \times 10^{16}/\text{cm}^3$ to $6.0 \times 10^{17}/\text{cm}^3$, although lesser and greater atomic concentrations may also be employed. The fourth average atomic concentration is higher than the third average atomic concentration. The net atomic concentration of second conductivity type dopants, i.e., the different between the atomic concentration of dopants of the second conductivity type and the atomic concentration of dopants of the first conductivity type, in the source-side-extension rail portions 32R and the drain-extension rail portions 42R may be in a range from $1.0 \times 10^{16}/\text{cm}^3$ to $1.0 \times 10^{18}/\text{cm}^3$, such as from $3.0 \times 10^{16}/\text{cm}^3$ to $3.0 \times 10^{17}/\text{cm}^3$, although lesser and greater atomic concentrations may also be employed.

The source-side counter-doped rails 33 and the drain-side counter-doped rails 43 can include dopants of the first conductivity type at third average atomic concentration, which may be in a range from $2.0 \times 10^{16}/\text{cm}^3$ to $2.0 \times 10^{18}/\text{cm}^3$, such as from $6.0 \times 10^{16}/\text{cm}^3$ to $6.0 \times 10^{17}/\text{cm}^3$, although lesser and greater atomic concentrations may also be employed. The third average atomic concentration is higher than the second average atomic concentration. The net atomic concentration of first conductivity type dopants, i.e., the different between the atomic concentration of dopants of the first conductivity type and the atomic concentration of dopants of the second conductivity type, in the source-side counter-doped rails 33 and the drain-side counter-doped rails 43 may be in a range from $1.0 \times 10^{16}/\text{cm}^3$ to $1.0 \times 10^{18}/\text{cm}^3$, such as from $3.0 \times 10^{16}/\text{cm}^3$ to $3.0 \times 10^{17}/\text{cm}^3$, although lesser and greater atomic concentrations may also be employed.

Each of the source-side counter-doped rails 33 and the drain-side counter-doped rails 43 may have a uniform width throughout along the second horizontal direction hd2, which is herein referred to as a first width w1. The first width w1 may be in a range from 50 nm to 500 nm, although lesser and greater widths may also be employed. The source-side counter-doped rails 33 and the drain-side counter-doped rails 43 have a second thickness t2 that is less than the first thickness t1. The second thickness t2 may be 25 nm to 800 nm, such as from 60 nm to 300 nm, although lesser and greater depths may also be employed.

The combination of the source-side-extension plate portion 32P, the vertically-extending portion 32V, and the source-side-extension rail portions 32R constitutes a source-side extension region 32. The combination of the drain-side-extension plate portion 42P, the vertically-extending portion 42V, and the drain-side-extension rail portions 42R constitutes a drain-side extension region 42.

Referring to FIGS. 16A-16D, the processing steps described with reference to FIGS. 6A-6E can be performed to form a source region 36 and a drain region 46. Generally, the source region 36 and the drain region 46 have a doping of the second conductivity type, and are formed in the substrate 8 such that the source region 36 contacts the first superjunction structure (32, 33) and the drain region 46 contacts the second superjunction structure (42, 43). The source region 36 and the drain region 46 are laterally spaced from the gate structure (52, 54) and from each other along the first horizontal direction hd1. In one embodiment, the source region 36 and the drain region 46 do not have any areal overlap with the dielectric gate spacer 56.

Referring to FIGS. 17A-17E, the processing steps described with reference to FIGS. 7A-7E can be performed to form a contact-level dielectric layer 70 and various contact via structures (38, 48, 58).

Referring to all drawings and according to various embodiments of the present disclosure, a field effect transistor comprises: a semiconductor channel 50 having a doping of a first conductivity type; a gate structure (52, 54) overlying the semiconductor channel 50 and comprising a stack of a gate dielectric 52 and a gate electrode 54; a source region 36 and a drain region 46 having a doping of a second conductivity type and laterally spaced from the gate structure (52, 54) and from each other along a first horizontal direction hd1, the second conductivity type being an opposite of the first conductivity type; a source-side extension region 32 laterally extending between the source region 36 and a first bottom surface segment of the gate dielectric 52, having a doping of the second conductivity type, and including a source-side-extension plate portion 32P and source-side-extension rail portions 32R that overlie the source-side-extension plate portion 32P; source-side counter-doped rails 33 having a doping of the first conductivity type, embedded in the source-side extension region 32, and interlaced with the source-side-extension rail portions 32R along a second horizontal direction hd2 to provide a first superjunction structure (32, 33); a drain-side extension region 42 laterally extending between the drain region 46 and a second bottom surface segment of the gate dielectric 52, having a doping of the second conductivity type, and including a drain-side-extension plate portion 42P and drain-side-extension rail portions 42R that overlie the drain-side-extension plate portion 42P; and drain-side counter-doped rails 43 having a doping of the first conductivity type, embedded in the drain-side extension region 42, and interlaced with the drain-side-extension rail portions 42R along the second horizontal direction hd2 to provide a second superjunction structure (42, 43).

In one embodiment, the source-side-extension rail portions 32R laterally extend along the first horizontal direction hd1 and have a respective uniform width (such as a second width w2) along the second horizontal direction hd2; and the drain-side-extension rail portions 42R laterally extend along the first horizontal direction hd1 and have a respective uniform width (such as a second width w2) along the second horizontal direction hd2. In one embodiment, the source-side counter-doped rails 33 and the source-side-extension rail portions 32R with a uniform periodicity p along the second horizontal direction hd2.

In one embodiment, the source-side counter-doped rails 33 are in contact with a sidewall of the source region 36; and the drain-side counter-doped rails 43 are in contact with a sidewall of the drain region 46. In one embodiment, the source-side counter-doped rails 33 are not in direct contact with the semiconductor channel; and the drain-side counter-doped rails 43 are not in direct contact with the semiconductor channel.

In one embodiment, top surfaces of the source-side counter-doped rails 33 are located within a same horizontal plane as a top surface of the source-side extension region 32; the source-side extension region 32 has a first thickness t1; and the source-side counter-doped rails 33 have a second thickness t2 that is less than the first thickness t1. In one embodiment, the source region 36 has a third thickness t3 that is less than the first thickness t1 and is greater than the second thickness t2.

In one embodiment, the field effect transistor comprises a dielectric gate spacer 56 that laterally surrounds the gate electrode 54, wherein each of the source-side counter-doped rails 33 and the drain-side counter-doped rails 43 has an areal overlap with a respective portion of the dielectric gate spacer 56 in a plan view that is perpendicular to an interface between the semiconductor channel and the gate dielectric 52. In one embodiment, each of the source-side-extension rail portions 32R and the source-side counter-doped rails 33 are in contact with a respective segment of a bottom surface of the gate dielectric 52.

In the first embodiment, each of the source-side counter-doped rails 33 and the drain-side counter-doped rails 43 has an areal overlap with a respective portion of the gate electrode 54 in a plan view that is perpendicular to an interface between the semiconductor channel and the gate dielectric 52.

In the second and third embodiments, each of the source-side counter-doped rails 33 and the drain-side counter-doped rails 43 does not have any areal overlap with the gate electrode 54 in a plan view that is perpendicular to an interface between the semiconductor channel and the gate dielectric 52.

In one embodiment, the semiconductor channel comprises dopants of the first conductivity type at a first average atomic concentration; the source-side-extension plate portion 32P comprises dopants of the second conductivity type at a second average atomic concentration that is higher than the first average atomic concentration; and the source-side counter-doped rails 33 comprise dopants of the first conductivity type at a third average atomic concentration that is higher than the second average atomic concentration. In the third embodiment, the source-side-extension rail portions 32R comprise dopants of the first conductivity type at the third average atomic concentration and comprises dopants of the second conductivity type at a fourth average atomic concentration that is higher than the third average atomic concentration. In one embodiment, the source region 36 and the drain region 46 comprises dopants of the second conductivity type at a higher average atomic concentration than the source-side-extension rail portions 32R and the drain-side-extension rail portions 42R.

The magnitude of the maximum electrical field at bottom edges of a gate electrode 54 overlying or located adjacent to a respective superjunction structure decreases due to the depletion effects around the p-n junctions within the respective superjunction structure. Generally, a smaller periodicity p (such as a periodicity p that is less than 600 nm, and/or less than 400 nm, such as 100 to 350 nm) is more advantageous for the purpose of reducing the magnitude of the maximum electrical field at bottom edges of a gate electrode. Embodiments of the present disclosure may be advantageously employed to reduce hot carrier injection without decreasing the breakdown voltage of a high voltage field effect transistor.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A field effect transistor, comprising:
a semiconductor channel having a doping of a first conductivity type;
a gate structure overlying the semiconductor channel and comprising a stack of a gate dielectric and a gate electrode;
a source region and a drain region having a doping of a second conductivity type and laterally spaced from the gate structure and from each other along a first horizontal direction, the second conductivity type being an opposite of the first conductivity type;
a source-side extension region laterally extending between the source region and a first bottom surface segment of the gate dielectric, having a doping of the second conductivity type, and including a source-side-extension plate portion and source-side-extension rail portions that overlie the source-side-extension plate portion;
source-side counter-doped rails having a doping of the first conductivity type, embedded in the source-side extension region, and interlaced with the source-side-extension rail portions along a second horizontal direction to provide a first superjunction structure;
a drain-side extension region laterally extending between the drain region and a second bottom surface segment of the gate dielectric, having a doping of the second conductivity type, and including a drain-side-extension plate portion and drain-side-extension rail portions that overlie the drain-side-extension plate portion; and
drain-side counter-doped rails having a doping of the first conductivity type, embedded in the drain-side extension region, and interlaced with the drain-side-extension rail portions along the second horizontal direction to provide a second superjunction structure.

2. The field effect transistor of claim 1, wherein:
the source-side-extension rail portions laterally extend along the first horizontal direction and have a respective uniform width along the second horizontal direction; and
the drain-side-extension rail portions laterally extend along the first horizontal direction and have a respective uniform width along the second horizontal direction.

3. The field effect transistor of claim 2, wherein the source-side counter-doped rails and the source-side-extension rail portions with a uniform periodicity along the second horizontal direction.

4. The field effect transistor of claim 1, wherein:
the source-side counter-doped rails are in contact with a sidewall of the source region; and the drain-side counter-doped rails are in contact with a sidewall of the drain region.

5. The field effect transistor of claim 1, wherein:
the source-side counter-doped rails are not in direct contact with the semiconductor channel; and
the drain-side counter-doped rails are not in direct contact with the semiconductor channel.

6. The field effect transistor of claim 1, wherein:
top surfaces of the source-side counter-doped rails are located within a same horizontal plane as a top surface of the source-side extension region;
the source-side extension region has a first thickness; and
the source-side counter-doped rails have a second thickness that is less than the first thickness.

7. The field effect transistor of claim 6, wherein the source region has a third thickness that is less than the first thickness and is greater than the second thickness.

8. The field effect transistor of claim 1, further comprising a dielectric gate spacer that laterally surrounds the gate electrode, wherein each of the source-side counter-doped rails and the drain-side counter-doped rails has an areal overlap with a respective portion of the dielectric gate spacer in a plan view that is perpendicular to an interface between the semiconductor channel and the gate dielectric.

9. The field effect transistor of claim 8, wherein each of the source-side-extension rail portions and the source-side counter-doped rails are in contact with a respective segment of a bottom surface of the gate dielectric.

10. The field effect transistor of claim 1, wherein each of the source-side counter-doped rails and the drain-side counter-doped rails has an areal overlap with a respective portion of the gate electrode in a plan view that is perpendicular to an interface between the semiconductor channel and the gate dielectric.

11. The field effect transistor of claim 1, wherein each of the source-side counter-doped rails and the drain-side counter-doped rails does not have any areal overlap with the gate electrode in a plan view that is perpendicular to an interface between the semiconductor channel and the gate dielectric.

12. The field effect transistor of claim 1, wherein:
the semiconductor channel comprises dopants of the first conductivity type at a first average atomic concentration;
the source-side-extension plate portion comprises dopants of the second conductivity type at a second average atomic concentration that is higher than the first average atomic concentration; and
the source-side counter-doped rails comprise dopants of the first conductivity type at a third average atomic concentration that is higher than the second average atomic concentration.

13. The field effect transistor of claim 12, wherein the source-side-extension rail portions comprises dopants of the first conductivity type at the third average atomic concentration and comprises dopants of the second conductivity type at a fourth average atomic concentration that is higher than the third average atomic concentration.

14. The field effect transistor of claim 12, wherein the source region and the drain region comprises dopants of the second conductivity type at a higher average atomic concentration than the source-side-extension rail portions and the drain-side-extension rail portions.

* * * * *